US005670283A

United States Patent [19]

Kato et al.

[11] Patent Number: 5,670,283

[45] Date of Patent: Sep. 23, 1997

[54] ELECTROPHOTOGRAPHIC MATERIAL FOR COLOR PROOFING

[75] Inventors: Eiichi Kato; Sadao Osawa, both of Shizuoka, Japan

[73] Assignee: Fuji Photo Film Co., Ltd., Kanagawa, Japan

[21] Appl. No.: 279,068

[22] Filed: Jul. 22, 1994

Related U.S. Application Data

[63] Continuation of Ser. No. 952,941, Sep. 28, 1992, abandoned.

[30] Foreign Application Priority Data

| | | | |
|---|---|---|---|
| Sep. 27, 1991 | [JP] | Japan | 3-249819 |
| Oct. 7, 1991 | [JP] | Japan | 3-259430 |
| Nov. 6, 1991 | [JP] | Japan | 3-289648 |
| Nov. 6, 1991 | [JP] | Japan | 3-289649 |

[51] Int. Cl.$^6$ .... G03G 5/05

[52] U.S. Cl. .... 430/46; 430/47; 430/66; 430/96; 430/126

[58] Field of Search .... 430/42, 46, 47, 430/96, 126, 66

[56] References Cited

U.S. PATENT DOCUMENTS

| | | | |
|---|---|---|---|
| 4,600,669 | 7/1986 | Ng et al. . | |
| 4,686,163 | 8/1987 | Ng et al. . | |
| 4,869,982 | 9/1989 | Murphy | 430/126 |
| 5,202,208 | 4/1993 | Kato | 430/96 |

FOREIGN PATENT DOCUMENTS

| | | |
|---|---|---|
| 4833183 | 10/1973 | Japan . |
| 1112264 | 4/1989 | Japan . |
| 1281464 | 11/1989 | Japan . |
| 311347 | 1/1991 | Japan . |

OTHER PUBLICATIONS

Japanese Standards Association, JIS Z 0237–1980, pp. 193–197.

Japanese Industrial Standard, JIS C–2338, pp. 1–3 and 5–8 (1991).

Japanese Industrial Standard, JIS Z 0237–1980 (English Translation), pp. 1–35 (1984).

*Primary Examiner*—Christopher D. Rodee
*Attorney, Agent, or Firm*—Sughrue,Mion,Zinn,Macpeak & Seas, PLLC

[57] ABSTRACT

An electrophotographic material for color proofing which comprises a substrate, a photoconductive layer and a transfer layer in this order, and is used for preparing a color proof in a process wherein at least one color toner image is electrophotographically formed on the transfer layer and then transferred together with said transfer layer to a sheet material to prepare the color proof, wherein said photoconductive layer comprises a polymer (P) and/or a polymer particle (L) which contain units having fluorine atom(s) and/or silicon atom(s) at least in the region near the surface facing said transfer layer and the surface of said photoconductive layer which contacts with the transfer layer has tack strength of not more than 150 gram·force, which is measured by Pressure Sensitive Tape and Sheet Test of JIS Z0237-1980.

5 Claims, 1 Drawing Sheet

ELECTROPHOTOGRAPHIC MATERIAL FOR COLOR PROOFING

This is a continuation of application Ser. No. 07/952,941 filed Sep. 28, 1992, now abandoned.

BACKGROUND OF THE INVENTION

The present invention relates to an electrophotographic material for color proofing, in particular an improvement in a photoconductive layer of the-electrophotographic material for color proofing (hereinafter, sometimes referred to as a light-sensitive material).

PS plates have dominantly been used for multicolor printing because of their excellence in quality, printing durability, dimensional stability and resistance to contamination. PS plates are formed by applying a photosensitive layer containing a diazo resin or o-quinone diazide as a main component onto an aluminum substrate whose surface has been treated to improve hydrophilic property thereof. The PS plates are exposed to UV rays through a color-separated and half tone film, developed to remove the photosensitive layer in non-image areas to reveal the surface of the hydrophilic aluminium plate, whereby, printing plates are obtained. A multicolor image can be obtained by mounting each printings plate prepared by the above process for each color on a printing machine and printing using an ink corresponding to each color on a sheet of same printing paper.

After it is confirmed that a series of processes of editing, plate making and printing such as input of characters, layout, color designation, etc., are conducted as designated, and that there is no difference between color tone reproduction, etc. obtained and one designated by an orderer, necessary corrections are made and then, a next step or regular printing is conducted. This step is called press correction. The former is called "first proof", and it is conducted for the purpose of checking each process in a printing company as mentioned above. The latter is called "second proof", and it is conducted to provide a sample for obtaining an acceptance by the orderer. The second proof is conducted in almost the same manner as one for regular printing, including the kind of inks and printing paper to be used. Proof printing using regular printing paper to be used in regular printing is called "regular correction".

Color designation and tone reproduction of a color photograph should be confirmed and corrected for each color. Especially, the proof for the orderer is generally conducted several times repeatedly. Proof printing in the prior art is conducted using a color separated and half tone film to be used in regular printing, and a PS plate which is relatively low in cost and printing durability, for example, with the proof press, whose mechanism is similar to a press machine, of the name of "the flat bed four color proof press" made by DAINIPPON SCREEN Co., Ltd. The method mentioned above is called "press proof" but is not convenient, since it takes much time to prepare, and requires skill for operation, and is difficult to keep quality constant.

There have been proposed some methods for color proofing which do not use the proof press having a mechanism similar to a press machine, and therefore are easier to conduct and stable in printing. They are preferably used because of the advantages such as easier operation and repetition stability after being used repeatedly. It is called "off press proof", and typical manners and systems thereof are disclosed in Bulletin of the Printing Society of Japan 24, No. 3, page 32 (1989). Examples of the systems include systems available in the trade names of "COLOR ART" by Fuji Photo Film Co.,Ltd., "CROMALIN" by Dupont, and "MATCHPRINT" by 3M. The systems use a color separation film, but do not use the proof press mentioned above.

The color separation film is generally obtained with a color scanner. The scanner reads data from original, and conducts color separation, formation of half tone, and tone reproduction control to Output digital data. A silver halide film is scan-exposed with laser beams modulated by the digital data, developed, fixed and dried to obtain a color separated film.

Recently, an electronic plate making system called "total color scanner" has been developed and been utilized. Procedures up to retouching or plate collecting can be conducted in said system. For said system, it is required that resultant quality should be judged more rapidly in first proof. Efficiency of system will be seriously lowered, if resultant qualities such as a manner, a layout, a propriety of quality of color separation for some patterns, tone reproduction are judged after output to color separation film, and the preparation of press proof or off press proof as prior proofing.

Since an image data in the system is available as a digital information, some direct digital color proof systems which do not use the prior proofing have been proposed. Details thereof are described in "Printing Information", April, page 2 et seq. (1991). Examples of such systems include a silver halide system, an electrostatic toner system (a wet electrophotographic system), an ink-jet system and a thermal sublimation transfer system.

Among them, the wet electrophotographic system is especially excellent in precision, image quality, tone reprodution, and for the fact that any type of paper can be used for the system so that regular paper correction can be conducted, since in the system, a photoconductive element is charged, exposed to laser beam and developed with a color toner comprising a pigment dispersed in an electrical insulating liquid for each of four colors, i.e. cyan, magenta, yellow and black and then a toner image is transferred.

However, it is quite difficult to transfer a toner image from the surface of the photosensitive plate directly to regular paper. Japanese Patent laid open application (hereinafter referred to as "J. P. KOKAI") No. Hei 2-272469 discloses a technique which has solved such problems, but requires several steps.

There have been proposed to provide a releasable transfer layer on the surface of the photosensitive element, to form a toner image on the transfer layer and to transfer the image together with the transfer layer to regular paper in J. P. KOKAI Nos. Sho 61-174557 (Japanese Patent publication Hei 2-43185), Hei 1-112264, Hei 1-281464, and Hei 3-11347. The system disclosed in J. P. KOKAI No. Sho 61-174557 which is the only one practically used, is exposed to light from the side of a transparent substrate (a polyethylene terephthalate film), and it requires a transparent photoconductive layer, which is not reusable, and therefore expensive.

J. P. KOKAI Nos. Hei 1-112264 and Hei 1-281464 disclose an image forming method or a color printing method which uses a photosensitive paper comprising a photosensitive element on which a releasable layer and an adhesive layer are applied in order, and which is characterized in that a toner image is developed and transferred to plain paper with the releasable layer.

However, it is difficult to form such a photosensitive layer uniformly with a practical size and it is also difficult to transfer a toner image without damage.

The same will apply to the method which uses a recording medium wherein a releasable overcoating layer is applied onto a photoconductive layer disclosed in J. P. KOKAI No. Hei 3-11347.

SUMMARY OF THE INVENTION

An object of the present invention is to provide an electrophotographic material for color proofing wherein the problem mentioned above is solved.

Another object of the present invention is to provide a proof without color drift and with excellent precision and image quality easily and constantly.

A further object of the present invention is to provide a photoconductive layer which is easily prepared with low cost and has stable electrophotographic property.

A still further object of the present invention is to provide an electrophotographic material for color proofing wherein a toner image is easily transferred with a simple transfer apparatus, and a proof can be prepared on any type of transfer paper.

The problems mentioned above are solved by using an electrophotographic material for color proofing which comprises a substrate, a photoconductive layer and a transfer layer in this order, and is used for preparing a color proof in a process wherein at least one color toner image is electrophotographically formed on the transfer layer and then transferred together with said transfer layer to a sheet material to prepare the color proof, wherein said photoconductive layer comprises a polymer (P) and/or a polymer particle (L) which contain units having fluorine atom(s) and/or silicon atom(s) at least in the region near the surface facing said transfer layer and the surface of said photoconductive layer which contacts with the transfer layer has tack strength of not more than 150 gram-force, which is measured by Pressure Sensitive Tape and Sheet Test of JIS Z0237-1980.

The polymer (P) or the polymer particle (L) contains preferably at least one photo-curable (or photosetting) and/or heat-curable (or thermosetting) group.

The transfer layer preferably contains a thermoplastic resin.

Preferably, the photoconductive layer or the layer closest to the transfer layer if the photoconductive layer comprises at least two layer contains binder (Q) which is different from Polymer (P) and/or at least one photosetting and/or thermosetting agent. The photosetting and/or thermosetting agent is defined in the specification of the present application, as a compound, an oligomer or polymer which can be cured by at least one of light and heat to crosslink the binder (Q) and/or the polymer (P), which is known in the art.

The polymer (P) may be either a block copolymer or a random copolymer. However, it is preferably a block-copolymer comprising a polymer segment (X) which contains not less than 50% by weight of said units having fluorine atom(s) and/or silicon atom(s) and a polymer segment (Y) which contains not more than 20% by weight of said units. If the polymer (P) is a random copolymer, it preferably contains not less than 50% by weight, especially not less than 70% by weight of units having fluorine atom(s) and/or silicon atom(s) based on the total weight of the polymer (P).

Preferably, the polymer (P) may be contained in the amount of 1 to 30% by weight based on the total weight of binders (including the polymer (P) which are present in the photoconductive layer).

The present invention further relates to a process for forming a color proof wherein at least one color toner image is electrophotographically formed on the electrophotographic material for color proofing which comprises a substrate, a photoconductive layer and a transfer layer in this order, and then transferred together with said transfer layer to a sheet material to prepare the color proof.

Figure 1:
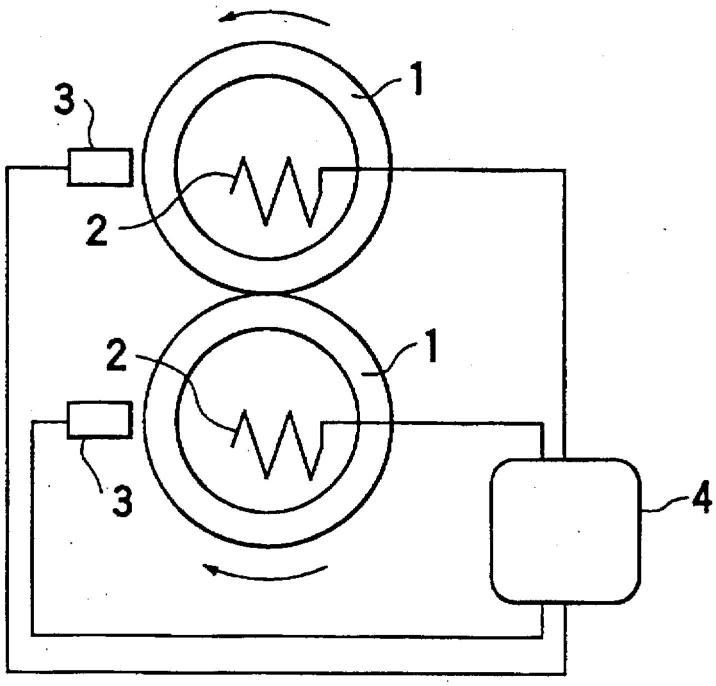
FIG. 1 illustrates schematically a heat transfer apparatus used in the present invention.
Figure 2:
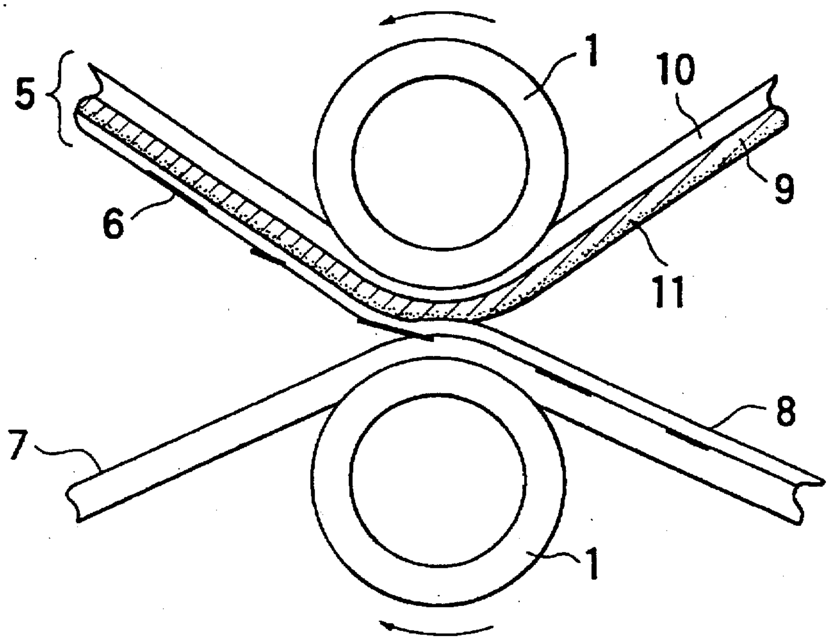
FIG. 2 illustrates schematically a process for preparing color proof by heat transfer of an electrophotographic material for color proofing of the present invention to regular printing paper after developing.

1 is a metallic roller coated by a rubber; 2 is a build-in heater; 3 is a means for detecting a surface temperature; 4 is a temperature controller; 5 is the electrophotographic material for color proofing; 6 is a toner image consisting 4 color-separated images; 7 is a regular paper for printing; 8 is a transfer layer; 9 is a photoconductive layer; 10 is a conductive substrate; 11 is the polymer (P) or the polymer particle (L).

DETAILED EXPLANATION OF THE INVENTION

When the electrophotographic material for color proofing of the present invention is used for preparing a color proof, a multi-color toner image formed electrophotographically is transferred together with the transfer layer to a sheet material to prepare the color proof. The presence of the polymer (P) and/or the polymer particle (L) in the region near the surface facing the transfer layer imparts releasability from the transfer layer to the photoconductive layer. Such releasability was evaluated by tack strength measured by Pressure Sensitive Tape and Sheet Test of JIS Z0237-1980. The tack strength may be not more than 150 gram-force (g·f), preferably not more than 100 g·f, especially not more than 50 g·f in order to obtain good releasability of the photoconductive layer.

Pressure Sensitive Tape and Sheet Test of JIS Z0237-1980 is conducted using the electrophotographic material for color proofing of the present invention wherein the transfer layer is not formed as the test plate and a pressure sensitive tape 6 mm wide is used for measuring at a peeling rate of 120 mm/min. Tack strength is calculated by converting the value measured with the 6 mm wide tape to the value for a tape 10 mm wide.

A photoconductive layer of the present invention may be any layer wherein a photoconductive compound is dispersed in a binder (i.e. a binder resin). Namely, there may be used a single layer type consisting of only a layer wherein a photoconductive compound is dispersed or a multilayer type (or function separated type) comprising a charge generating layer comprising a photoconductive compound dispersed therein and a charge transporting layer. It is most important in the invention that the region near the surface facing the transfer layer contains the specific resin or particle mentioned above.

In the present invention, a polymer coating solution containing a polymer (P) or polymer particle (L) containing units having fluorine and/or silicon atoms in a binder resin is applied to a substrate to prepare a photoconductive layer. During the coating is dried, the polymer (P) or polymer particle (L) is easily migrated to the top surface of the photoconductive layer and concentrated to impart the releasability to the surface. A block copolymer is preferably used to obtain such effect.

In addition, when a polymer is a block copolymer containing a segment having a fluorine atom and/or a silicon atom and the other segment, the other segment (which contains no or little, if any, polymer segment having a fluorine atom(s) and/or a silicon atom(s)) has sufficient compatibility with the binder to inhibit migration of the polymer to a transfer layer, and keep an interface between the transfer layer and the photoconductive layer clearly (namely, they have anchor effect).

Further, the polymer particle (L) moves and is concentrated by the action of a polymer segment which is not soluble in a nonaqueous solvent. Further, a polymer segment of the polymer particle which is soluble in the nonaqueous solvent interacts with the binder, the anchor effect is achieved, and therefore the migration of the polymer to the transfer layer is inhibited.

Further, when the binder (Q) and the other polymer segment (Y) of the polymer (P) have photo and/or thermosetting groups, or preferably photo and/or thermosetting agents, both the copolymer (P) and the binder (Q) are cured by light or heat and the above mentioned orientation of the polymer can be fixed.

As the result, further migration of the copolymer (P) to the transfer layer is inhibited while the transfer layer is coated to keep the interface between the transfer layer and the photoconductive layer clear.

Further, a solvent for coating a transfer layer may be selected depending on the kind of a thermoplastic resin used in the transfer layer. However, since some solvent have solvating ability with a binder of a photoconductive layer, the distribution of the dispersed polymer or polymer particles in the photoconductive layer may be affected by the solvent for coating the transfer layer and have a bad influence on electrophotographic properties (background contamination, deterioration of image quality)

The photoconductive layer of the present invention solves the above problem by crosslinking of binders therein to add solvent resistance.

The polymer (P) is preferably the following block copolymer:

A block copolymer ($P_1$) which contains a polymer segment ($X_1$) containing not less than 50% by weight of said units having fluorine atom(s) and/or silicon atom(s) and a polymer segment ($Y_1$) containing units having at least one photosetting and/or thermosetting group;

A star type copolymer ($P_2$) which contains at least three AB type block polymer chains consisting of a polymer segment ($X_2$) containing not less than 50% by weight of said units having fluorine atom(s) and/or silicon atom(s) and a polymer segment ($Y_2$) containing said units having photosetting and/or thermosetting groups, and said at least three polymer chains are bonded through organic groups (Z);

A graft copolymer ($P_3$) comprising a polymer segment ($X_3$) containing not less than 50% by weight of said units having fluorine atom(s) and/or silicon atom(s) and a polymer segment ($Y_3$) containing said units having at least one photosetting and/or thermosetting group;

An AB type or ABA type block copolymer ($P_4$) comprising a polymer segment ($X_4$) containing not less than 50% by weight of said units having fluorine atom(s) and/or silicon atom(s) and a polymer segment ($Y_4$) containing said units having at least one photosetting and/or thermosetting group, and said polymer segment ($X_4$) contains the following graft type polymer segment ($X_4'$) and/or said polymer segment ($Y_4$) contains the following graft type polymer segment ($Y_4'$):

Graft type polymer segment ($X_4'$): a polymer segment which has $1\times10^{3}$~$2\times10^4$ of weight-average molecular weight, and comprises at least one one-functional macromonomer ($M_A$) which contains not less than 50% by weight of said units having fluorine atom(s) and/or silicon atom(s);

Graft type polymer segment ($Y_4'$): a polymer segment which has $1\times10^3$~$2\times10^4$ of weight-average molecular weight, and comprises at least one one-functional macromonomer ($M_B$) which does not contain said units having fluorine atom(s) and/or silicon atom(s).

The following illustrates an organic residue having fluorine atom(s) and/or silicon atom(s) of the present invention. The organic residue may be present in a main chain of the polymer (P) or the polymer particle (L), or may be present in side chains thereof.

Examples of organic residue having fluorine atom(s) include: $-C_hF_{2h+1}$ (h is an integer of 1 to 18), $-(CF_2)_jCF_2H$ (j is an integer of 1 to 17), $-CFH_2$, mono-valent organic groups of the following formulae

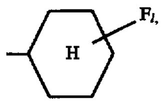

(l is 1 to 11)

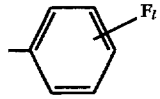

(l is 1 to 5)

$-CF_2-$, $-CFH-$ and di-valent organic groups of the following formulae:

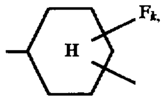

(k is 1 to 10)

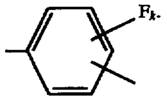

(k is 1 to 4)

Examples of organic residue having silicon atom(s) include mono-valent or di-valent organic groups of the following formulae:

$-Si(R_1)(R_2)(R_3)$ and $-Si(R_4)(R_5)-$.

$R_1$, $R_2$, $R_3$, $R_4$ and $R_5$ each represents a hydrocarbon residue which may be substituted, for example, a hydrocarbon residue having 1 to 22 carbon atoms, $-OR_6$ ($R_6$ represents the same meaning as defined below for $R_1$ to $R_5$), or $-OSi(R_1')(R_2')(R_3')$ ($R_1'$, $R_2'$ and $R_3'$ represent the same meaning as defined below for $R_1$ to $R_5$). Examples for $R_1$ to $R_6$ include: a substituted or unsubstituted alkyl group having 1 to 18 carbon atoms (such as methyl, ethyl, propyl, butyl, hexyl, octyl, decyl, dodecyl, hexadecyl, 2-chloroethyl, 2-bromoethyl, 2,2,2-trifluoroethyl, 2-cyanoethyl, 3,3,3-trifluoropropyl, 2-methoxyethyl, 3-bromopropyl, 2-methoxycarbonylethyl, 2,2,2,2',2',2'-hexafluoroisopropyl), a substituted or unsubstituted alkenyl having 4 to 22, preferably 4 to 18 carbon atoms (such as 2-methyl-1-propenyl, 2-butenyl, 2-pentenyl, 3-methyl-2-pentenyl, 1-pentenyl, 1-hexenyl, 2-hexenyl, 4-methyl-2-hexenyl), a substituted or unsubstituted aralkyl group having 7 to 12 (such as benzyl, phenethyl, 3-phenylpropyl, naphthylmethyl, 2-naphthylethyl, chlorobenzyl, bromobenzyl, methylbenzyl, ethylbenzyl, methoxybenzyl, dimethylbenzyl, dimethoxy benzyl), a substituted or unsubstituted alycyclic group having 5 to 8 (such as cyclohexyl, 2-cyclohexyl, 2-cyclopentylethyl), or a substituted or unsubstituted aromatic group (such as phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, bromophenyl, cyanophenyl, acetylpnehyl, methoxycarbonylphenyl, ethoxycarbonylphenyl, butoxycarbonylphenyl, acetoamidephenyl, propioamidephenyl, dodecyloylamidephenyl).

Two or more organic residues having a fluorine atom(s) and/or a silicon atome(s) can be combined each other directly or through a linking group.

Examples of said linking group include di-valent organic groups such as —O—, —S—, $—NR_1—$, —SO—, $—SO_2—$, —COO—, —OCO—, —CONHCO—, —NHCONH—, $—CONR_1—$, $—SO_2NR_1—$, a di-valent aliphatic or aromatic group, or a combination of these di-valent groups. $R_1$ is the same meaning defined above.

Examples of di-valent aliphatic groups include:

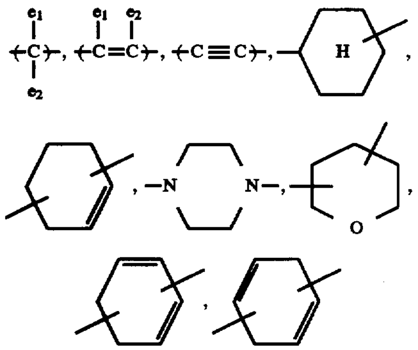

($e_1$ and $e_2$ each represents independently a hydrogen atom, a halogen atom (such as a chlorine atom, a bromine atom), or an alkyl group having 1 to 12 carbon atoms (such as methyl, ethyl, propyl, chloromethyl, bromomethyl, butyl, hexyl, octyl, nonyl, decyl). Q represents —O—, —S—, or $—NR_{20}—$ wherein $R_{20}$ represents an alkyl group having 1 to 4 carbon atoms, $—CH_2Cl$ or $—CH_2Br$).

Examples of di-valent aromatic groups include: a residue of benzene, a residue of naphthalene, and a heterocyclic group with 5 or 6 members (containing as a hetero atom at least one selected from the group consisting of an oxygen atom, a sulfur atom, and a nitrogen atom). These aromatic groups may be substituted, for example, by a halogen atom (such as a fluorine, chlorine or bromine atom), an alkyl group having 1 to 8 carbon atoms (such as methyl, ethyl, propyl, butyl, hexyl, octyl), an alkoxy group having 1 to 6 carbon atoms (such as methoxy, ethoxy, propoxy, butoxy).

Examples of heterocyclic groups include furan, thiophene, pyridine, pirazine, piperazine, tetrahydrofuran, pyrrole, tetrahydropyran, 1,3-oxazoline rings.

The followings ((a-1)-(a-33)) are examples of the units containing the above mentioned organic residues having fluorine atom(s) and/or silicon atom(s). They should not be understood as limitation of the present invention.

In the examples, —Rf represent the following substituents. 1) $—C_nF_{2n+1}$, 2) $—CH_2C_nF_{2n+1}$, 3) $—CH_2CH_2C_nF_{2n+1}$, 4) $—CH_2(CF_2)_mCFHCF_3$, 5) $—CH_2CH_2(CF_2)_mCFHCF_3$, 6) $—CH_2CH_2(CF_2)_mCFHCF_2H$, 7) $—CH_2(CF_2)_mCFHCF_3$, 8) $—CH(CF_3)_2$,

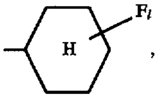 , 9)

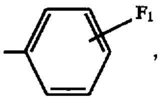 , 10)

or

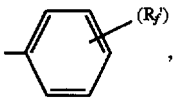 , 11)

($R_f$' represents the same as (1) to (8) defined above.)

wherein n is an integer of 1 to 18, m is an integer of 1 to 18, l is an integer of 1 to 5, and b is a hydrogen atom or a methyl group.

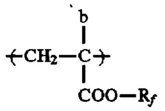 (a-1)

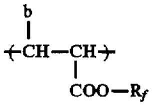 (a-2)

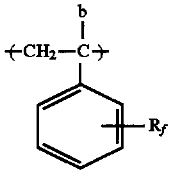 (a-3)

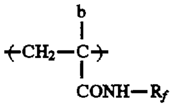 (a-4)

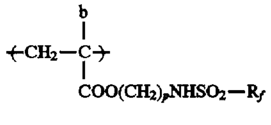 (a-5)

p = an integer of 1 to 12

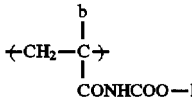 (a-6)

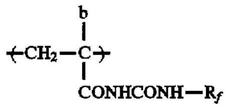 (a-7)

-continued
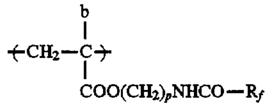
(a-8)
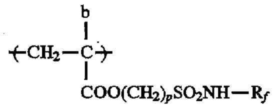
(a-9)
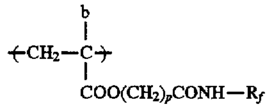
(a-10)
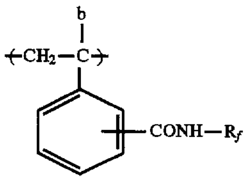
(a-11)
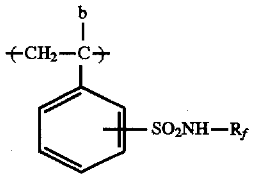
(a-12)
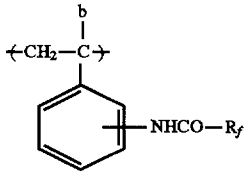
(a-13)
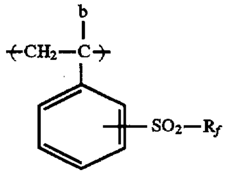
(a-14)
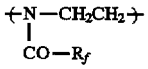
(a-15)
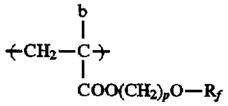
(a-16)
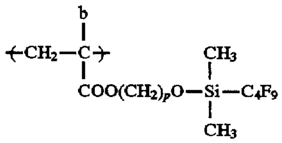
(a-17)
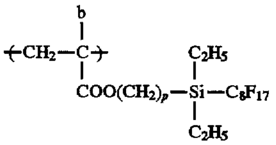
(a-18)
-continued
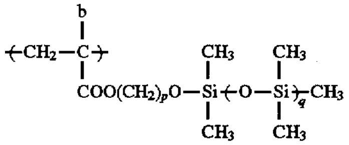
(a-19)
wherein q is an integer of 1 to 20
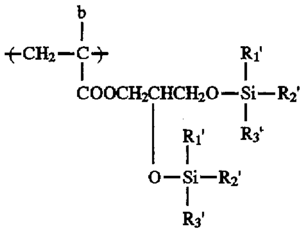
(a-20)
wherein $R_1'$, $R_2'$, and $R_3'$ are alky groups having 1 to 12 carbon atoms.
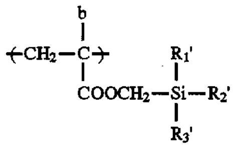
(a-21)
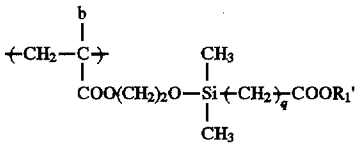
(a-22)
wherin q is an integer of 1 to 20
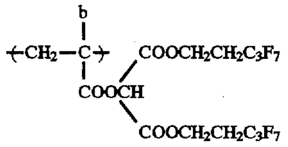
(a-23)
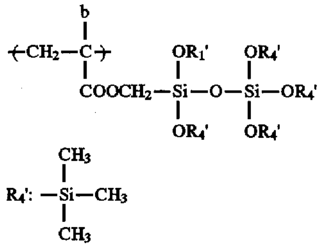
(a-24)
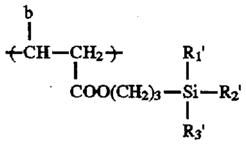
(a-25)
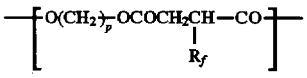
(a-26)
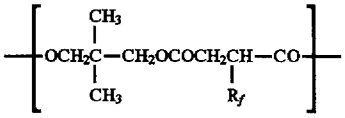
(a-27)

-continued

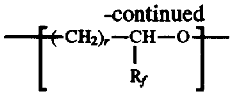
(a-28)

wherein r is an integer of 3 to 6

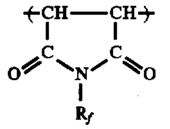
(a-29)

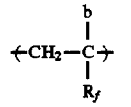
(a-30)

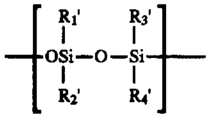
(a-31)

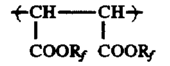
(a-32)

$-(N(Rf)CH_2CH_2)-$ (a-33)

$-(N(COR_f)CH_2CH_2)-$ (a-34)

According to the present invention, a transfer layer can be released easily without an intermediate layer used in the prior art, only by adding a specific polymer (P) and/or a polymer particle (L) in a photoconductive layer.

A polymer segment having fluorine atom(s) and/or silicon atom(s) may be present in block (X) in polymer (P) or polymer particle (L) in an amount of at least 50% by weight, preferably more than 70% by weight, especially more than 80% by weight based on the total amount of the block (X).

A polymer segment having fluorine atom(s) and/or silicon atom(s) may be present in block (Y) in polymer (P) or the polymer particle (L) in an amount of less than 20% by weight, preferably 0% by weight based on the total amount of the block (Y).

The ratio by weight of block (X) to block (Y) may be 1-95 to 99-5, preferably 5-90 to 95-10.

Otherwise, the migration of the polymer (P) or polymer particle (L) to the top surface of the photoconductive layer and anchor effect by the polymer. (P) or the polymer particle (L) will decrease, and releasability of the transfer layer will decrease.

Weight-average molecular weight of the polymer (P) may be $5\times10^3$ to $1\times10^6$, preferably $1\times10^4$ to $5\times10^5$. Weight-average molecular weight of block (Y) in the polymer (P) is preferably at least $1\times10^3$.

The average particle size of the polymer particle (L) may be 0.001 to 1 μm, preferably 0.05 to 0.5 μm. The shape of the polymer particle may be spherical when it is prepared by the nonaqueous dispersion polymerization method.

The following is preferable embodiment of polymer (P). Polymer (P) may be any polymer containing a polymer segment having fluorine atom(s) and/or silicon atom(s) is contained as block. Examples of such polymer include AB type block copolymer, ABA type block copolymer, BAB type block copolymer, graft type block copolymer, or star type block copolymer.

The following illustrates block copolymer ($P_1$) used as polymer (P) of the present invention.

A polymer segment having fluorine atom(s) and/or silicon atom(s) may be present in segment ($X_1$) in an amount of at least 50% by weight, preferably at least 80% by weight, especially, more than 90% by weight based on the total weight of segment ($X_1$). A polymer segment having photo and/or thermosetting groups may be present in segment ($Y_1$) in an amount of 1 to 60% by weight, preferably 5 to 40% by weight based on the total weight of segment ($Y_1$).

The ratio by weight of block ($X_1$) to block ($Y_1$) in polymer ($P_1$) may be 5-95 to 95-5, preferably 10-90 to 90-10.

Otherwise, the migration of the polymer ($P_1$) to the surface of the photoconductive layer and anchor effect by the polymer ($P_1$) will decrease, and releasability of the transfer layer will decrease.

The polymer ($P_1$) may be any type of linear block copolymer, such as AB type block copolymer (such as ($X_1$)—($Y_1$)) or multi blocked polymer thereof, ABA type block copolymer ((such as ($X_1$)—($Y_1$)—($X_1$) or ($Y_1$)—($X_1$)—($Y_1$)).

Weight-average molecular weight of polymer ($P_1$) may be $5\times10^3$ to $1\times10^6$, preferably $1\times10^4$ to $5\times10^5$. Weight-average molecular weight of segment ($X_1$) in polymer ($P_1$) may be at least $1\times10^3$.

The polymer segment containing the units having fluorine atom(s) and/or silicon atom(s) will hereunder be explained.

The units may be present in main chain of polymer (P), or may be present as substituents in side chains thereof.

The segment having fluorine atom(s) and/or silicon atom (s), linking groups thereof, units containing them may be those mentioned above for polymer (P).

The following illustrates the copolymer segment having photo and/or thermosetting group(s) in the segment ($Y_1$).

A photo and/or thermosetting group is a group which causes a curing reaction of the polymer by at least one of heat and light.

Examples of the photosetting group may be functional groups used in known photosensitive polymers such as those described in the following literatures: Hideo Inui, Gentaro Nagamatsu, "Photosensitive Polymer" published by Kodansha, 1977; Takahiro Tsunoda, "New Photosensitive Polymer", The publishing department of the Printing Society of Japan, 1981; G. E. Green and B. P. Strak, J. Macro. Sci. Reas. Macro. Chem., C21(2), 187–273 (1981–82); C. G. Rattey, "Photopolymerization of Surface Coatings", A. Wiley Inter Science Pub., 1982.

Examples of the thermosetting group may be functional groups in polymers described in the following literatures: Tsuyoshi Endo, "Densifying of Thermosetting Polymer", C.M.C. Co., Ltd., 1986; Yuji Harazaki, "The Latest binder techniques handbook", chapter II-I, Sogogijutu center, 1985; Takayuki Otsu, "Synthesis, Design and New Use of Acrylic Resin, the publishing department of Chubukeieikaihatsu center, 1985; Eizo Omori, "Functional Acrylic resins", Technosystem, 1985.

Examples of such groups include —COOH, $—PO_3H_2$, $—SO_2H$, —OH, —SH, $—NH_2$, $—NHR_{103}$ ($R_{103}$ is a hydrocarbon group, preferably having 1 to 8 carbon atoms (such as methyl, ethyl, propyl, butyl, hexyl, octyl, 2-chloroethyl, 2-methoxyethyl, 2-cyanoethyl), groups of the following formulae:

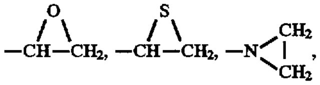

$—CONHCH_2OR_{104}$ ($R_{104}$ is a hydrogen atom or an above mentioned alkyl group), —N=C=O, —NCO—NZ' (NZ' is a heterocycle, and is a protective group for —N=C=O), silane coupling group, titanate coupling group, $-Cd_{109}=CHd_{110}$ ($d_{109}$ and $d_{110}$ each represents independently a hydrogen atom, a halogen atom (such as a chlorine or bromine atom) or an alkyl group having 1 to 4 carbon atoms (such as methyl, ethyl).

Examples of the polymerizable double bond groups include $CH_2=CH-$, $CH_2=CH-CH_2-$, $CH_2=CHCOO-$, $CH_2=C(CH_3)-COO-$, $CH_3-CH=COO-$, $CH_2=CH-CONH-$, $CH_2=C(CH_3)-CONH-$, $CH_3-CH=CH-CONH-$, $CH_2=CH-O-CO-$, $CH_2=C(CH_3)-OCO-$, $CH_2=CH-CH_2-OCO-$, $CH_2=CH-NHCO-$, $CH_2=CH-CH_2-NHCO-$, $CH_2-CH-SO_2-$, $CH_2=CH-CO-$, $CH_2=CH-O-$, $CH_2=CH-S-$, groups of the following formulae:

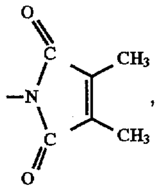 , 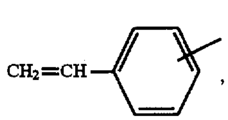 ,

Other units in the segments ($X_1$) and ($Y_1$) may be any units corresponding to monomers which are copolymerizable with the monomers corresponding to the above mentioned units. Examples of them include units of addition polymer, polyester, polyether and polyimine.

The unit of the addition polymer may be those selected from units of the following formula $I_1$.

$$-(CH(a_{101})-C(a_{102})(V_{101}-R_{111}))- \quad (I_1)$$

In formula $I_1$, $V_{101}$ is $-COO-$, $-OCO-$, $-(CH_2)_iOCO-$, $-(CH_2)_iCOO-$, $-O-$, $-SO_2-$, $-CON(R^{122})-$, $-SO_2N(R^{122})-$, $-CO-$, $-CONHCOO-$, $-CONHCONH-$, or $-C_6H_4-$, wherein i is an integer of 1 or 2, $R^{122}$ represents the same as defined above for $R_{111}$.

If $V_{101}$ is $-C_6H_4-$, the benzene ring may have substituent(s). The substituents may be a halogen atom (such as a chlorine or bromine atom), an alkyl group (such as methyl, ethyl, propyl, butyl, chloromethyl, methoxymethyl), an alkoxy group (such as methoxy, ethoxy, propoxy, butoxy).

$a_{101}$ and $a_{102}$ each represents independently a hydrogen atom, a halogen atom, a cyano group, a hydrocarbon group having 1 to 8 carbon atoms, $-COOZ^{103}$, a hydrocarbon group having 1 to 8 carbon atoms which is substituted by $-COOZ^{103}$ (wherein $Z^{103}$ represents a hydrogen atom or a hydrocarbon group having 1 to 18 carbon atoms).

Preferably, $a_{101}$ and $a_{102}$ each represents independently a hydrogen atom, an alkyl group having 1 to 3 (such as methyl, ethyl and propyl), $-COOZ^{103}$, or $-CH_2COOZ^{103}$ (wherein $Z^{103}$ represents preferably a hydrogen atom or an alkyl or alkenyl group having 1 to 18 carbon atoms (such as methyl, ethyl, propyl, butyl, hexyl, octyl, decyl, dodecyl, tridecyl, tetradecyl, hexadecyl, octadecyl, pentenyl, hexenyl, octenyl, decenyl) which may have the same substituent as the following $R_{111}$.

$R_{111}$ represents a hydrocarbon group, preferably a substituted or unsubstituted alkyl group having 1 to 22 carbon atoms (such as methyl, ethyl, propyl, butyl, heptyl, hexyl, octyl, decyl, dodecyl, tridecyl, tetradecyl, hexadecyl, octadecyl, 2-chloroethyl, 2-bromoethyl, 2-cyanoethyl, 2-methoxycarbonylethyl, 2-methoxyethyl, 3-bromopropyl, 2-morpholinoethyl, 2-furfurylethyl, 2-thienylethyl, 6-methoxyethyl-3-oxyethyl, 2-ethoxyethyl, 2-(N,N-dimethylamino)ethyl, 2-methylthioethyl), an alkenyl group having 4 to 18 carbon atoms which may be substituted (such as 2-methyl-1-propenyl, 2-butenyl, 2-pentenyl, 3-methyl-2-pentenyl, 1-pentenyl, 1-hexenyl, 2-hexenyl, 4-methyl-2-hexenyl), an aralkyl group having 7 to 12 carbon atoms which may be substituted (such as benzyl, phenethyl, 3-phenylpropyl, naphthylmethyl, 2-naphthylethyl, chlorobenzyl, bromobenzyl, methyl benzyl, ethyl benzyl, methoxy benzyl, methyl-chloro-benzyl, dimethylbenzyl, dimethoxy benzyl), an alicyclic group having 5 to 8 carbon atoms which may be substituted (cyclohexyl, 2-cyclohexylethyl, 2-cyclopentylethyl), an aromatic group having 6 to 12 carbon atoms which may be substituted (such as phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, chloromethylphenyl, bromophenyl, cyanophenyl, acetylphenyl, methoxycarbonylphenyl, ethoxycarbonylphenyl, butoxycarbonylphenyl, acetamidophenyl, propioamidophenyl, dodecyloylamidophenyl.

Preferably, $V_{111}$ is $-COO-$, $-OCO-$, $-CH_2OCO-$, $-CH_2COO-$, $-O-$, $-CONH-$, $-SO_2NH-$ or $-C_6H_4-$.

The unit of the formula $I_1$ is contained in the segment ($X_1$) in an amount of not more than 50% by weight, preferably not more than 20% by weight. More preferably, it is not contained.

The segment of the formula $I_1$ is contained in the segment ($Y_1$) in an amount of 0 to 95% by weight, preferably 5 to 90% by weight.

Examples of units which can be contained with the unit of formula $I_1$ include units corresponding to monomers copolymerizable with the monomer corresponding to the unit of the formula $I_1$, such as units corresponding to acrylonitrile, methacrylonitrile and heterocyclic vinyls (such as vinyl pyridine, vinyl imidazole, vinyl pyrrolidone, vinyl thiophene, vinylpyrazole, vinyldioxane and vinyloxadine). These monomer may be present in an amount of not more than 20 parts by weight based on 100 parts by weight of the total amount of the polymer segment of the block polymer ($P_1$).

Further, the unit which contains at least one polar group selected from the group consisting of $-PO_3H_2$, $-SO_3H$, $-COOH$, $-P(=O)(OH)R^{101}$ ($R^{101}$ is a hydrocarbon group or $-OR^{102}$ ($R^{102}$ is a hydrocarbon group)) and a group containing a cyclic acid anhydride in an amount of less than 10% by weight.

Examples of $R^{101}$ include: a hydrocarbon group having 1 to 6 carbon atoms which may be substituted (such as methyl, ethyl, propyl, butyl, 2-chloroethyl, 2-bromoethyl, 2-fluoroethyl, 3-chloropropyl, 3-methoxypropyl, 2-methoxy butyl, benzyl, phenyl, propenyl, methoxymethyl, ethoxymethyl and 2-ethoxyethyl). Preferably, $R^{102}$ represents the same meaning as $R^{101}$.

Further, a group containing a cyclic acid anhydride is defined as a group having at least one cyclic acid anhydride. The cyclic acid anhydride may be aliphatic dicarboxylic acid anhydride and aromatic dicarboxylic acid anhydride.

Examples of the dicarboxylic acid anhydrides include succinic acid anhydride, glutaconic acid anhydride, maleic acid anhydride, cyclopentane-1,2-dicarboxylic acid anhydride, cyclohexene-1,2-dicarboxylic acid anhydride and 2,3-bicyclo[2,2,2]octadicarboxylic acid anhydride. These cyclic acid anhydrides may be substituted, for example, by a halogen atom such as a chlorine atom and a bromine atom and an alkyl group such as methyl, ethyl, butyl and hexyl.

Further, examples of aromatic dicarboxylic acid anhydrides include phthalic acid anhydride, naphthalene-dicarboxylic acid anhydride, pyridine-dicarboxylic acid anhydride and thiophene-dicarboxylic acid anhydride. These cyclic acid anhydrides may be substituted, for example, by a halogen atom such as a chlorine atom and a bromine atom and an alkyl group such as methyl, ethyl, propyl, butyl, hydroxy, cyano, nitro and alkoxycarbonyl (alkoxy may be, for example, methoxy and ethoxy).

The above mentioned units may be any units corresponding to vinylic compounds having polar group(s) which can be copolymerized with a monomer corresponding to a unit of formula $I_1$. The vinylic compounds are described in, for example, Polymer Society of Japan, "Polymer data handbook (fundamentals)" published by Baifukan, (1986). Examples of the compounds include acrylic acids, α- and/or β-substituted acrylic acid (such as α-acetoxy acrylic acid, α-(2-amino)methyl acrylic acid, α-bromo acrylic acid, α-fluoro acrylic acid, α-tributylsylil acrylic acid, α-cyano acrylic acid, β-chloro acrylic acid, β-bromo acrylic acid, α-chloro-β-methoxy and α,β-dichloro acrylic acid), maleic acid, semi esters of maleic acid, semi amides of maleic acid, vinyl benzene carboxylate, vinyl benzene sulfonate, vinyl sulfonate, vinyl phosphonate, vinyl- or allyl-semi ester of dicarboxylic acids, or semi ester derivatives of an allyl group, or ester derivatives of these carboxylic acids and sulfonic acids, amide derivatives containing a polar group in substitute.

The following description illustrates the star type copolymer ($P_2$) used as the polymer (P) of the present invention.

The segment ($X_2$) and ($Y_2$) may be present in AB block polymer chain of the star type copolymer ($P_2$) in any order. Namely, Polymer ($P_2$) may have the following formulae:

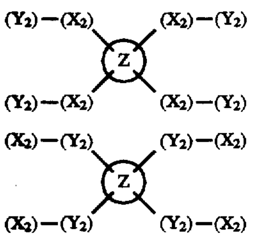

(Z is an organic group, ($X_2$) is the segment ($X_2$), ($Y_2$) is the segment ($Y_2$), and ($X_2$)—($Y_2$) is a polymer chain).

At most fifteen, preferably not more than ten of AB type block copolymers may be linked to the organic group (Z).

The segment ($X_2$) may contain the units having fluorine atom(s) and/or silicon atom(s) in an amount of at least 50% by weight, preferably not less than 80% by weight, especially not less than 90% by weight based on the total weight of the segment ($X_2$).

The segment ($Y_2$) may contain the units having photo and/or thermosetting group(s) in an amount of 1 to 60% by weight, preferably 5 to 40% by weight based on the total weight of the segment ($Y_2$).

The ratio by weight of the segment ($X_2$) to the segment ($Y_2$) is 5-95 to 95-5, preferably 10-90 to 90-10.

Otherwise, the migration of the polymer ($P_2$) to the top surface of the photoconductive layer and anchor effect by the polymer ($P_2$) will decrease, and releasability of the transfer layer will decrease.

Weight-average molecular weight of the polymer ($P_2$) may be $5\times10^3$ to $1\times10^6$, preferably $1\times10^4$ to $5\times10^5$. Weight-average molecular weight of the segment ($X_2$) is preferably not less than $1\times10^3$.

The unit having fluorine atom(s), the unit having silicon atom(s), and the linking group thereof in the segment ($X_2$) may be those illustrated above for the polymer (P). The segment ($Y_2$) may be one illustrated above for the segment ($Y_1$).

The organic molecules (Z) may be any type of molecules having molecular weight of not more than 1000. Examples of the organic molecules include three valent hydrocarbon residues such as the following molecules.

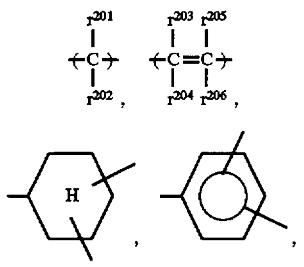

($r^{201}$ to $r^{206}$ each represents independently a hydrogen atom or a hydrocarbon atom, provided that at least one of $r^{201}$ and $r^{202}$, and at least one of $r^{203}$ to $r^{206}$ is connected to the polymer chain)

These organic groups may be present either solely or in combination. In the latter case, the organic molecule (Z) may further contain a linking group including —O—, —S—, —N($r^{207}$)—, —COO—, —CON($r^{207}$)—, —$SO_2$—, —$SO_2N(r^{207})$— ($r^{207}$ is each independently a hydrogen atom or a hydrocarbon residue), —NHCOO—, —NHCONH—, and a residue of a heterocycle having hetero atom(s) such as an oxygen atom, a sulphur atom and a nitrogen atom (such as thiophene, pyridine, pyran, imidazole, benzimidazole, furan, piperidine, pyrazine, pyrrole, piperazine).

Examples of the linking groups further include a combination of the above mentioned linking groups and a group having the following formulae. However, the organic molecules (Z) are not limited to those illustrated above.

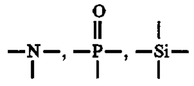

The following illustrates the graft copolymer ($P_3$) used as the polymer (P) of the present invention.

The segment ($X_3$) may contain the units having fluorine atom(s) and/or silicon atom(s) in an amount of at least 50% by weight, preferably not less than 80% by weight, especially not less than 90% by weight based on the total weight of the segment ($X_3$).

The segment ($Y_3$) may contain the units having photo and/or thermosetting group(s) in an amount of 1 to 60% by weight, preferably 5 to 40% by weight based on the total weight of the segment ($Y_3$).

The ratio by weight of the segment ($X_3$) to the segment ($Y_3$) is 5-95 to 95-5, preferably 10-90 to 90-10.

Otherwise, the migration of the polymer ($P_3$) to the top surface of the photoconductive layer and anchor effect by the polymer ($P_3$) will decrease, and releasability of the transfer layer will decrease.

Weight-average molecular weight of the polymer ($P_3$) may be $5\times10^3$ to $1\times10^6$, preferably $1\times10^6$ to $5\times10^5$. Weight-average molecular weight of the segment ($X_3$) is preferably not less than $1\times10^3$.

The segments ($X_3$) and ($Y_3$) may be present in the graft copolymer ($P_3$) in any order. Namely, the polymer ($P_3$) may have the following formulae:

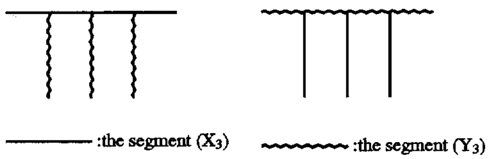

The unit having fluorine atom(s), the unit having silicon atom(s), and the linking group thereof in the segment ($X_3$) may be those illustrated above for the polymer (P). The segment ($Y_3$) may be one illustrated above for the segment ($Y_1$).

The following illustrates the block copolymer containing the graft copolymer segment ($P_4$) used as the polymer (P) of the present invention.

The segment ($X_4$) may contain the units having fluorine atom(s) and/or silicon atom(s) in an amount of at least 50% by weight, preferably not less than 80% by weight, especially not less than 90% by weight based on the total weight of the segment ($X_4$). Further, the polymer (P) may contain one-functional macromonomer segment(s) ($M_A$) which is copolymerizable with the segment ($X_4$) and has weight-average molecular weight of $1\times10^3$~$2\times10^4$. The mono-functional macromonomer segment ($M_A$) contains the units having fluorine atom(s) and/or silicon atom(s) in an amount of not less than 90% by weight based on the total weight of the macromonomer segment ($M_A$). The segment ($X_4$) may contain the macromonomer segment ($M_A$) in an amount of 1–50% by weight, preferably 3–30% by weight based on the total weight of the segment ($X_4$).

The unit having fluorine atom(s) and/or silicon atom(s) may contain at least three fluorine atoms if it does not contain a silicon atom. It may contain at least two silicon atoms if it does not contain a fluorine atom. Further it may contain at least one fluorine atom and one silicon atom.

The segment ($Y_4$) may contain the unit having photo and/or thermosetting group(s) in an amount of 1 to 60% by weight, preferably 5 to 40% by weight based on the total weight of the segment ($Y_4$).

Further, the polymer (P) may contain at least mono-functional macromonomer(s) segment ($M_B$) which is copolymerizable with the segment ($X_4$) and has $1\times10^3$~$2\times10^4$ of weight-average molecular weight, as copolymer segments. The mono-functional macromonomer segment ($M_B$) contains the unit having photo and/or thermosetting group(s) in an amount of 1–50% by weight, preferably 3–30% by weight based on the total weight of the macromonomer segment ($M_B$). The segment ($X_4$) contains the macromonomer segment ($M_B$) in an amount of 1–50% by weight, preferably 3–30% by weight based on the total weight of the segment ($X_4$).

The ratio by weight of the segment ($X_4$) to the segment ($Y_4$) is 5-95 to 95-5, preferably 10-90 to 90-10.

Otherwise, the migration of the polymer ($P_4$) to the top surface of the photoconductive layer and anchor effect by the polymer ($P_4$) will decrease, and releasability of the transfer layer will decrease.

Weight-average molecular weight of the polymer ($P_4$) may be $5\times10^3$ to $1\times10^6$, preferably $1\times10^4$ to $5\times10^5$. Weight-average molecular weight of the segment ($X_4$) is preferably not less than $1\times10^3$.

The segments ($X_4$) and ($Y_4$) may be present in the block copolymer ($P_4$) in any order. Namely, the polymer ($P_4$) may have the following formulae:

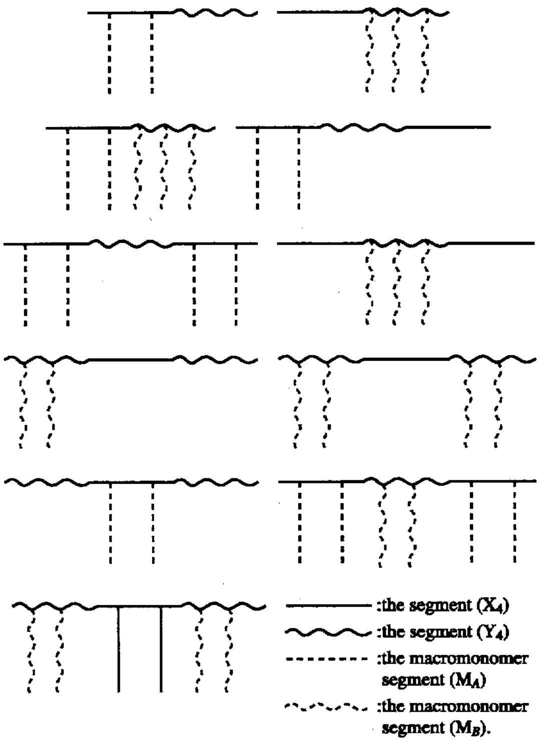

The following description illustrates the one-functional (mono-functional) Macromonomer ($M_A$).

Weight average molecular weight of the Macromonomer ($M_A$) is in the range of $1\times10^3$ to $2\times10^4$, preferably $3\times10^3$ to $1\times10^4$. Weight average molecular weight of not more than $1\times10^3$ results in a too short graft segment to have releasing effect. Weight average molecular weight of not less than $2\times10^4$ results in too poor reactivity with other monomers to form a graft copolymer.

The one-functional macromonomer ($M_A$) may have a double bond group represented by the following formula $I_5$ at one end of a main chain thereof:

$$CH(b_1){=}C(b_2){-}V_5{-} \qquad (I_5)$$

wherein $b_1$ and $b_2$ may respectively represent groups mentioned above for $a_1$ and $a_2$ of the formula $I_1$ respectively, and $V_5$ may represent groups mentioned above for $V_{101}$ of the formula $I_1$.

The double bond group may be bonded to the end of macromonomer ($M_A$) either directly or through a linking group. The linking group may be those described above as linking groups for combination of two or more organic residues having a fluorine atom(s) and/or a silicon atom(s).

Preferably, the macromonomer ($M_A$) contains the double bond group only at the one end of main chain thereof.

Examples of the double bond groups or segments comprising the double bond group and the linking group include groups represented by the following formulae:

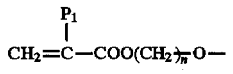
(c-1)

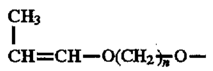
(c-2)

-continued $CH_2=CH-$ (c-3)

$CH_2=CH-CH_2-$ (c-4)

(c-5)

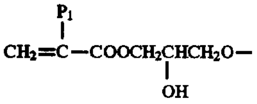
(c-6)

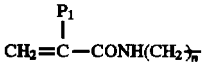
(c-7)

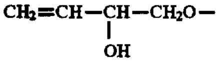
(c-8)

(c-9)

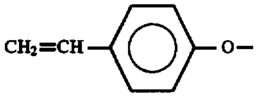
(c-10)

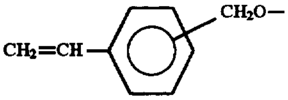
(c-11)

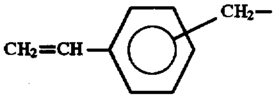
(c-12)

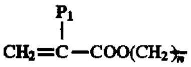
(c-13)

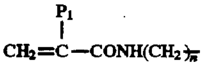
(c-14)

(c-15)

(c-16)

$CH_2=CH-CH_2-COO(CH_2)_n$ (c-17)

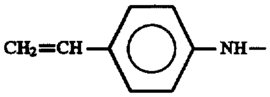
(c-18)

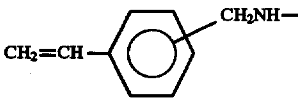
(c-19)

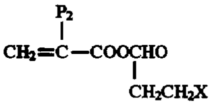
(c-20)

-continued

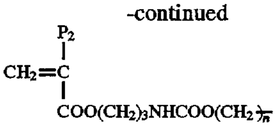
(c-21)

(c-22)

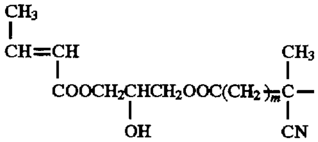
(c-23)

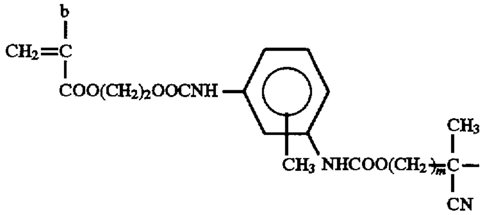
(c-24)

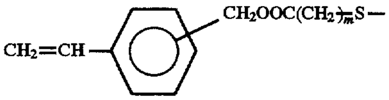
(c-25)

$CH_2=CH-CH_2OCO(CH_2)_m-S-$ (c-26)

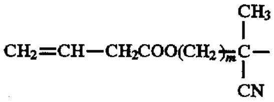
(C-27)

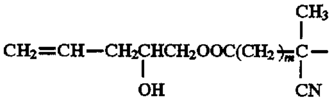
(c-28)

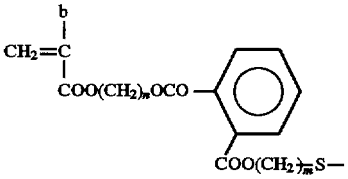
(c-29)

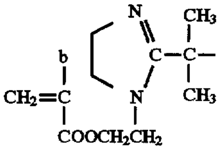
(c-30)

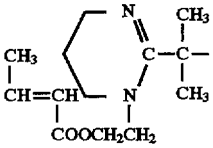
(c-31)

wherein $P_1$ is —H, —$CH_3$, —$CH_2COOCH_3$, —Cl, —Br or —CN, $P_3$ is —H or —$CH_3$. X is —Cl or —Br, n is an integer of 2 to 12, and m is an integer of 1 to 4.

The unit having fluorine atom(s), the unit having silicon atom(s), the linking group thereof and the unit having them may be those illustrated above for the polymer (P). The segment $Y_4$ may be those illustrated above for the segment $Y_1$.

These block copolymers (P) may be prepared in accordance with known polymerization methods which are described in the following literatures: W. J. Burlant, A. S. Hoffman "Block and Graft Polymer" (1986, Renhald), R. J. Ceresa, "Block and Graft Polymers" (1962, Butterworths), D. C. Allport, W. H. James "Block Copolymers" (1972, Applied Sci), A. Noshay, J. F. McGvath "Block Copolymers" (1977, Academic press.), G. Huvtrez D. J. Wilson, G. Riess, NATO ASI Sev. Sev. E. 1985, 149, V. Percea, Applied. Polymer Sci. 285, 95 (1985).

Ionic polymerization reactions wherein alkyl lithium, lithium diisopropylamide, alkali metal alcoholates, alkyl magnesium halides, alkyl aluminium halides etc. are used as a polymerization initiator are described in the following literatures: T. E. Hogeu-Esch, J. Smid, "Receuet Advanaes in Anionic Polymerization" (1987, Elsevier New York), Yoshio Okamoto, Polymer, 38, 912 (1989), Mitsuo Sawamoto, Polymer, 38, 1018, (1989), Tadashi Narita, Polymer, 37, 252 (1981), B. C. Anderson, et al, Macromolecules 14, 1601(19821), S. Aoshima, T. Higashimura Macromolecules 22, 1009(1989) etc.

Ionic polymerization reactions with hydrogen iodide/iodine system etc. are described in Macromol. Chem., Macromol. Symp., 13/14, 457(1988), Toshinobu Higashimura, Mitsuo Sawamoto, papers for Polymer, 46, 189 (1989).

Group transfer polymerization reactions are described in D. Y. Sogah et al, Macromolecules 20, 1473 (1987), O. W. Webster, D. Y. Sogah, Polymer, 36, 808(1987), M. T. Reetg, et al, Angew. Chem. Int. Ed. Eugl. 25, 9108(1986), J. P. KOKAI NO. Sho 63-97609 etc.

Further, living polymerization reactions with porphyrin metal complex are described in T. Yasuda, T. Aida, S. Inoue, Macromolecules, 17, 2217 (1984), M. Kuroki, T. Aida, S. Inoue, J. Auu Chem. Soc. 109, 4737 (1987), M. Kuroki et al, Macromolecules, 21, 3115 (1988), M. Kuroki, I. Inoue, Organic Synthesis, 47, 1017 (1989) etc.

Ring opening polymerizations of cyclic compounds are described in the following literatures: S. Kobayashi, T. Saegusa, "Ring Opening Polymerization" (1984, Applied Science Publishors, Co.,Ltd.), W. Seeliger et al. Angew. Chem. Int. Engl. 5, 875 (1966), S. Kobayashi et al, Poly, Bull. 13, 447 (1985), Y. Chujo et al, Macromolecules, 22, 1074, (1989) etc.

Further, photo living polymerization reactions wherein dithiocarbamate compound or xanthate compound are used as initiator are described in the following literatures: Takayuki Otsu, Polymer, 37, 248 (1988), Shunichi Hinoemori, Takaiti Otsu, Polym. Rep. Jap. 37, 3508 (1988), J. P. KOKAI Nos. Sho 64-111 and Sho 64-26619, M. Niwa, Macromolecules, 189, 2187 (1988) etc.

Methods for preparation of block copolymer by radical polymerization reaction wherein a polymer containing azo groups or peroxide groups is used as initiator are described in the following literatures: Akira Ueda et al, Papers for Polymer, 33, 931 (1976), Akira Ueda, Reports by Osaka City Industrial Laboratory, 84, (1989), O. Nuyken et al, Mcekromol. Chem. Rapid. Commun, 9, 671 (1988), Yasuo Moriya et al, Reinforced Prastics, 29, 907 (19), Ryohei Oda, Science and Industry, 61, 43(1987) etc.

Methods for preparation of a graft copolymer are described in the above literatures and the following literatures: Fumio Ide, "Graft polymerization and application thereof" (1977, Polymer publishers); Polymer Society of Japan, "Polymer alloy" (1981, Tokyo Kagaku Doujin) etc.

Those methods include, for example, a method for grafting by mechanochemical reaction in mechanical application etc., a method for grafting with polymer chains and functional groups in polymer chains, a method for grafting by chemical bond (reaction between polymer), or a method for grafting by polymerization with macromonomer.

Methods for grafting are described in the following literatures: T. Shiota et al, J. Appl. Polym. Sci. 13, 2447 (1969), W. H. Buck Rubber Chemistry and Technology, 50, 109 (1976); Tsuyoshi Endo, Tsutomu Yokozawa, Journal of Japan Adhesive Society (Nihonsecchakukyokaishi), 24, 323 (1988), Tsuyoshi Endo, ibid, 25, 409, (1989) etc.

Methods for grafting by polymerization with macromonomer described in the following literatures: P. Dreyfuss & R. P. Quirk, Encycl. Polym. Sci. Eng., 7, 551 (1987), P. F. Rempp, E. Franta, Adv. Polym. Sci., 58, 1 (1984), V. Percec, Appl. Poly. Sci., 285, 95 (1984), R. Asami, M. Takari, Macromol. Chem. Suppl., 12, 163 (1985), R. Rempp., et al, Macromol. Chem. Suppl., 12, 163 (1985), P. Rempp., et al, Macromol. Chem. Suppl., 12, 163 (1985), P. Rempp., et al, Macromol. Chem. Suppl., 8, 3 (1984), Yushi Kawakami, Chemical Industry, 38, 56 (1987), Yuya Yamashita, Polymer, 31, 988 (1982), Shiro Kobayashi, Polymer, 30, 625 (1981), Toshinobu Higashimura, Journal of Japan Adhesive Society, 18, 536 (1982), Koichi Ito, Polymer Processing, 35, 262 (1986), Shiro Toki, Takashi Tsuda, functional materials, 1987, No. 10, 5; Yuya Yamashita, "Chemistry and Industry of Macromonomer" (1989, I.P.C Co., Ltd.) Tsuyoshi Endo, "Design of Construction for Novel Functional Polymer", Chapter 4, (1991, CMC Co., Ltd.; Y. Yamashita et al. Polym. Bull. 5, 361 (1981) etc.

Methods for preparation of a star type block copolymer are described in the following literatures: M. T. Reetz Anger. Chem. Int. Ed. Engl 27, 1373 (1988), M. Sgwarc, "Carbanions, Living Polymers and Electron Trausfer Processes" (1968. Wiley. New York), B. Gordon et al, Polym. bull. 11, 349 (1984), R. B. Bates et al. J. Org. Chem. 44, 3800 (1979), Y. Sogah, A. C. S. Polym. Repr. 1988, No. 2, 3, J. W. Mays. Polym. Bull. 23, 247 (1990), I. M. Khan. et al. Macromolecules, 21, 2684 (1988), A. Morikawa Macromolecules, 24, 3469 (1991), Akira Ueda, Susumu Nagai, Polymer, 39, 202 (1990), T. Otsu, Polym. Bull. 11, 135 (1984) etc.

Methods for preparation of star type block copolymer are also described in the following literatures: W. J. Burlant, A. S. Hoffman, "Block and Graft Polymers" (1960, Renhold), R. J. Ceresa, "Block and Graft Copolymers" (1962, Butterwords) L. C. Allport, W. H. James, "Block Copolymers" (1972, Applied Sci), A. Noshay, J. E. McGrath "Block Copolymers" (1977, Academic press.) et al.

Further, the star type copolymer used in the present invention can be prepared by known method wherein monomers having polar groups and double bonds are used, for example, polymerization reaction wherein carbanion is used as initiator. Examples of the methods are described in the following literatures: M. Morton, T. E. Helminiak et al, J. Polym. Sci., 57, 471 (1962), B. Gordon III, M. Blumenthal, J. E. Loftus et al, Polym. Bull., 11, 349 (1984), R. B. Bates, W. A. Beavers et al, J. Org. Chem., 44, 3800 (1979).

For the preparation of the polymer (P) containing particular polar groups such as —COOH in the segments ($Y_1$), ($Y_2$), ($Y_3$) and ($Y_4$), the groups in corresponding monomers should be protected by a protective group, and the protective group should be released after polymerization such as living polymerization, for example, ionic polymerization reaction with organic metal compounds (such as alkyl lithiums, lithium diisopropylamide, alkyl magnesium halides) or hydrogen iodide/iodine, photopolymerization wherein porphyrin metal complex is used as a catalyst. Examples of the reaction are illustrated by the following reaction formula.

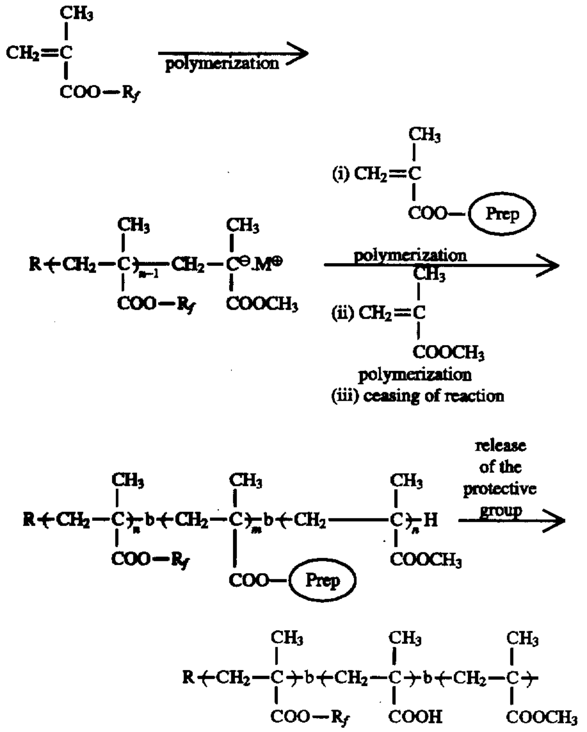

$R_f$: an alkyl group substituted by fluoro atom(s)
R: an alkyl group, a residue of porphyrine ring
Prep: a protective group (such as $—C(C_6H_5)_3$, $—Si(C_3H_7)_3$)
b: indicates that the units attached to "b" constitute a block to form a block copolymer Protection by the protective group and release of the protective group can be conducted easily by known techniques. Such methods are described also in the following references: Yoshio Iwakura, Keisuke Kurita, "Reactive Polymer", Kodansha Co., Ltd. (1977), T. W. Green, "Protective Groups in Organic Synthesis", John Wiley $ Sons (1981), J. F. W. Mc Omie, "Protective Groups in Organic Chemistry" Plenum Press, (1973) etc.

The polymer may be prepared by the methods wherein polymerization is conducted without protecting particular polar groups, using a compound having dithiocarbamate groups or a compound having xanthate groups as initiator, under light radiation. The methods are described in the following literatures: Takayuki Otsu, Polymer, 37, 248 (1988), Shunichi Hinoemori, Takaichi Otsu, Polym. Rep. Jap. 37, 3508 (1988), J. P. KOKAI Nos. Sho 64-111 and Sho 64-26619, Nobuyuki Higashi, Polymer Preprints, Japan, 36, (6), 1511 (1987), M. Niwa, N. Higashi et al, J. Macromol. Sci. Chem. A 24 (5), 567 (1987) etc.

Molecular weight of the polymer (P) used in the present invention can be controlled easily by varying ratio of the total amount of monomers to polymerization initiator, or polymerization temperature etc. as well known in the art.

The methods for preparation of the polymer (P) used in the present invention are not limited to the above mentioned methods.

The polymer (P) can be easily prepared using appropriate monomer and initiator.

Methods for preparation of the polymer (P) are aleo described in the following references: Akira Ueda, Susumu Nagai et al., Kobunshi Ronbunshu, 33, 131(1976). Akira Ueda, Susumu Nagai et al., Kagaku to Kogyo, 64, 446 (1990).

Methods for preparation of the Macromonomers ($M_A$) amd ($M_B$) are also described in the following references:

P. Lutz, P. Masson et al., Polym. Bull., 12, 79(1984) B. C. Anderson, G. D. Andrews et al., Macromolecules, 14, 1601 (1981), K. Hatada, K. Ute. et al., Polym. J. 17, 977 (1985), 18, 1037(1986), Koichi Migite, Koichi Hatada, Kobunshikako, 36, 366(1987), M. Kuroki, T. Aida, T. Am. Chem. Soc. 109, 4737(1987), Takuzo Aida, Shohei Inoue, Yukigoseikagaku, 43, 300(1985), D. Y. Sogah, W. R. Hertler et al., Macromolecules, 20, 1473(1987), J. P. KOKAI Nos Sho 64-111 and Sho 64-26619, Y. Yamashita, J. Appl. Polym. Sci, Appl. Polym. Symp, 36, 193(1981), K. K. Roy et al., Makromol. Chem. 153, 71 (1972), Y. Yamashita et al., Polym. J., 14, 255(1982), Akira Ueda, Susumu Nagai, Kagaku to Kogyo, 60, 57(1986).

Introdution of the double bond group at the end of the main-chain of the one-functional Macromonomers ($M_A$) and ($M_B$) can be conducted by known methods for preparation of macromonomers.

(Polymer (Q))

The photo and/or thermosetting group contained in the polymer (Q) (including ($Q_1$), ($Q_2$), ($Q_3$), and ($Q_4$)) can be any groups, such as those mentioned above for the polymer (P).

Examples of the polymer (Q) are described in the following literatures: Takaharu Shibata, Jiro Isiwatari, Polymer, 17, p. 278 (1968), Seiji Miyamoto, Hidehiko Takei, Imaging, 1973, (No. 8), Koich Nakamura, "Practical Techniques or Binder for Recording Materials", Chapter 10, C.H.C Co., Ltd., (1985), Electrophotographic Society of Japan, "Symposium for the Present Condition of Photosensitive Material for Electrophotograph", (1985); Hiroshi Komon, "Recent Development and Utilization of Photoconductive Material and Photosensitive Material", published by Nihonkagaku-joho Co., Ltd., (1986), D. Tatt, S. C. Heidecker, Tappi, 49, (No. 10), 439 (1966), E. S. Baltazzi, R. G. Blanclotte et al, Phot. Sci. Eng. 16, (No. 5), 354 (1972), Guen Chan Kei, Isamu Shimizu, Eiichi Inoue, Journal of Society of Electrophotographics of Japan, 18, (No. 2), 22, (1980).

Examples of the binder Q include: olefin polymer and copolymer, vinyl chloride copolymer, vinylidene chloride copolymer, alkanoic acid vinyl polymer and copolymer, alkanoic acid allyl polymer and copolymer, butadiene-unsaturated carboxylate copolymer, acrylonitrile copolymer, methacrylonitrile copolymer, styrene-acrylate copolymer, styrene-methacrylate copolymer, itaconic acid diester polymer and copolymer, maleic anhydride copolymer, acrylamide copolymer, methacrylamide copolymer, hydroxy modified silicone resin, polycarbonate resin, ketone resin, polyester resin, silicone resin, amide resin, hydroxy- and carboxyl-modified polyester resin, butyral resin, polyvinylacetal resin, cyclized rubber-methacrylate copolymer, cyclized rubber-acrylic ester copolymer, copolymer having heterocycle which does not have a nitrogen atom (heterocycle may be furan, tetrahydrofuran, thiophene, dioxane, dioxofuran, lactone, benzofuran, benzothiophene and 1,3-dioxetane) and epoxy resins.

The unit having photo and/or thermosetting groups may be contained in the binder (Q) in an amount of 0.1–40% by weight, preferably 1–30% by weight based on the weight of the binder (Q).

The unit less than 0.1% by weight results in insufficient cure after coating. Then, it leads to insufficient retention of the interface between the photoconductive layer and the transfer layer to affect the releasability of the transfer layer inadvantageously.

The unit more than 40% by weight results in insufficient electrophotographic properties, and it sometimes causes a lowering of the reproductivity of original images and occurring of background contamination.

The binder (Q) is contained in an amount of not less than 40% by weight based on the weight of all binders of the photoconductive layer.

The binder (Q) less than 40% by weight results in insufficient electrophotographic properties.

The following description illustrates a preferable embodiment of the polymer particle (L) used in the present invention.

The polymer particle (L) comprises the polymer segment (s)(X) which is insoluble in nonaqueous solvent and contains the units having fluorine atom(s) and/or silicon atom(s) and the polymer segment(s) ($Y_0$) which is soluble in nonaqueous solvent and contains 0 to 20% by weight of the units having fluorine atom(s) and/or silicon atom(s). Average size of the particles is not more than 1 μm.

Examples of methods for preparation of particle (L) are anhydrous system polymerization method described in the following literatures: K. E. J. Barrett "Dispersion Polymerization in Organic Media": John Wiley (1975), Koichiro Murata, Polymer Processing, 23, 20 (1974), Tsunetaka Matsumoto, Toyokichi Tange, Jounal of Japan adhesive society, 23, 26 (1987), D. J. Walbridge, NATO. Adv. study. Inst. Ser. E. No. 67, 40 (1983), British Patent No. 893429, British Patent No. 934038, U.S. Pat. Nos. 1,122,397, 3,900, 412, 4,606,989, J. P. KOKAI Nos. Sho 60-179751, Sho 60-185963 and Hei 2-13965 etc.

Nonaqueous solvents used in the preparation of the polymer particle dispersible in nonaqueous solvent system may be any organic solvent having not more than 200° C. of boiling point. They may be used either solely or as combination thereof.

Examples of the organic solvents include: alcohols such as methanol, ethanol, propanol, butanol, fuluoroalcohol and benzylalcohol, ketones such as acetone, methyl ethyl ketone, cyclohexanone, diethylketone, ethers such as diethylether, tetrahydrofuran and dioxan, esters of carboxylic acids such as methyl acetate, ethylacetate, butyl acetate and methyl propionate, aliphatic hydrocarbons having 6 to 14 carbon atoms such as hexane, octane, decane, tridecane, cyclohexane and cyclooctane, aromatic hydrocarbons such as benzene, toluene, xylene and chlorobenzene, halogenated hydrocarbons such as methylene chloride, dichloroethane, tetrachloroethane, chloroform, methyl chloroform, dichloropropane and trichloroethane. However, solvents used in the present invention are not limited to above exemplified solvents.

Preparing the polymer particles by dispersion polymerization in the above nonaqueous solvent, polymer particles which have average particle size of not more than 1 μm can be obtained, and particle sizes of them results in a narrow range, and dispersion thereof is monodisperse.

The monomer (A) corresponding to the unit for the segment (X) and the monomer (B) corresponding to the unit for the segment (Y) are thermally polymerized in a solvent which dissolves monomer (A), but does not dissolve resultant polymer in the presence of polymerization initiators such as peroxides (such as benzoyl peroxide, lauroyl peroxide), azobis compounds (such as azobisisobutyronitrile, azobis isovaleronitrile) and organometallic compounds (such as butyl lithium) to prepare the polymer particle (L). Alternatively, the monomer (A) and the polymer (PY) which comprises the block segment (Y) are polymerized as mentioned above.

The segment (X) may have crosslinked pants which constitutes insoluble part of the particle (L).

Crosslinking is conducted by any known method.

Examples for the methods include: (a) a method wherein the polymer containing the polymer segment (X) is crosslinked with an appropriate cross linking agent or curing agent; (b) a method wherein a network structure in polymer molecules is formed by adding polyfunctional monomer or polyfunctional oligomer having two or more polymerizable functional groups to monomers corresponding to the polymer segment (X); (c) a method wherein a monomer corresponding to the polymer segment (X) and a monomer containing a crosslinking functional group are reacted upon polymerization to form a crosslinking structure or a method wherein the polymer containing the polymer segment (X) and a polymer which contains a component containing a crosslinking functional group are reacted by the polymer reaction to form a crosslinking structure.

Examples of crosslinking agents used in the above method (a) are described in the following literatures: Shinzo Yamashita, Tosuke Kaneko, "Cross Linking Agent Handbook", published by Tiseisha, (1981); Polymer Society of Japan, "Polymer Handbook, (fundamentals)", published by Baifukan (1986).

Examples of crosslinking agents include: organic silane compounds (such as silane coupling agent of vinyl trimethoxy silane, vinyl tributoxy silane, γ-glycidoxy propyl trimethoxy silane, γ-mercapto propyl triethoxy silane, γ-aminopropyltriethoxy silane), polyisocyanate compounds (such as toluylene diisocyanate, o-toluylene diisocyanate, diphenylmethane diisocyanate, triphenylmethane triisocyanate, polymethylenepolyphenyl isocyanate, hexamethylene diisocyanate, isophorone diisocyanate, polymeric polyisocyanate), polyols (such as 1,4-butanediol, polyoxypropyleneglycol, polyoxyalkyleneglycol, 1,1,1-trimthylolpropane), polyamines (such as ethylenediamine, γ-hydroxy propyl ethylenediamine, phenylene diamine, hexamethylene diamine, N-aminoethylpiperazine, modified aliphatic polyamine), polyepoxy group containing compounds and epoxy resins (such as compounds described in Hiroshi Kakiuchi, "Novel Epoxy Resins", Shokodo, (1985), Kuniyuki Hashimoto, "Epoxy Resins", Nikkan kogyo newspaper company, (1969)), melamine resins (such as compounds described in Mitsuwa Ichiro, Hideo Matsunaga, "Urea Melamine Resins", Nikkan kogyo newspaper company, (1969)) and poly(metha)acrylate compound (such as compound described in Haranobu Okawa, Takeo Saegusa, Toshinobu Higasimura, "Oligomer", Kodansha, (1976), Eizo Omori, "Functional acrylic resin", technosystem, (1985)).

Examples of the polymerizable functional groups of polyfunctional monomers (polyfunctional monomer (D)) or polyfunctional oligomers having not less than polymerizable functional groups used in the method (b) include: $CH_2{=}CH{-}CH_2{-}$, $CH_2{=}CH{-}CO{-}O{-}$, $CH_2{=}CH{-}$, $CH_2{=}C(CH_3){-}CO{-}O$, $CH(CH_3){=}CH{-}CO{-}O{-}$, $CH_2{=}CH{-}CONH{-}$, $CH_2{=}C(CH_3){-}CONH{-}$, $CH(CH_3){=}CH{-}CONH{-}$, $CH_2{=}CH{-}O{-}CO{-}$, $CH_2{=}C(CH_3){-}O{-}CO{-}$, $CH_2{=}CH{-}CH_2{-}O{-}CO{-}$, $CH_2{=}CH{-}NHCO{-}$, $CH_2{=}CH{-}CH_2{-}NHCO{-}$, $CH_2{=}CH{-}SO_2{-}$, $CH_2{=}CH{-}CO{-}$, $CH_2{=}CH{-}O{-}$, $CH_2{=}CH{-}S{-}$. The monomer and the oligomer may have at least two of the above polymerizable functional groups which may be same or different.

Examples of the monomer having not less than two polymerizable functional groups include monomers or oligomers having the same polymerizable functional groups, for example, styrene derivatives such as divinylbenzene, trivinylbenzene; polyalcohol (such as ethyleneglycol, diethyleneglycol, triethyleneglycol, polyethyleneglycol#200, #400, #600, 1,3-butyleneglycol, neopentylglycol, dipropyleneglycol, polypropyleneglycol, trimethyrolpropane, trimethylolethane, pentaerythritol); or methacrylic, acrylic, or crotonic acid esters of polyhydroxyphenols (such as hydroquinone, resorcinol, catechol and derivatives thereof); vinyl ethers; allyl ethers; vinyl esters, allyl esters, vinyl amides and allyl amides of dibasic acids (such as malonic acid, succinic acid, glutaric acid, adipic acid, pimelic acid, maleic acid, phthalic acid, and itaconic acid); and condensation products of polyamines (ethylene diamine, 1,3-propylene diamine and 1,4-butylene diamine) with carboxylic acid having vinyl group (such as methacrylic acid, acrylic acid, crotonic acid and allylacetic acid).

The polymers may be prepared by polymerizing not more than 10 mol %, preferably not more than 5 mol % of monomers or oligomers having not less than two of polymerizable group used in the present invention based on the total amount of the monomer (A) and other monomers added to monomers.

Further, crosslinking between the polymers may be conducted by reaction between reactive groups of the polymers which forms chemical bonds as ordinal reaction of organic compound with low molecular weight.

The method (B) may be preferable in order to form an interstice construction between molecules, since it results in particles which have narrow distribution of particle size and are monodisperse, and it tends to provide not more than 5 μm of average particle size. Namely, the polyfunctional monomer (D) is added to above-mentioned monomer (A), monomer (B) and/or the polymer (PY) to conduct polymerization granulation reaction of them.

The polymer (PY) has a double bond group copolymerizable with monomer (A) in a side chain or at one terminal of the main chain of polymer.

Polymerizable double bond group may be any group which is copolymerizable with monomer (A). Examples of the groups include:

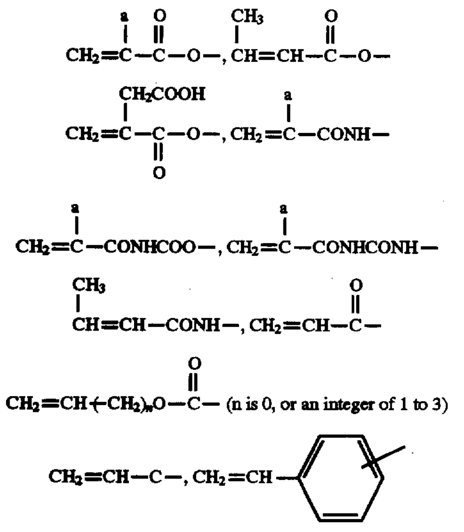

(wherein a is H or $-CH_3$).

Polymerizable groups may connect with polymer chain directly, or through other di-valent organic groups.

These polymers can be prepared, for example, methods described in J. P. KOKAI Nos. Sho 61-43757, Hei 1-257969, Hei 2-74956, Hei 1-282566, Hei 2-173667, Hei 3-15862 and Hei 2-177449.

Polymerizable compounds may be used in an amount of 5–80 parts by weight, preferably 10–50 parts by weight in 100 parts by weight of nonaqueous solvent. Polymerization initiator may be used in an amount of 0.1–5% by weight base on the total weight of polymerizable compounds. Polymerization temperature may be 30° to 180° C., preferably 40° to 120° C. Polymerization reaction may be conducted for 1 to 15 hours preferably.

Preferably, the polymer (P) and/or the polymer particle (L) may be included in an amount of 0.01 to 40 parts by weight based on 100 parts by weight of all binders including the polymer (P) and the polymer particle (L) which are present in the photoconductive layer of the one-layer type photoconductive layer, or in the layer contacted with the transfer layer of the multi-layer type photoconductive layer. All binders means binders in the above mentioned layer including polymer (P). Less than 0.01 parts of the polymer (P) and/or the polymer particle (L) results in that the transfer layer cannot release easily. More than 40 parts of the polymer results in insufficient reproducibility of the original. The polymer (P) and/or the polymer particle (L) is more preferably used in an amount of 0.1 to 30 parts by weight based on 100 parts by weight of binder in the photoconductive layer.

(Photo and/or thermosetting agent)

Preferably, the photoconductive layer of the electrophotographic material for color proofing of the present invention may further include a small amount of photo and/or thermosetting agent in order to improve curing characteristics of a coating. The photo and/or thermosetting agent may be both of a photo and/or thermosetting polymer (D) and a photo and/or thermosetting compound in this specification.

The photo and/or thermosetting agent may be used in an amount of 0.01–20% by weight, preferably 0.1–15% by weight based on the total amount of the polymer (Q) and the polymer (P).

Less than 0.01% by weight of the photo and/or thermosetting agent results in insufficient improvement in hardening coating. More than 20% by weight of the photo and/or thermosetting agent results in disadvantageous influence on an electrophotographic feature.

A photo and/or thermosetting resin may be any known curable resins, for example, resins having curable groups explained above for the polymer (P).

Examples of the resin are described in the following literatures: Tsuyoshi Endo, "Densifying of Thermosetting Polymer", C.M.C Co., Ltd., (1986), Yuji Harazaki, "The Latest Binder Handbook, chapter II-I, S ogogijutu center, 1985; Takayuki Otsu, "Synthesis, Design and Study for New Use of Acryl Resin, the publishing department of Chubukeieikaihatsu center, 1985; Eizo Omori, "Functional Acryl resins", Technosystem, 1985.

The photo and/or thermosetting agent may be a crosslinking agent. The crosslinking agent in the art may be compounds generally used as a crosslinking agent in the art. Examples of the compound may be those described above as a crosslinking agent for preparation of the polymer particle (L). Further, monomers having polyfunctionat curable groups such as vinylmethacrylate, allylmethacrylate, ethyleneglycoldiacrylate, polyethyleneglycoldiacrylate, divinylsuccinate, divinyladipate, diallylsuccinate, 2-methylvinylmethacrylate, trimethyl olpropanetrimethacrylate, divinylbenzene and pentaerythrytol polyacrylate may also be used.

As explained above, the present invention is characterized in that the photoconductive layer which contacts with a transfer layer is cured after coating. Accordingly, it is preferable to use the polymer (Q), the polymer (P), and the photo and/or thermosetting agent in appropriate combination so that each polymer may have functional groups which can bond chemically with each other.

The polymerization reaction by bonding of functional groups may be well known reactions in the art. The combination of functional groups are shown in the following table as combination of functional groups of Group A and functional groups of Group B. The table should not be understood to limit the present invention.

TABLE 1

| Group A | Group B |
|---|---|
| $-COOH$, | 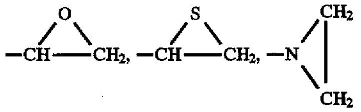 |
| $-PO_3H_2$, $-OH$, $-SH$, | $-COOI$, $-SO_2Cl$, a residue of a cyclic acid anhydride $-N=C=O$, $-N=C=S$, |
| $-NH_2$, | 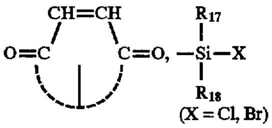 (X = Cl, Br) |
| $-SO_2H$ | 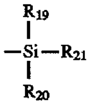 |

$R_{17}$ and $R_{18}$ are alkyl group. $R_{19}$ to $R_{21}$ are alkyl or alkoxy groups. At least one of $R_{19}$ to $R_{21}$ is an alkoxy group.

(Other additives)

A reaction accelerator may be added to the binder (Q) in order to promote crosslinking reaction optionally.

If the crosslinking reaction is a reaction of forming chemical bonds between functional groups, the following accelerator may be used: organic acids (such as acetic acid, propionic acid, butyric acid, benzensulfonic acid and p-toluenesulfonic acid); phenols (phenol, chlorophenol, nitrophenol, cyanophenol, bromophenol, naphthol and dichlorophenol), organometallic compounds (such as zirconium acetylacetonate, zirconium acetylacetate, cobalt acetyl acetate and tin dibutoxy dilaurylate), dithiocarbamic acid compounds (such as salts of diethyldithiocarbamic acid), thiuram disulfide compounds (such as tetramethylthiuram disulfide) and carboxylic acid anhydrates (such as phthalic anhydride, maleic anhydride, sccinic anhydride, butylsuccinic anhydride, 3,3',4,4'-tetracarboxylicbenzophenon dianhydride and trimellitic anhydride).

If the crosslinking reaction is a polymerization reaction, a polymerization initiator (such as peroxides and azobiscompounds) may be used.

The above mentioned binder is cured by light and/or heat after coating. Cure by heat requires severer drying condition than the condition required for preparation of conventional electrophotographic materials. For example, higher temperature and/or longer reaction are required. Alternatively, it is preferable to heat the binder after drying a coating solvent. Heating may be conducted in the temperature between 60° C. and 150° C., for 5 to 120 minutes. Milder condition is possible if the above mentioned reaction accelerator is used.

Methods of photo-setting of particular functional groups of the resin of the present invention may be conducted with a chemical actinic radiation.

The chemical actinic radiation may be visible light, ultraviolet, far ultraviolet, electronic beams, X rays, γ rays, α rays, preferably ultraviolet. Rays having wave length between 310 nm and 500 nm is especially preferable. Generally, a mercury vapor lamp, a halogen lamp, etc. are used for the radiation. The radiation may be conducted from the distance of 5–50 cm, for the period of 10 seconds to 10 minutes.

The photoconductive compound used in the present invention may be either organic compounds or inorganic compounds.

The compound may be, for example, a known inorganic photoconductive compound such as zinc oxide, titanium oxide, zinc sulfide, cadmium sulfide and lead sulfide. Zinc oxide and titanium oxide are preferable from the environmental point of view.

If an inorganic photoconductive compound such as zinc oxide and titanium oxide are used, they are used in an amount of 100 parts by weight for 10–100 parts by weight, preferably 15 to 40 parts by weight of the above mentioned binders.

Organic photoconductive compounds may be any known compounds. For example, a photoconductive layer comprising an organic photoconductive compound, a sensitizing dye and a binder resin described in J. P. KOKOKU Nos. Sho 37-17162 and Sho 62-51462, J. P. KOKAI Nos. Sho 52-2437, Sho 54-19803, Sho 56-107246 and Sho 57-161863; a photoconductive layer comprising a charge generating agent, a charge transporting agent and a binder resin described in J. P. KOKAI Nos. Sho 56-146145, Sho 60-17751, Sho 60-17752, Sho 60-17760, Sho 60-254142 and Sho 62-54266; a two layer type of photoconductive layer containing a charge generating agent and a charge transporting agent respectively in different layers.

The photoconductive layer used in the present invention may be any of those two types of photoconductive layer, namely mono layer type and double layer type.

Examples of organic photoconductive compounds used in the charge transporting layer include:

(a) Triazol derivatives described in U.S. Pat. No. 3,112,197;

(b) Oxadiazol derivatives described in U.S. Pat. No. 3,189,447;

(c) Imidazol derivatives described in J. P. KOKOKU No. Sho 37-16096;

(d) Polyarylalkane derivatives described in U.S. Pat. Nos. 3,615,402, 3,820,989, 3,542,544, J. P. KOKOKU No. Sho 45-555 and Sho 51-10983; J. P. KOKAI Nos. Sho 51-93224, Sho 55-108667, Sho 55-156953 and Sho 56-36656.

(e) Pyrazoline or pyrazolone derivatives described in U.S. Pat. Nos. 3,180,729; 4,278,746; J. P. KOKAI Nos. Sho 55-88064, Sho 55-88065, Sho 49-105537, Sho 55-51086, Sho 56-80051, Sho 56-88141, Sho 57-45545, Sho 54-112637 and Sho 55-74546.

(f) Phenylenediamine derivatives described in U.S. Pat. No. 3,615,404, J. P. KOKOKU Nos. Sho 51-10105, Sho 46-3712 and Sho 47-28336; J. P. KOKAI Nos. Sho 54-83435, Sho 54-110836 and Sho 54-119925.

(g) Aryl amine derivatives described in U.S. Pat. Nos. 3,567,450; 3,180,703; 3,240,597; 3,658,520; 4,232,103; 4,175,961; 4,012,376; J. P. KOKOKU No. Sho 49-35702; West Germany Patent DASNo. 1110518, J. P. KOKOKU No. Sho 39-27577; J. P. KOKAI Nos Sho 55-144250, Sho 56-119132 and Sho 56-22437.

(h) Amino substituted calcon derivatives described in U.S. Pat. No. 3,526,501;

(i) N,N-bicarbazyl derivatives described in U.S. Pat. No. 3,542,546;

(j) Oxazol derivatives described in U.S. Pat. No. 3,257, 203;

(k) Styryl anthracene derivatives described in J. P. KOKAI No. Sho 56-46234;

(l) Fluorenone derivatives described in J. P. KOKAI No. Sho 54-110837;

(m) Hydrazone derivatives described in U.S. Pat. No. 3,717,462; J. P. KOKAI Nos. Sho 54-59143 (corresponding to U.S. Pat. No. 4,150,987), Sho 55-52063, Sho 55-52064, Sho 55-46760, Sho 55-85495, Sho 57-11350, Sho 57-148749 and Sho 57-104144.

(n) Benzydine derivatives described in U.S. Pat. Nos. 4,047,948; 4,047,949; 4,265,990; 4,273,846; 4,299, 897; 4,306,008.

(o) Stilbene derivatives described in J. P. KOKAI Nos. Sho 58-190953, Sho 59-95540, Sho 59-97148, Sho 59-195658 and Sho 62-36674.

(p) Polyvinylcarbazole and derivatives thereof described in J. P. KOKOKU No. Sho 56-46234;

(q) Vinyl polymer such as polyvinylpyrene, polyvinylanthracene, poly-2-vinyl-4-(4'-dimethylaminophenyl)-5-phenyl-oxazol, poly-3-vinyl-N-ethylcarbazole in J. P. KOKOKU Nos. Sho 43-18674 and Sho 43-19192;

(r) Polymers such as polyacenaphthylene, polyindene, copolymer of acenaphthylene with styrene in J. P. KOKOKU No. Sho 43-19193;

(s) Condensation polymers such as pyrene-formaldehyde resin, brompyrene-formaldehyde resin, ethylcarbazol-formaldehyde resin described in J. P. KOKAI Nos. Sho 56-46234;

(t) Triphenylmethanepolymers described in J. P. KOKAI Nos. Sho 56-90833 and Sho 56-161550.

Organic photoconductive compounds should not be limited to the above compounds of (a) to (t), and may be any known organic photoconductive compounds. They may be used as combination containing more than two kinds of compounds.

Any known organic and inorganic charge generating agents in the art of an electrophotographic material may be used as a charge generating agent in the photoconductive layer. Examples of the charge generating agents include selenium, selenium-tellurium, cadmium sulfide, zinc oxide, and organic pigments, for example, (1) Azo pigments such as monoazo, bisazo and triazo pigments described in U.S. Pat. Nos. 4,436,800, 4,439, 506, J. P. KOKAI Nos. Sho 47-37543, Sho 58-123541, Sho 58-192041, Sho 58-192042, Sho 58-219263, Sho 59-78356, Sho 60-179746, Sho 61-148453 and Sho 61-238063, J. P. KOKOKU No. Sho 60-5941 and No. Sho 60-45664;

(2) Phthalocyanine pigments such as nonmetallic or metallic phthalocyanines described in U.S. Pat. Nos. 3,397,086, 4,666,802, 4,666,802, J. P. KOKAI Nos. Sho 51-90827 and Sho 52-55643;

(3) Perylene pigments described in U.S. Pat. No. 3,371, 884, J. P. KOKAI Nos. Sho 47-30330;

(4) Indigo and thioindigo pigments described in British Patent No. 2237680, J. P. KOKAI No. Sho 47-30331;

(5) Chinacridon pigments described in British Patents No. 2237680, J. P. KOKAI No. Sho 47-30332;

(6) Polycyclic quinone pigments described in British Patents No. 22376789, J. P. KOKAI Nos. Sho 59-184348, Sho 62-28738 and Sho 47-18544;

(7) Bisbenzimidazol pigments described in J. P. KOKAI Nos. Sho 47-30331 and Sho 47-18543;

(8) Squarium pigments described in U.S. Pat. Nos. 4,396, 610 and 4,644,082.

(9) Azulenium pigments described in J. P. KOKAI Nos. Sho 59-53850 and Sho 61-21254.

The above mentioned pigments may be used solely or in combination which contains two or more of the pigments.

The ratio of the organic photoconductive compound to the binder depends on the compatibility of the photoconductive compound and the binder. Namely, the upper limit of an amount of the organic photoconductive compound depends on the compatibility of the photoconductive compound and the binder, and the excess of the organic photoconductive compound results in crystallization of the organic photoconductive compound. The more organic photoconductive compound is preferable provided that the organic photoconductive compound does not crystallize. The organic photoconductive compound may be contained in an amount of 5–120 parts by weight, preferably 10–100 parts by weight in 100 parts by weight of the binder. The organic photoconductive compound may be used solely, or as combination of two or more compounds mentioned above.

In the photoconductive layer of the present invention, other binder resins can be employed in addition to the polymer (P) and/or polymer particle (L). Such other resins may be any resins used in Known electrophotographic materials. Weight-average molecular weight thereof is $5\times10^3$~$1\times10^6$, preferably $2\times10^4$~$5\times10^5$. Glass transition temperature is −40° C.~200° C., preferably −10° C.~140° C.

Examples of the binder resin are described in the following references: Takaharu Shibata, Jiro Isiwatari, Polymer, 17, p. 278 (1968), Harumi Miyamoto, Hidehiko Takei, *Imaging*, 1973, (No. 8), Koich Nakamura, "Practical Techniques or Binder for Recording Materials", Chapter 10, C.H.C Co., Ltd., (1985), Electrophotographic Society of Japan, "Symposium for the Present Condition of Photosensitive Material for Electrophotograph", (1985); Hiroshi Kokado, "Recent Development and Utilization of Photoconductive Material and Photosensitive Material", published by Nihonkagakujoho Co., Ltd., (1986), D. Tatt, S. C. Heidecker, Tappi, 49, (No. 10), 439 (1966), E. S. Baltazzi, R. G. Blanclotte et al, Phot. Sci. Eng. 16, (No. 5), 354 (1972), Guen Chan Kei, Isamu Shimizu, Eiichi Inoue, Journal of Society of Electrophotographics of Japan, 18, (No. 2), 22, (1980).

Examples of the binder include: olefin polymer and copolymer, vinyl chloride copolymer, vinylidene chloride copolymer, alkanoic acid vinyl polymer and copolymer, alkanoic acid allyl polymer and copolymer, butadiene-unsaturated carboxylate copolymer, acrylonitrile copolymer, methacrylonitrile copolymer, styrene-acrylate copolymer, styrene-methacrylate copolymer, itaconic acid diester polymer and copolymer, maleic anhydrate copolymer, acrylamide copolymer, methacrylamide copolymer, hydroxy modified silicone resin, polycarbonate resin, ketone resin, polyester resin, silicone resin, amide resin, hydroxy- and carboxyl-modified polyester resin, butyral resin, polyvinylacetal resin, cyclized rubber-methacrylate copolymer, cyclized rubber-acrylic ester copolymer, copolymer having heterocycle which does not have a nitrogen atom (heterocicle may be furan, tetrahydrofuran, thiophene, dioxane, dioxofuran, lactone, benzofuran, benzothiophene and 1,3-dioxetane) and epoxy resins.

The thickness of the photoconductive layer may be 1–100μ, especially 10–50μ.

If the multilayer-type photosensitive material comprising a charge generating layer and a charge transporting layer are used, the thickness of the charge generating layer may be 0.01–5μ, preferably 0. 05–2μ, the thickness of the charge transporting layer may be 0.99 to 99.9μ, preferably 9–90μ. The order of the charge transporting layer and the charge generating layer depends whether the photosensitive material is charged negatively or positively.

If the photoconductive layer comprises the charge generating layer and the charge transporting layer, at least the layer which contacts with the transfer layer should contain the polymer (P) and/or the polymer particle (L).

Any sensitizing dyes can be used optionally to the electrophotographic material for color proofing of the present invention depending on kinds of light source for image exposure such as visible light or semiconductor laser beam. Examples of the sensitizing dyes include: carbonium dye, diphenylmethan dye, triphenylmethan dye, xanthene dye, phthalein dye, polymethine dye (such as oxonol dye, merocyanine cyanine dye, rodacyanine dye and styryl dye) and phthalocyanine dye which may include metallic atoms.

Examples of carbonium dyes, triphenylmethane dyes, xanthene dyes and phthalein dyes are described in J. P. KOKOKU No. Sho 51-452, J. P. KOKAI Nos. Sho 50-90334, Sho 50-114227, Sho 53-39130 and Sho 53-82353, U.S. Pat. Nos. 3,052,540 and 4,054,450, J. P. KOKAI No. Sho 57-16456.

Examples of polymethine dyes such as oxonol dyes, merocyanine dyes, cyanine dyes and rodacyanine dyes are described in U.S. Pat. Nos. 3,047,384, 3,110,591, 3,121,008, 3,125,447, 3,128,179, 3,132,942 and 3,622,317, British Patent Nos. 1226892, 1309274 and 14045893 and J. P. KOKOKU Nos. Sho 48-7814 and Sho 55-18892.

Examples of polymethine dyes which sensitize spectrally in near infrared or infrared region of wavelength of not less than 700 nm are described in J. P. KOKAI Nos. Sho 47-840 and Sho 47-44180, J. P. KOKOKU Nos. Sho 51-41061, Sho 49-5034, Sho 49-45122, Sho 57-46245, Sho 56-35141, Sho 57-157254, Sho 61-26044 and Sho 61-27551, U.S. Pat. Nos. 3,619,154 and 4,175,956 and "Research Disclosure", 1982, 216, 117–118.

The electrophotographic material of the present invention is advantageous also for that the features thereof is hard to be changed depending on sensitizing dyes used.

Further, conventionally known additives for electrophotographic materials may optionally be used in the electrophotographic material of the present invention.

Additives include, for example, a chemical sensitizer, a plasticizer for improving film performance, or a surfactant.

Examples of chemical sensitizers include: an electron attractive compound such as halogens, benzoquinone, chloranyl, fluoranyl, bromanyl, dinitrobenzene, anthraquinone, 2,5-dichloro benzoquinone, nitrophenol, tetrachlorophthallic anhydride, 2,3-dichloro-5,6-dicyanobenzoquinone, dinitrofluorenone, trinitrofluorenone, tetracyanoethylene, polyarylalkane compounds, hindered phenol compounds, p-phenylenediamine compounds described in the following references: Hiroshi Komon, "The Latest Development and Utilization of Photoconductive Materials and Photosensitive Materials", chapter 4 to 6; Publishing department of Nihonkagakujouhou Co., Ltd., (1986) and compounds described in J. P. KOKAI Nos. Sho 58-65439, Sho 58-102239, Sho 129439 and Sho 62-71965.

Examples of a plasticizer which can be added in order to improve plasticity of the photoconductive layer include: dimethylphthalate, dibutylphthalate, dioctylphthalate, triphenylphthalate, triphenylphosphate, diisobutyladipate, dimethylsebacate, dibutylsebacate, butyl laurate, methylphtharylethylglycolate and dimethylglycolphthalate. The plasticizer may be added in amount so that static features may not be affected adversly.

The above mentioned additives are added in an amount of 0.001–2.0 parts by weight in 100 parts by weight of a photoconductive layer.

The photoconductive material is ground, and dispersed to a system comprising a binder, a solvent thereof and an additive by well known method in the art. For example, it is ground and dispersed in the system with the apparatus such as a ball mill, a Kady mill, a sand mill, a DYNO-MILL®, a paint shaker, a roll mill and an ultrasonic dispersion apparatus described in Solomon, "Chemistry of Paint", etc.

Then, they are coated to the substrate, for example, with a barcoater, a reversecoater, or Die coater in suitable coating amount for each imaging material system, and dried. The polymer (P) and the polymer particle (L) may be used together with other binder without any complicated operations.

Solvents used for dispersing the photoconductive material may be any solvents which may be determined in light with solubility of the binder. They may be used solely or in combination containing two or more solvents.

The photoconductive layer may be applied on known substrate. Generally, a substrate for an electrophotographic photosensitive layer is preferably photoconductive. Examples for a photoconductive substitute include: a substitute made of metal, paper, or plastic which is treated so as to get conductivity, for example, by being impregnated with low insulation resistivity; a substrate wherein conductivity is imparted to the reverse side (the opposite side to the side on which the photosensitive layer is applied), and at least one coating is applied, for example, in order to inhibit curling; a substrate wherein a water proof adhesive layer is applied on the surface thereof; a substrate wherein at least one precoat layer is optionally applied on the latter substrate; and a substitute which is a paper laminated by plastics with conductivity on which a material such as aluminium has been vapor-deposited.

Examples of a conductive substrate or a substrate to which conductivity is imparted are described in the following references: Yukio Sakamoto, Electrophotographics, 14, (No. 1), pages 2–11, (1975); Chemistry of special papers, Polymer Publishers (1975); M. F. Hoover, J. Macromol. Sci. Chem. A-4 (6), 1327–1417 (1970).

The transfer layer will hereunder be illustrated.

The transfer layer comprises a thermoplastic resin with weight-average molecular weight of $5\times10^3$ to $1\times10^6$, preferably $5\times10^4$ to $5\times10^5$, and with grass transition temperature of 0° C. to 100° C., preferably 20° to 85° C. Thermoplastic resin is used in an amount of not less than 70% by weight, preferably not less than 90% by weight of the transfer layer.

Examples of the thermoplastic resin include: vinyl chloride resin, polyolefin resin, olefin-styrene copolymer, alkanoic acid vinyl resin, polyester resin, polyether resin, acrylic resin, cellulose resin, aliphatic acid modified cellulose resin.

They are described in, for example, the following references: Nikkankogyoshinbunsha, "Plastic Material Recture", 1 to 18, (1961); Vinylic department of Kinkikagakukyokai, "Polyvinylchloride", published by Nikkankogyoshinbunsha, (1988); Eizo Omori, "Functionality of Acrylic resin", published by Technosystem, (1985); Eiichiro Takiyama, "Polyester Resin Handbook", published by Nikkankogyoshinbunsha, (1988); Kazuo Yumoto, "Saturated Polyester Resin Handbook", published by Nikkankogyoshinbunsha, (1989); Polymer Society of Japan, "Polymer Data Handbook", Chapter 1, published by Baifukan, (1986); Yuji Harazaki, "The latest handbook of binder technology", Chapter 2, published by Sogogijutu center (1985).

The thermoplastic resins may be used solely or as combination of two or more thereof.

The transfer layer may include other additives in order to improve physical properties such as coating properties, film-forming property and strength of coating. Examples of additives include a plasticizer such as mentioned above for the photoconductive layer.

The thickness of the transfer layer is 0.1–10 μm, preferably 0.5 to 5 μm.

The transfer layer may be applied, for example, by a customary coating method. For example, it is conducted using a coating solution containing an appropriate compound such as one mentioned above and a method such as one for coating of the photoconductive layer. In addition, the transfer layer may be applied by a spray drying method which is known in the art. The above coating methods of the transfer layer are not limitative.

The method for preparing a color proof using the electrophotographic material for color proofing of the present invention is as follows. First of all, an image to be reproduced is formed on the light-sensitive material by a conventional electrophotographic process. Namely, charging, image exposure, development and fixing are conducted by well known methods in the art. Any type of developer such as a dry developer and a liquid developer may be used.

Examples of the method are described in, for example, Gen Machida, "Recording Material and Photosensitive Resin", p. 107–127, (1983); and Gakkaishuppan center Co., Ltd., Imaging, No. 2–5, "Development.Fixing.Charging.Trasfer in Electrophotography".

A combination of a scanning exposure method wherein an exposure is conducted based on a digital information using a laser beam and a developing method using a liquid developer is effective, since it can form a highly precise image.

One of examples will hereunder be described. The electrophotographic material is positioned on a flat bed by a resister pin method, and is sucked from the backside to be fixed. Charging is conducted with a charging device such as one described in the following literature: Electrophotographic Society of Japan, "Fundamentals and Applications of Electrophotographic Technique", p. 212 et seq., published by Korona Co., Ltd., in Jun. 15, 1963. Corotron or Scorotron method is generally used. It is also preferable to controll the charging condition by feedback based on data from means for detecting charging potential, so that the surface potential may be in an appropriate range.

And then, scanning exposure by laser beams is conducted in accordance with the manner described in p. 254 et seq. of the above mentioned literature. First of all, the electrophotographic material is exposed using a dot pattern converted from image for yellow of four color separations.

Subsequently, a toner-development is conducted with a liquid developer. Namely, the charged and exposed material is removed from the flat bed, and developed by direct liquid development described in p. 275 et seq. of the above mentioned literature. The exposure mode corresponds to toner development mode. For example, a negative exposure is conducted for a reversal development. Namely, an image area is exposed by laser beams, and a development bias voltage is applied thereto so that a toner may be adsorbed on an image area. The toner should have the same charging polarity as one of the imaging material on charging. The detailed infromation is described in p. 157 et seq. of the above mentioned literature.

In order to remove the excess developer after development, the electrophotographic material are squeezed and dried. It is also preferable to rinse the material with a liquid carrier for the developer.

The above procedures are repeated for each color, namely magenta, cyan, black to form an image with 4 colors on the electrophotographic material.

The toner image is heat-transfered to the regular paper for printing together with the transfer layer to form a color proof.

FIG. 1 shows an apparatus for heat-transfer of a transfer layer to a regular paper. The electrophotographic material is conveyed with appropriate nip pressure between a pair of rubber-coated metallic rollers equipped with a built-in heating means. Temperature on the surface of the rollers may be 50°–150° C., preferably 80°–120° C. Nip pressure between the rollers may be 0.2–20 kgf/$cm^2$, preferably 0.5–10 kgf/$cm^2$. Conveyance speed may be 0.1–100 mm/sec., preferably 1–30 mm/sec. The optimum values may be selected depending on the kind of the electrophotographic materials, namely the physical properties of the transfer layer, the photoconductive layer and the substrate.

It is preferable to keep the temperature on the surface of the rollers in a range defined above by known means. A means for preheating and/or cooling can be set in front of the heat rollers. Springs or air cylinders which use compressed air as means for pressing (which is not shown in FIG. 1) may also be set on the both ends of an axis of at least one of rollers.

As described above, the addition of the polymer (P) and/or the polymer particle (L) to the photoconductive layer can improve releasability of the photoconductive layer from the transfer layer. As a result, a color proof of high quality without color drift and defect in transfer can be obtained.

Examples of the present invention will hereunder be described in more detail, but they do not limit the present invention.

In the formulae in the examples, the symbol "—b—" represents that two block segments illustrated on both sides of the symbol are present in the form of blocks to form a block copolymer. Namely, a copolymer represented by the formula including the symbol "—b—" is not a random copolymer, but a block copolymer.

(Preparation Examples of The Polymer (P))

EXAMPLE P-1

A solution of 80 g of methyl methacrylate, 20 g of a macromonomer of dimethylsiloxane FM0725 (Mw $1\times10^4$, manufactured by CHISSO CORPORATION), and 200 g of toluene was heated to 75° C. in a stream of nitrogen. 1.0 g of azobisisobutylonytril (A.I.B.N) was added thereto, and reacted for 4 hours. Then, 0.7 g of A.I.B.N was further added thereto, and reacted for 4 hours. Weight-average molecular weight (Mw) of the resultant polymer (Polymer (P-1)) was $5.8\times10^4$ (which was measured by G.P.C. method).

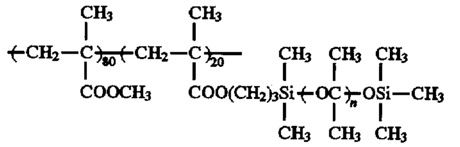

(P-1)

EXAMPLES P-2–P-9

The procedures of Example P-1 were repeated except that monomers corresponding to units listed in Table 1 were substituted for methyl methacrylate and FM-0725. Mw of each of resultant polymers (Polymers (P-2)–(P-9)) was in the range of $4.5\times10^4$ to $6\times10^4$.

TABLE 1

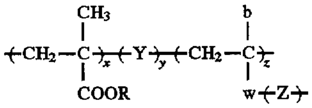

| Example | [P] | —R | —Y— | b | —w— | —z— | x/y/z ratio by weight |
|---|---|---|---|---|---|---|---|
| P-2 | P-2 | $-C_2H_5$ | — | $-CH_3$ | $-COO(CH_2)_2S-$ | 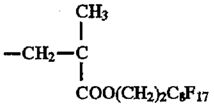 | 80/0/20 |
| P-3 | P-3 | $-CH_3$ | 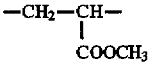 | —H | 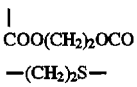 | 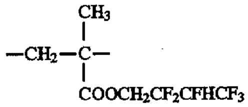 | 60/10/30 |
| P-4 | P-4 | $-CH_3$ | 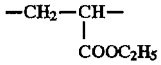 | $-CH_3$ | 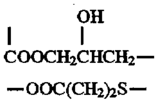 | 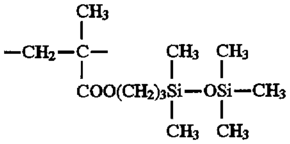 | 65/10/25 |
| P-5 | P-5 | $-C_3H_7$ | 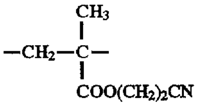 | " | " | 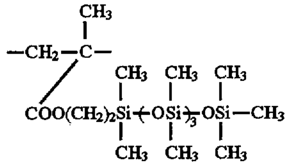 | 70/10/20 |
| P-6 | P-6 | $-CH_3$ | — | " | " | 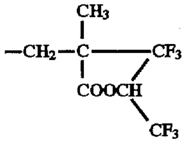 | 70/0/30 |
| P-7 | P-7 | $-C_2H_5$ | — | —H | $-CONH(CH_2)_2S-$ |  | 60/0/40 |
| P-8 | P-8 | $-CH_3$ | 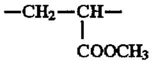 | —H | 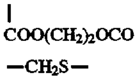 | 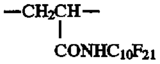 | 70/15/15 |
| P-9 | P-9 | $-C_2H_5$ | — | $-CH_3$ | " | 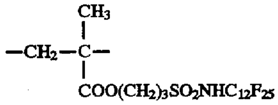 | 80/0/20 |

EXAMPLE P-10

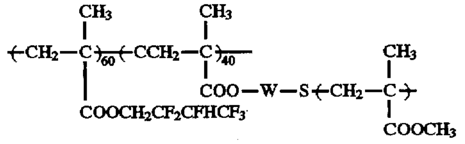

(P-10)

—W—: an organic group

A solution of 60 g of 2,2,3,4,4-hexafluorobutylmethacrylate, 40 g of a macromonomer of methylmethacrylate AA-6 (Mw $1\times10^4$, manufactured by Toagosei Chemical Industry Co., Ltd.), and 200 g of benzotrifluoride was heated to 75° C. in a stream of nitrogen. 1.0 g of azobisisobutylonytril (A.I.B.N) was added thereto, and reacted for 4 hours. Then, 0.5 g of A.I.B.N was further added thereto, and reacted for 4 hours. Weight-average molecular weight (Mw) of resultant polymer (Polymer (P-10)) was $6.5\times10^4$.

EXAMPLES P-11–P-22

The procedures of Example P-10 were repeated except that monomers corresponding to units listed in Table 2 were substituted for 2,2,3,4,4-hexafluorobutylmethacrylate and the macromonomer of methylmethacrylate AA-6. Mw of each of resultant polymers (Polymers (P-11)–(P-22)) was in the range of $4.5\times10^4$ to $6.5\times10^4$.

TABLE 2
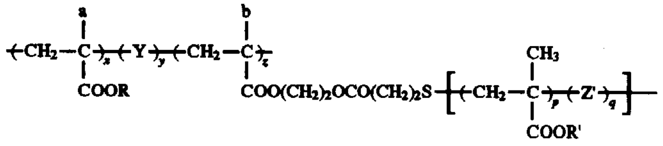
| Example | [P] | a | −R | −Y− | b | −R' | −z'− | x/y/z ratio by weight | p/q ratio by weight |
|---|---|---|---|---|---|---|---|---|---|
| P-11 | P-11 | $-CH_3$ | $-(CH_2)_2C_nF_{2n+1}$ n = 8~10 | — | $-CH_3$ | $-CH_3$ | 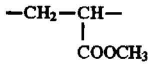 | 70/0/30 | 66/34 |
| P-12 | P-12 | $-CH_3$ | $-(CH_2)_2CF_2CFHCF_3$ | — | $-H$ | $-CH_3$ | 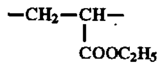 | 60/0/40 | 75/25 |
| P-13 | P-13 | $-CH_3$ | $-CH_2CF_2CF_2H$ | 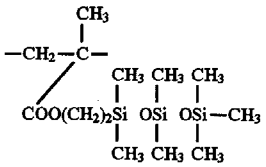 | $-CH_3$ | — | 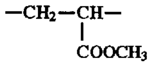 | 40/30/30 | 0/100 |
| P-14 | P-14 | $-H$ | $-CH_2CF_2CFHCF_3$ | 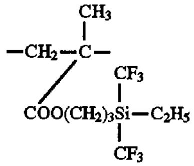 | $-CH_3$ | $-C_2H_5$ | — | 30/45/25 | 100/0 |
| P-15 | P-15 | $-CH_3$ | 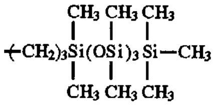 | — | $-CH_3$ | $-C_2H_5$ | 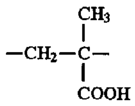 | 80/0/20 | 95/5 |
| P-16 | P-16 | $-CH_3$ | 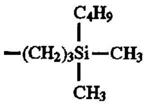 | — | $-CH_3$ | $-CH_3$ | 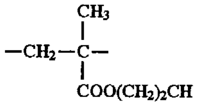 | 70/0/30 | 92/8 |
| P-17 | P-17 | $-H$ | $-(CH_2)_2C_{10}F_{21}$ | — | $-CH_3$ | $-C_2H_5$ | — | 60/0/40 | 100/0 |

TABLE 2-continued
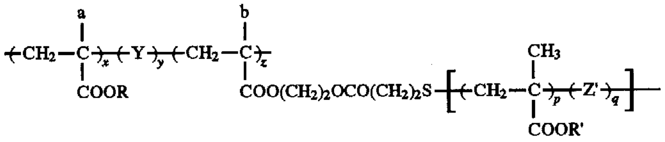
| Example | [P] | a | −R | −Y− | b | −R' | −z'− | x/y/z ratio by weight | p/q ratio by weight |
|---|---|---|---|---|---|---|---|---|---|
| P-18 | P-18 | $-CH_3$ | $-(CH_2)_2SO_2NHC_{10}F_{21}$ |  | −H | $-C_4H_9$ | — | 40/25/35 | 100/0 |
| P-19 | P-19 | — | — | 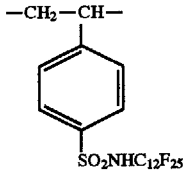 | $-CH_3$ | $-C_2H_5$ | 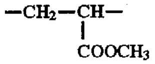 | 0/60/40 | 90/10 |
| P-20 | P-20 | $-CH_3$ | 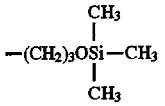 | 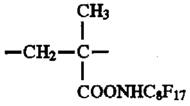 | $-CH_3$ | $-CH_3$ | " | 25/40/35 | 75/25 |
| P-21 | P-21 | $-CH_3$ | $-(CH_2)_2OCOC_7F_{15}$ | — | $-CH_3$ | $-C_2H_5$ | 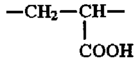 | 60/0/40 | 92/8 |
| P-22 | P-22 | −H | $-(CH_2)_2CONHC_{11}F_{23}$ | 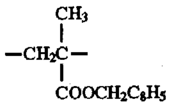 | $-CH_3$ | $-CH_2C_6H_5$ | 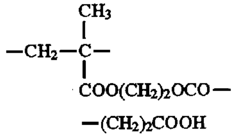 | 40/20/40 | 90/10 |

EXAMPLE P-23

A solution of 67 g of methyl methacrylate, 22 g of methyl acrylate, and 200 g of toluene was heated to 80° C. in a stream of nitrogen. 10 g of polymer azobisinitiator (PI-1) of the following formula was added thereto, and reacted for 8 hours. After the reaction was compreted, the reaction mixture was streamed in 1.5 l of methanol. Then, the resultant precipitate was collected, and dried. 75 g of Polymer (P-23) was obtained (Mw: $3\times10^4$).

methyl and 200 g of methylene chloride was heated to 30° C. in a stream of nitrogen. The resultant reaction mixture was irradiated with light from 300 W-xenon lamp through a glass filter from the distance of 25 cm, and reacted for 20 hours. Then, 25 g of the monomer (M-2) of the following formula was added thereto, and the reaction mixture was irradiated for 12 hours in the same manner as explained above. Then, 3 g of methanol was added to the reaction mixture. The reaction mixture was stirred for 30 minutes, and the reaction was ceased. The resultant reaction mixture

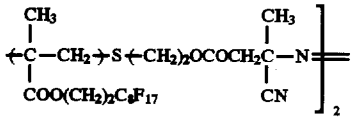

(PI-1)

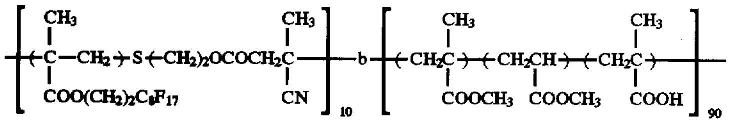

(P-23)

EXAMPLE P-24

A solution of 70 g of methyl methacrylate and 200 g of tetrahydrofuran was degassed sufficiently in a stream of nitrogen, and then cooled to −20° C. 0.8 g of 1,1-diphenyl butyl lithium was added thereto, and reacted for 12 hours. Then, a solution of 30 g of the monomer (M-1) of the formule:

$$CH_2{=}C(CH_3)(COO(CH_2)_2C_8H_{17}) \quad \text{(M-1)}$$

and 60 g of tetrahydrofuran which had been degassed sufficiently in a stream of nitrogen was added thereto, and reacted for 8 hours. The resultant reaction mixture was cooled to 0° C. Then, 10 ml of methanol was added, and reacted for 30 minutes. Then, the polymerization was ceased. The resultant polymer solution was stirred to 30° C., was re-precipitated in 1.5 l of methanol, and the precipitate was collected and dried. 78 g of Polymer (P-25) was obtained (Mw: $7\times10^4$).

(M-2):

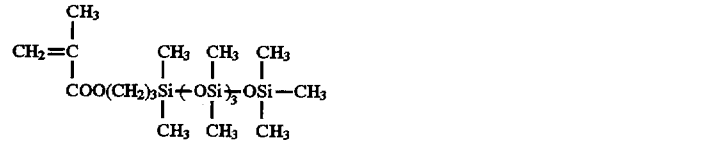

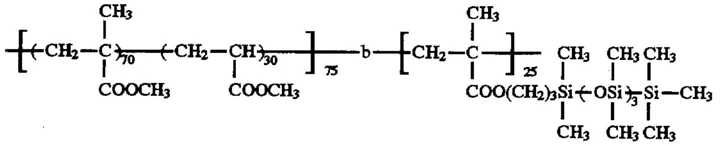

[P-25]

then 3 ml of 30% ethanol solution of hydrogen chloride was added, and stirred for 1 hour. Then, the reaction mixture was evaporated to half amount thereof under reduced pressure, reprecipitated in 1 l of petroleum ether. The resultant precipitation was collected, and dried under reduced pressure. 76 g of Polymer (P-24) was obtained (Mw: $6.8\times10^4$).

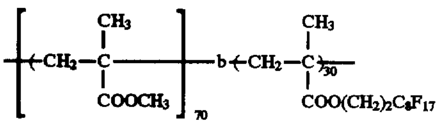

[P-24]

EXAMPLE P-25

A solution of 52.5 g of methyl methacrylate, 22.5 g of methylacrylate, 0.5 g of (tetraphenylporphinato)alminium

EXAMPLE P-26

A mixture of 60 g of ethyl methacrylate and 4.8 g of benzyl N,N-diethyl dithiocarbamate was fed to a vessel, sealed, heated to 50° C., and then, irradiated with light from 400 W-high pressure mercury vapor lamp through a glass filter from the distance of 10 cm for 6 hours to be photopolymerized. 40 g of the monomer (M-3) was added to the solution of resultant reaction mixuture in 100 g of tetrahydrofuran. The vessel was purged with nitrogen, and the radiation was conducted again for 10 hours. The resultant reaction mixture was reprecipitated in 1 l of methanol, and the precipitation was reprecipitated, collected and dried. 73 g of Polymer (P-26) was obtained (Mw: $4.8\times10^4$).

(M-3):
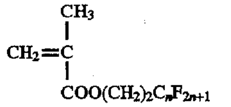
(n = an integer of 8 to 10)

[P-26]
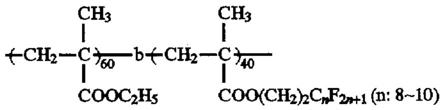

EXAMPLE P-27

A mixture of 50 g of methyl methacrylate, 25 g of ethyl methacrylate and 1.0 g of benzyl santate was fed to a vessel in a stream of nitrogen, sealed, heated to 50° C., and then, irradiated with light from 400 W-high pressure mercury vapor lamp through a glass filter from the distance of 10 cm for 6 hours to be photopolymerized. 25 g of the above mentioned monomer (M-1) was added to 40% solution of the resultant reaction mixuture in tetrahydrofuran. The vessel was purged with nitrogen, and the radiation was conducted for 10 hours. The resultant reaction mixture was reprecipitated in 2 l of methanol, and the precipitation was collected and dried. 63 g of Polymer (P-27) was obtained (Mw: $6\times10^4$).

(P-27)
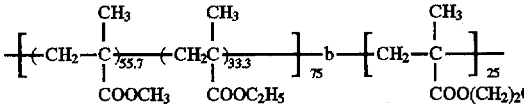

EXAMPLES P-28–P-34

Polymers (P-28)–(P-34) listed in Table 3 were prepared in a similar manner to the method of Example P-26. Mw of each of resultant polymers was in the range of $3.5\times10^4$ to $6\times10^4$.

TABLE 3

| Example | [P] | A B Type Block Copolymer (ratio by weight) |
|---|---|---|
| P-28 | P-28 | 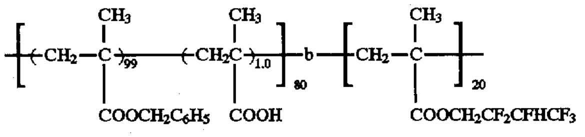 |
| P-29 | P-29 | 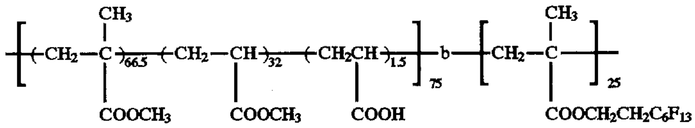 |
| P-30 | P-30 | 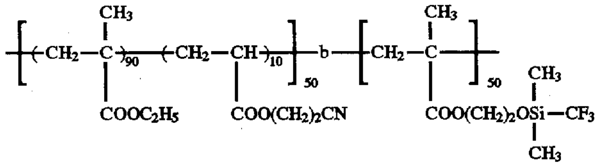 |
| P-31 | P-31 | 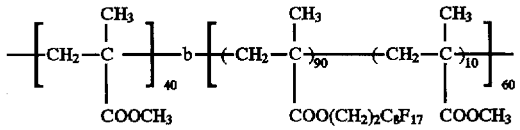 |
| P-32 | P-32 | 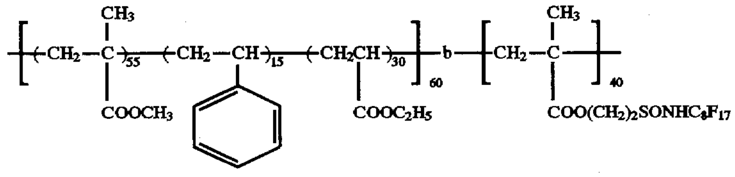 |
| P-33 | P-33 | 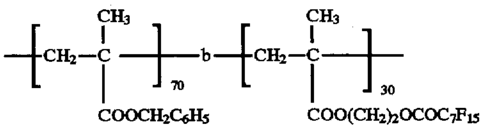 |

TABLE 3-continued

| Example | [P] | A B Type Block Copolymer (ratio by weight) |
| --- | --- | --- |
| P-34 | P-34 | 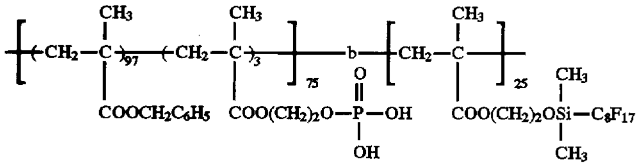 |

EXAMPLE P-35

The procedures of Example P-26 were repeated except that 18 g of the initiator (I-1) of the following formula was substituted for benzyl N,N-diethyldithocarbamate. Polymer (P-35) with Mw of $4.5\times10^4$ was obtained.

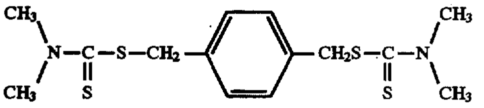
(I-1)

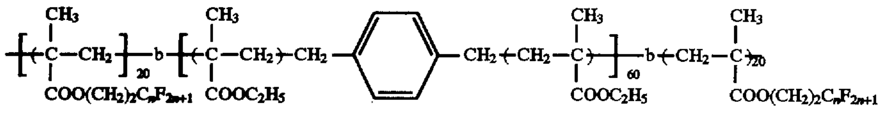
(P-35)

n = an integer of 8-10

EXAMPLE P-36

The procedures of Example P-27 were repeated except that 2.5 g of the initiator of the following formula was substituted for benzyl isopropylsantate. Polymer (P-36) with Mw of $7.2\times10^4$ was obtained.

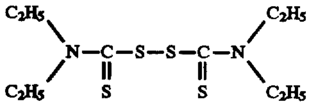
(Initiator)

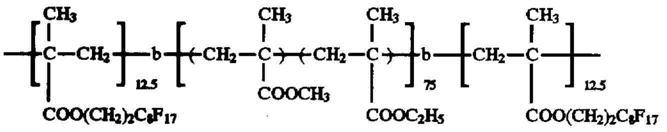
(P-36)

EXAMPLE P-37

A mixture of 67 g of methyl methacrylate, 32 g of methyl acrylate, 1 g of acrylate, 17.5 g of the initiator (I-2) of the following formula, and 150 g of tetrahydrofuran was heated to 50° C. in a stream of nitrogen. The resultant reaction mixture was irradiated with light from 400 W-high pressure mercury vapor lamp through a glass filter from the distance of 10 cm for 10 hours to be photopolymerized. The resultant reaction mixuture was re-precipitated in 1 l of methanol, and the precipitate was collected and dried. 72 g of polymer with Mw of $6\times10^4$ was obtained.

70 g of the polymer, 30 g of the monomer (M-2), and 100 g of tetrahydrofuran was heated to 50° C. in a stream of nitrogen. The resultant reaction mixture was irradiated for 13 hours in the above mentioned manner. The resultant reaction mixuture was reprecipitated in 1.5 l of methanol, and the precipitate was collected and dried. 78 g of polymer (P-37) with Mw of $6\times10^4$ was obtained.

EXAMPLES P-38–P-48
The procedures of Example P-37 were repeated except that 0.031 mole of the initiators listed in Table 4 were substituted for 17.5 g of the initiator (I-2) of the following formula. Mw of each of resultant polymers (Polymers (P-38) –(P-48)) was in the range of $4\times10^4$ to $6\times10^4$.
(I-2)
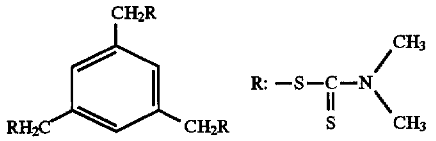
(P-37)
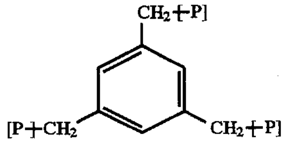
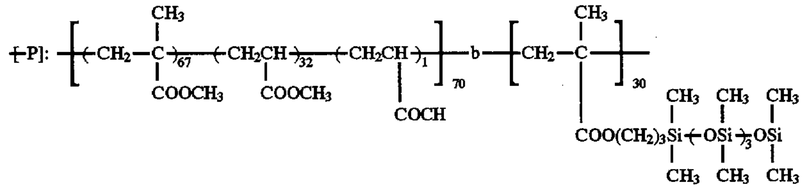

TABLE 4
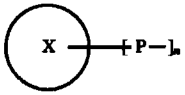
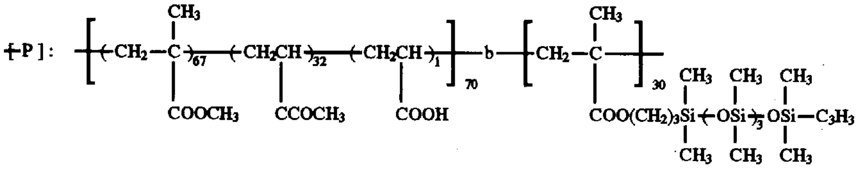
| Example | [P] | Initiator | —R | 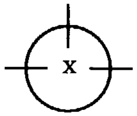 |
|---|---|---|---|---|
| P-38 | P-38 | 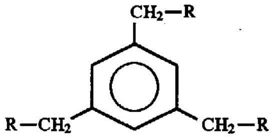 | 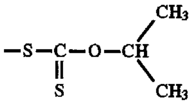 | 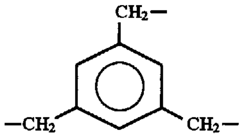 |
| P-39 | P-39 | 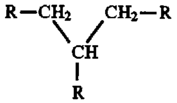 | 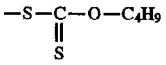 | 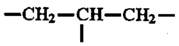 |
| P-40 | P-40 | 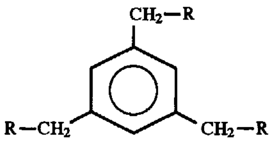 | 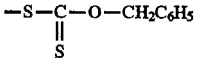 | 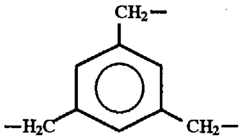 |
| P-41 | P-41 | 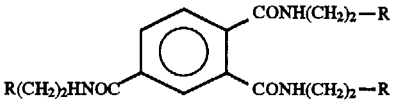 | 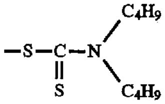 | 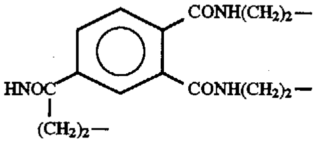 |

TABLE 4-continued
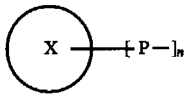
[P]: 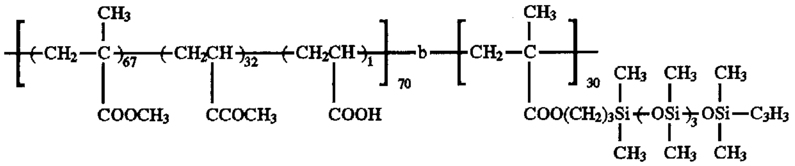
| Example | [P] | Initiator | —R | 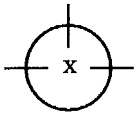 |
|---|---|---|---|---|
| P-42 | P-42 | 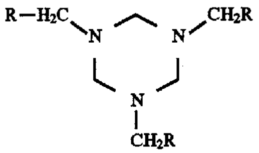 | 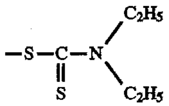 | 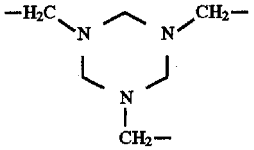 |
| P-43 | P-43 | 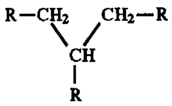 | 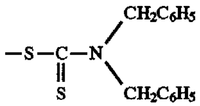 | 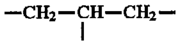 |
| P-44 | P-44 | 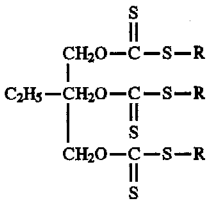 | $-CH_2C_6H_5$ | 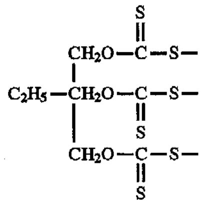 |
| P-45 | P-45 | 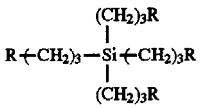 | 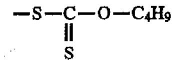 | 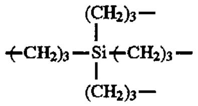 |

TABLE 4-continued
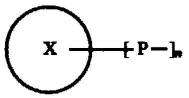
-[P]: 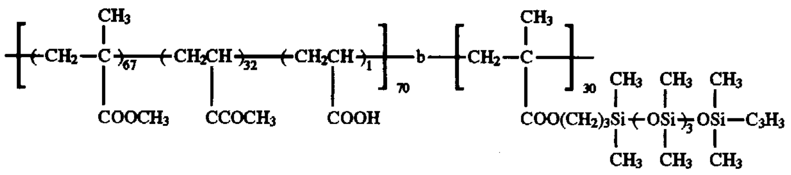
| Example | [P] | Initiator | -R | 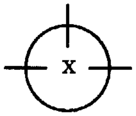 |
|---|---|---|---|---|
| P-46 | P-46 | 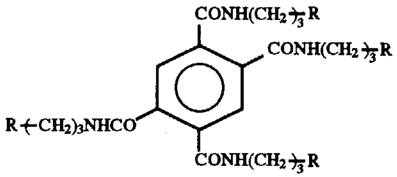 | 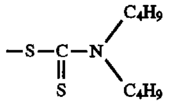 | 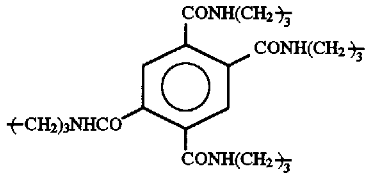 |
| P-47 | P-47 | 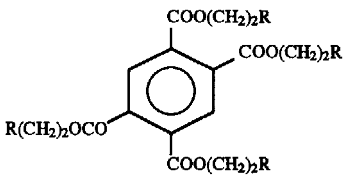 | 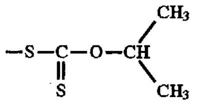 | 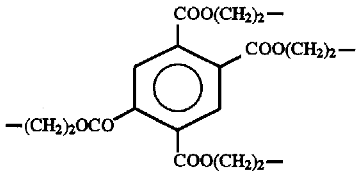 |
| P-48 | P-48 | 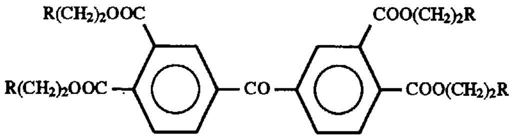 | 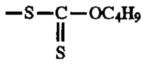 | 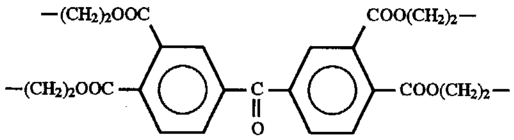 |

(Preparation Examples of Polymer particle (L))

EXAMPLE L-1

A mixture of 40 g of the monomer (LM-1) of the following formula, 2 g of ethyleneglycoldimethacrylate, 4.0 g of the polymer for stabilizing dispersion (LP-1) of the following formula, and 180 g of methyl ethyl ketone was heated to 60° C. in a stream of nitrogen with stirring. 0.3 g of 2,2'-azobis(isovalelonytril)(A.I.V.N) was added thereto, and reacted for 3 hours. 0.1 g of A.I.V.N was further added and reacted for 4 hours. After cooling, a white dispersoid was obtained through a nylon cloth with 100 mesh, which was latex with particle size of 0.25 μm (which was measured by CAPA-500 manufactured by Horiba, Ltd.).

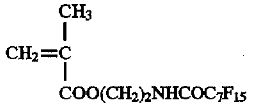
(LM-1)

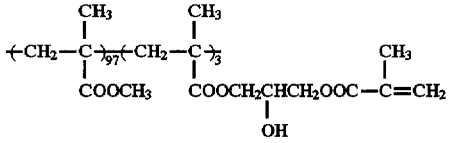
(LP-1)

(The ratio by weight)
Mw 3 × 10[4]

EXAMPLE L-2

A mixture of 5 g of a polymer for stabilizing dispersion AB-6 (a one-functional macromonomer consisting of butyl acrylate monomer units which is manufactured by Toagosei Chemical Industry Co., Ltd.), and 140 g of methyl ethyl ketone was heated to 60° C. in a stream of nitrogen with stirring. A solution of 40 g of the monomer (LM-2) of the following formula:

$$CH_2{=}CH(CONHC_6F_{13}) \qquad \text{(LM-2),}$$

1.5 g of ethyleneglycoldiacrylate, 0.2 g of A.I.V.N., and 40 g of methyl ethyl ketone was dropped thereto for one hour. After continuing the reaction for 2 hours, 0.1 g of A.I.V.N. was added, and reacted for 3 hours to obtain a white dispersion. After cooling, the resultant dispersion was passed through a nylon cloth with 200 mesh to obtain the dispersoid with average particle size of 0.35 μm.

EXAMPLES L-3–L-11

The procedures of Example 11 were repeated except that compounds listed in Table 5 were substituted for the monomer (LM-1), ethyleneglycoldimethacrylate, and methyl ethyl ketone. Polymers (L-3) to (L-11)) with the average particle size of 0.15 to 0.30 μm were obtained.

TABLE 5

| Example | [L] | Monomer (LM) | Polyfunctional Monomer for Crosslinking | Solvent |
|---|---|---|---|---|
| L-3 | L-3 | 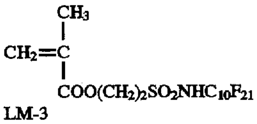 LM-3 | Ethylene glycol dimethacrylate 2.5 g | Methyl ethyl ketone |
| L-4 | L-4 | 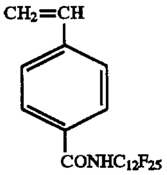 LM-4 | Divinylbenzene 3 g | Methyl ethyl ketone |
| L-5 | L-5 |  LM-5 | — | Methyl ethyl ketone |
| L-6 | L-6 | 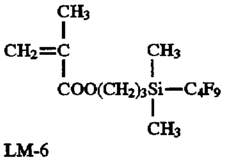 LM-6 | Diethylene glycol diacrylate 5 g | n-Hexane |

TABLE 5-continued

| Example | [L] | Monomer (LM) | Polyfunctional Monomer for Crosslinking | Solvent |
|---|---|---|---|---|
| L-7 | L-7 | 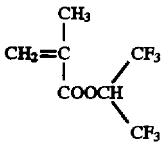 LM-7 | Ethylene glycol dimethacrylate 3.5 g | n-Hexane |
| L-8 | L-8 |  LM-8 | Trimethyrol propane trimethacrylate 4 g | Methyl ethyl ketone |
| L-9 | L-9 | 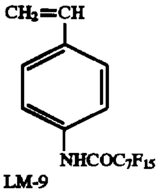 LM-9 | Trivinyl benzene 3.3 g | Ethyl acetate-n-hexane (ratio by weight = 4/1) |
| L-10 | L-10 | 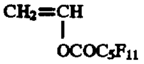 LM-10 | Divinyl glutaconate 4 g | Ethyl acetate-n-hexane (ratio by weight = 2/1) |
| L-11 | L-11 | 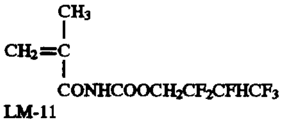 LM-11 | Propylene glycol diacrylate 3 g | Methyl ethyl ketone |

EXAMPLES L-12–L-17

The procedures of Example L-2 were repeated except that polymers (LP) listed in Table 6 were substituted for 5 g of the polymer AB-6 for dispersion stabilization. Polymers (L-12) to (L-17)) with the average particle size of 0.10~0.25 μm were obtained.

TABLE 6

| Example | [L] | Polymer for stabilizing of dispersion (LP) |
|---|---|---|
| L-12 | L-12 | 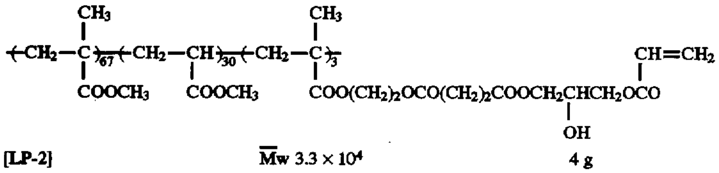 [LP-2] $\overline{Mw}$ $3.3 \times 10^4$ 4 g |
| L-13 | L-13 | 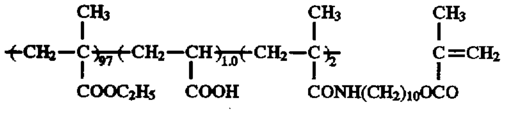 [LP-3] $\overline{Mw}$ $2.5 \times 10^4$ 2 g |

TABLE 6-continued

| Example | [L] | Polymer for stabilizing of dispersion (LP) |
|---|---|---|
| L-14 | L-14 | 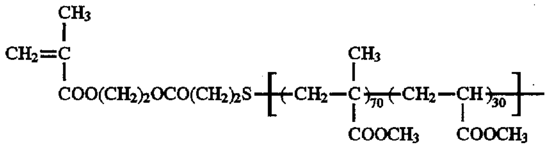 [LP-4] $\overline{Mw}$ $8 \times 10^3$ 6 g |
| L-15 | L-15 | 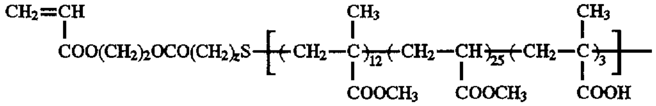 [LP-5] $\overline{Mw}$ $1 \times 10^4$ 6 g |
| L-16 | L-16 | 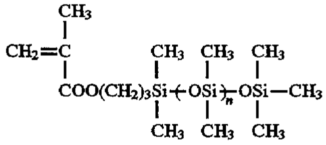 [LP-6] $\overline{Mw}$ $1 \times 10^4$ 4 g |
| L-17 | L-17 | 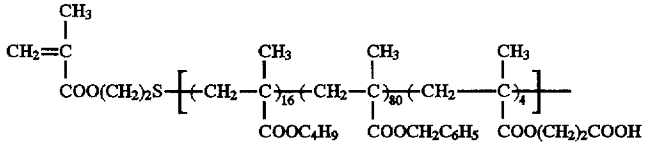 [LP-7] $\overline{Mw}$ $6 \times 10^3$ 5 g |

EXAMPLES L-18–L-23

The procedures of Example L-2 were repeated except that monomers listed in Table 7 were substituted for 40 g of the monomer (LM-2), and 6 g of the polymer of the following formula (LP-8) were substituted for 5 g of the dispersion stabilizing resin AB-6. Polymers (L-18) to (L-23)) with the average particle size of 0.05~0.20 μm were obtained.

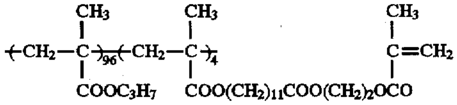 (LP-8)

$\overline{Mw}$ $3 \times 10^4$

TABLE 7

| Example | [L] | Monomer (LM) | Other Monomers |
|---|---|---|---|
| L-18 | L-18 | 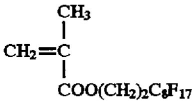 LM-12 30 g | 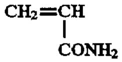 10 g |

TABLE 7-continued

| Example | [L] | Monomer (LM) | Other Monomers |
|---|---|---|---|
| L-19 | L-19 | 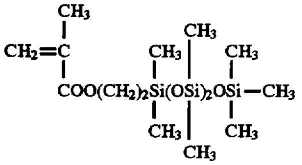 LM-13 25 g | 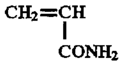 15 g |
| L-20 | L-20 | 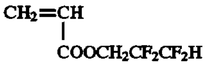 LM-14 20 g | Acrylonitrile 20 g |
| L-21 | L-21 | 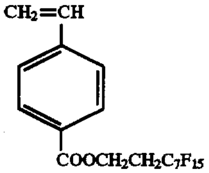 LM-15 25 g | styrene 15 g |
| L-22 | L-22 | 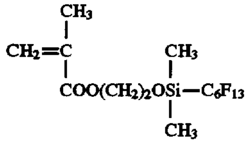 LM-16 20 g | Methyl methacrylate 20 g |
| L-23 | L-23 | 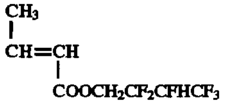 LM-17 20 g | Vinyl acetate 20 g |

EXAMPLE P-101

A solution of 70 g of methyl methacrylate, 20 g of methylacrylate, 10 g of glycidyl methacrylate and 200 g of toluene was heated to 80° C. in a stream of nitrogen. 10 g of polymer azobis initiator (PI-101) of the following formula was added thereto, and reacted for 8 hours. After the reaction was completed, the reaction mixture was reprecipitated in 1.5 l of methanol. Then, the resultant precipitate was collected, and dried. 75 g of Poymer (P-101) was obtained (Mw: $3\times10^4$).

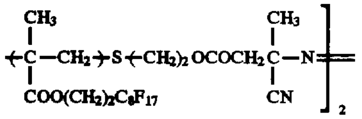

(PI-101)

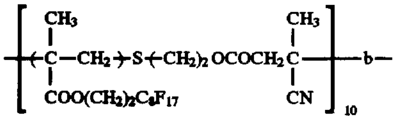

(P-101)

-continued

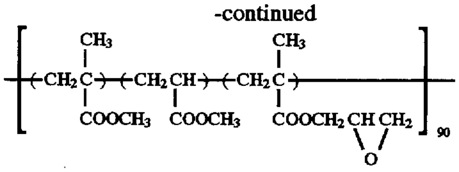

EXAMPLE P-102

A solution of 63 g of methyl methacrylate, 12.8 g of tri(dipropyl)silylmethacrylate and 200 g of tetrahydrofuran was degassed sufficiently in a stream of nitrogen, and then cooled to −20° C. 0.8 g of 1,1-diphenyl butyl lithium was added thereto, and reacted for 12 hours. Then, a solution of 30 g of the monomer (M-101) of the formula:

$$CH_2{=}C(CH_3)(COO(CH_2)_2C_8H_{17}) \quad \text{(M-101)}$$

and 60 g of tetrahydrofuran which had been degassed sufficiently in stream of nitrogen was added thereto, and reacted for 8 hours. The resultant reaction mixture was cooled to 0° C. Then, 10 ml of methanol was added, and reacted for 30 minutes. Then, the polymerization was ceased, and the silyl ester was deblocked. The resultant polymer solution was stirred to 30° C., then 3 ml of 30% ethanol solution of hydrogen chloride was added, and stirred for 1 hour. Then, the reaction mixture was evaporated to half amount under reduced pressure, reprecipitated in 1 l of petroleum ether. The resultant precipitation was collected, and dried under reduced pressure. 76 g of Poymer (P-102) was obtained (Mw: $6.8\times10^4$).

(P-102)

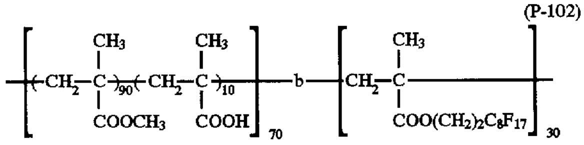

EXAMPLE P-103

A solution of 63.8 g of methyl methacrylate, 19.7 g of 2-(trifluoroacetyloxy)ethyl methacrylate, 0.5 g of (tetraphenyl porphinato)aluminium methyl and 200 g of methylene chloride was heated to 30° C. in a stream of nitrogen. The resultant reaction mixture was irradiated with light from 300 W-xenon lamp through glass filter from the distance of 25 cm, and reacted for 20 hours. Then, 25 g of the monomer (M-102) of the following formula was added thereto, and the reaction mixture was irradiated for 12 hours in the same manner as explained above. Then, 3 g of methanol was added to the reaction mixture. The reaction mixture was stirred for 30 minutes, and the reaction was ceased. 50 g of a solution of 5% by weight of p-toluene sulfonic acid in tetrahydrofran was added to the resultant reaction mixture. The resultant reaction mixture was reprecipitated in 2 l of methanol, and the precipitation was collected and dried. 70 g of Poymer (P-103) was obtained (Mw: $7\times10^4$).

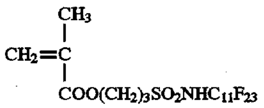

(M-102)

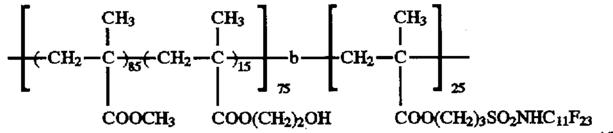

(P-103)

EXAMPLE P-104

A mixture of 48 g of ethyl methacrylate, 12 g of glycidyl methacrylate and 2.4 g of benzyl N,N-diethyl dithiocarbamate was fed to a vessel, sealed, heated to 50° C., and then, irradiated with light from 400 W-high pressure mercury vapor lamp through glass filter from the distance of 10 cm for 10 hours to conduct photopolymerization. 40 g of the monomer (M-103) of the following formula was added to the solution of resultant reaction mixture in 100 g of tetrahydrofuran. The vessel was purged with nitrogen, and the radiation was conducted for 10 hours. The resultant reaction mixture was reprecipitated in 1 l of methanol, and the precipitation was collected and dried. 73 g of Poymer (P-104) was obtained (Mw: $8\times10^4$).

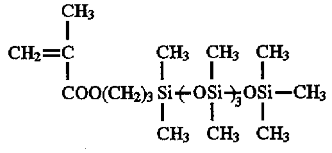

(M-103)

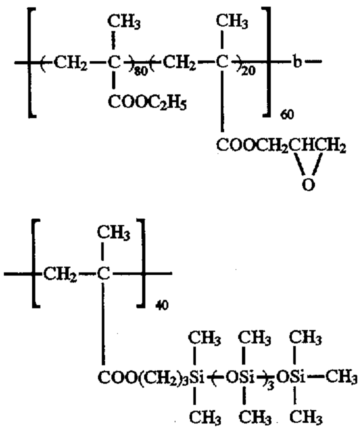

(P-104)

EXAMPLE P-105

A mixture of 55 g of methyl methacrylate, 20 g of 3-(trimethoxysilyl)ethyl methacrylate and 1.0 g of benzyl xanthate was fed to a vessel in a stream of nitrogen, sealed, heated to 50° C., and then, irradiated with light from 400 W-high pressure mercury vapor lamp through a glass filter from the distance of 10 cm for 6 hours to conduct photopolymerization. 25 g of the monomer M-104 of the following formula was added to 40% solution of resultant reaction mixuture in tetrahydrofuran. The vessel was purged with nitrogen, and the radiation was conducted for 10 hours. The resultant reaction mixture was reprecipitated in 2 l of methanol, and the precipitate was collected and dried. 63 g of Poymer (P-105) was obtained (Mw: $6\times10^4$).

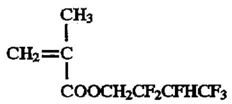

(M-104)

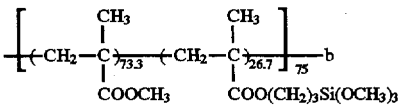

(P-105)

-continued
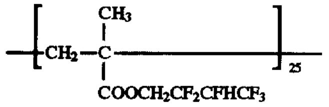
EXAMPLES P-106–P-114
Polymers listed in Table 102 were prepared in a similar manner to the method of Example P-105. Mw of each of resultant polymers (Polymers (P-106)–(P-114)) was in the range of $6\times10^4$ to $8\times10^4$.
TABLE 102
| Example | [P] | A B Type Block Copolymer (ratio by weight) |
|---|---|---|
| P-106 | P-106 | 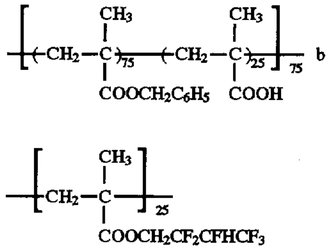 |
| P-107 | P-107 | 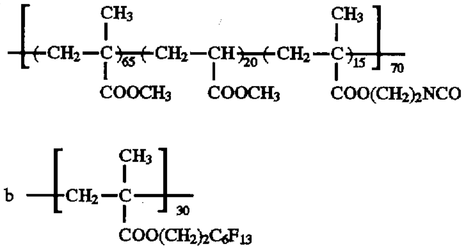 |
| P-108 | P-108 | 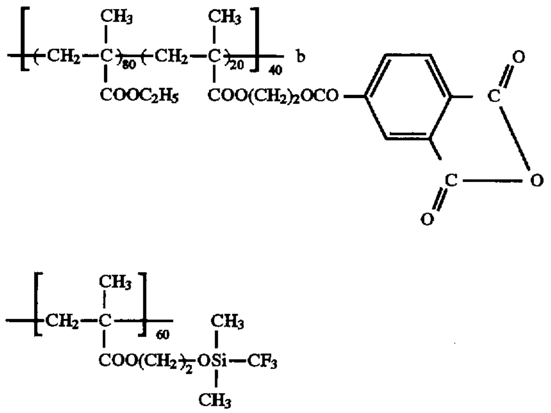 |
| P-109 | P-109 | 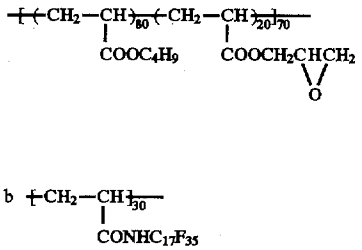 |

TABLE 102-continued
| Example | [P] A B Type Block Copolymer (ratio by weight) |
| --- | --- |
| P-110 | P-110 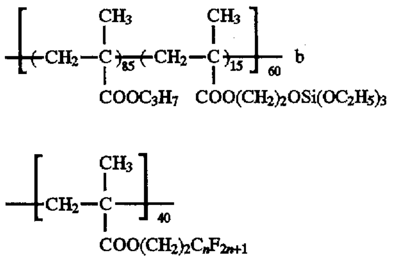 n: 8~10 |
| P-111 | P-111 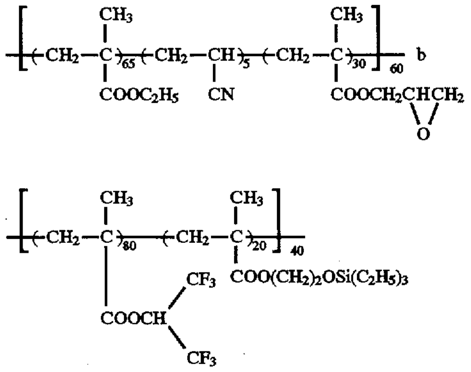 |
| P-112 | P-112 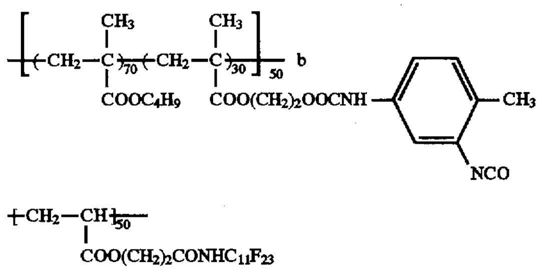 |
| P-113 | P-113 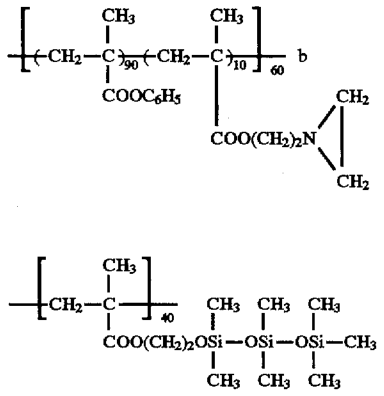 |

TABLE 102-continued

| Example | [P] | A B Type Block Copolymer (ratio by weight) |
|---|---|---|
| P-114 | P-114 | 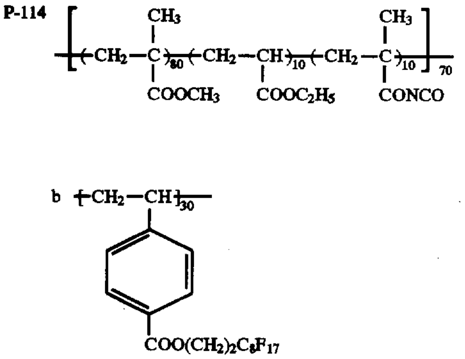 |

EXAMPLE P-115

The procedures of Example P-104 were repeated except that 10 g of the initiator (I-102) of the following formula was substituted for benzyl N,N-diethyldithiocarbamate. Polymer (P-115) with Mw of $8.3 \times 10^4$ was obtained.

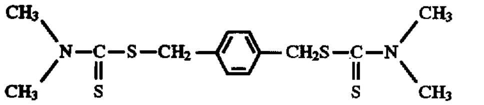

(I-102)

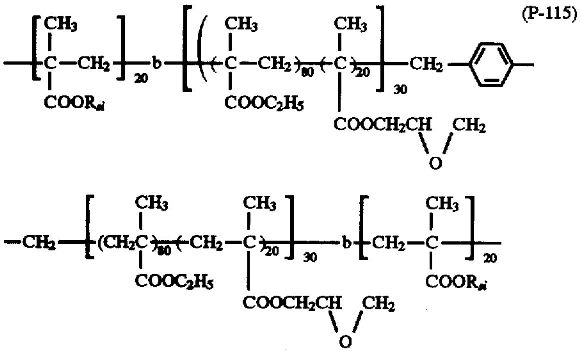

(P-115)

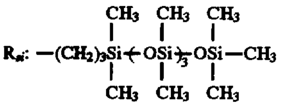

EXAMPLE P-116

The procedures of Example P-105 were repeated except that 12 g of the initiator (I-103) of the following formula was substituted for benzyl isopropylxanthate. Polymer (P-116) with Mw of $9.3 \times 10^4$ was obtained.

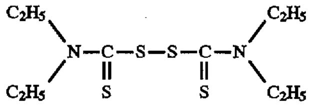

(I-103)

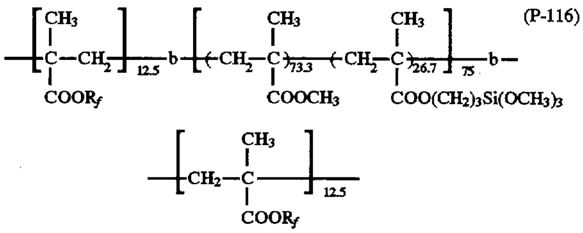

(P-116)

$R_f$: $-CH_2CF_2CFHCF_3$

EXAMPLES P-117–P-125

The procedures of Example P-104 were repeated except that 14 g of the initiator (I-104) of the following formula was substituted for benzyl N,N-diethyldithiocarbamate, and using monomers corresponding to units listed in Table 103. Polymers (P-117)–(P-125) with Mw in the range of $7 \times 10^4$ to $9 \times 10^4$ were obtained.

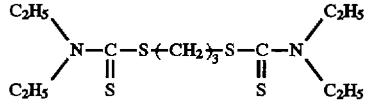

(I-104)

TABLE 103

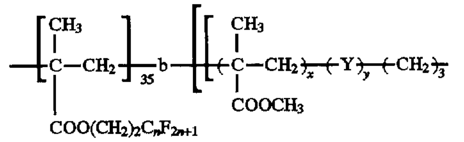

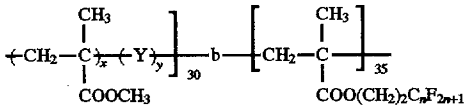

n = 8~10

| Example | [P] | —Y— | x/y ratio by weight |
|---|---|---|---|
| P-117 | P-117 | 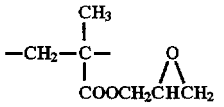 | 40/10 |
| P-118 | P-118 | 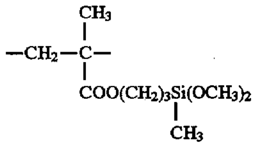 | 35/15 |
| P-119 | P-119 | 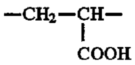 | 40/10 |
| P-120 | P-120 | 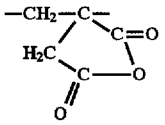 | 45/5 |
| P-121 | P-121 | 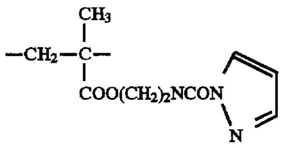 | 37.5/12.5 |
| P-122 | P-122 | 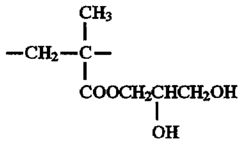 | 45/5 |

TABLE 103-continued

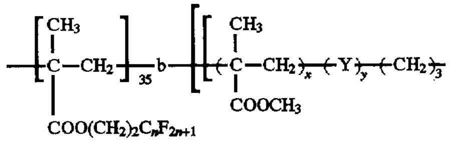

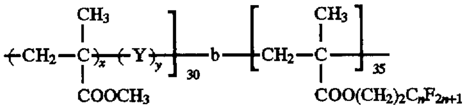

n = 8~10

| Example | [P] | —Y— | x/y ratio by weight |
|---|---|---|---|
| P-123 | P-123 | 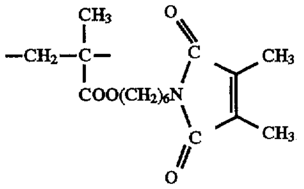 | 40/10 |
| P-124 | P-124 | 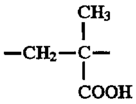 | 40/10 |
| P-125 | P-125 | 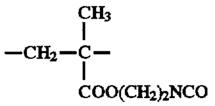 | 42.5/7.5 |

EXAMPLES P-126–P-134

The procedures of Example P-116 were repeated except that 9.6 g of the initiator (I-105) of the following formula was substituted for the initiator (I-103) and using monomers corresponding to units listed in Table 104. Polymers (P-126) –(P-134) with Mw in the range of $8\times10^4$ were obtained.

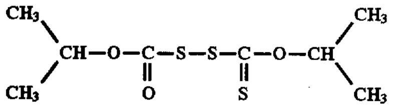

(I-105)

a glass filter from the distance of 10 cm for 12 hours to conduct photopolymerization. 23 g of methylmethacrylate, 22 g of methyl acrylate, and 50% by weight solution of 15 g of glycidyl methacrylate in tetrahydrofuran were added thereto. The vessel was purged with nitrogen, and the radiation was conducted for 10 hours. The resultant reaction mixture was reprecipitated in 1 l of methanol, and the precipitate was collected and dried. Poymeres (P-135)-(P-138) with Mw in the range of $6\times10^4$~$8\times10^4$ were obtained.

TABLE 104

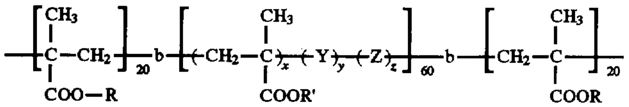

| Example | [P] | —R | —R' | —Y— | —Z | x/y/z ratio by weight |
|---|---|---|---|---|---|---|
| P-126 | P-126 | $-CH_2CF_2CFHCF_3$ | $-CH_3$ | — | 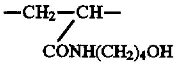 | 85/0/15 |
| P-127 | P-127 | 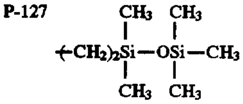 | $-CH_3$ | 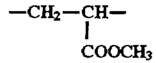 | 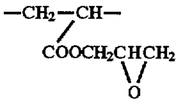 | 60/20/20 |
| P-128 | P-128 | 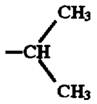 | $-C_2H_5$ | — | 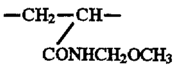 | 85/0/15 |
| P-129 | P-129 | $-(CH_2)C_8F_{17}$ | $-CH_2C_6H_5$ | 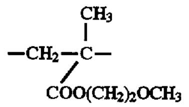 | 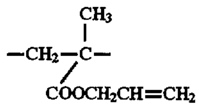 | 75/5/20 |
| P-130 | P-130 | " | $-C_4H_9$ | 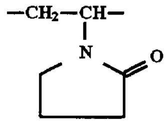 | 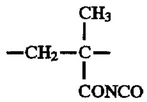 | 87.5/2.5/10 |
| P-131 | P-131 | " | $-C_2H_5$ | 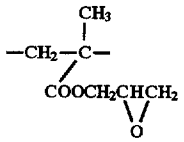 | 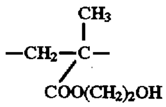 | 90/5/5 |
| P-132 | P-132 | $-(CH_2)_2SO_2-$ $-NHC_{17}F_{35}$ | $-C_3H_7$ | — | 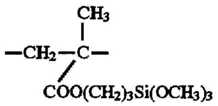 | 90/0/10 |
| P-133 | P-133 | $-(CH_2)_2CO-$ $-NHC_{11}F_{23}$ | $-CH_3$ | 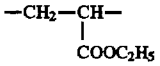 |  | 65/20/15 |
| P-134 | P-134 | 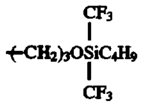 | $-C_4H_9$ | 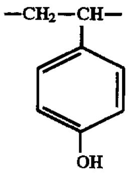 | 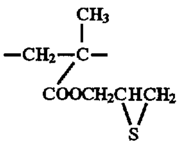 | 80/5/15 |

EXAMPLES P-135–P-138

A mixture of 40 g of monomers corresponding to units listed in Table 105, 11 g of the initiator (I-106) of the following formula, and 40 g of tetrahydrofuran was fed to a vessel, sealed, heated to 50° C., and then, irradiated with light from 400 W-high pressure mercury vapor lamp through

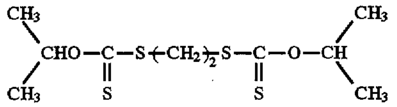
(I-106)

TABLE 105

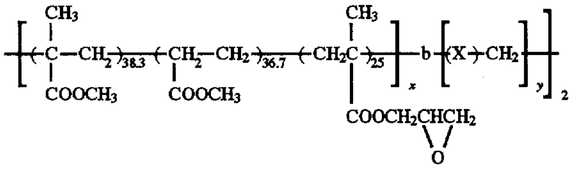

| Example | [P] | —X— | x/y ratio by weight |
|---|---|---|---|
| P-135 | P-135 | 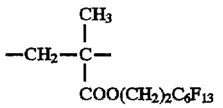 | 60/40 |
| P-136 | P-136 | 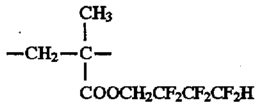 | 30/70 |
| P-137 | P-137 | 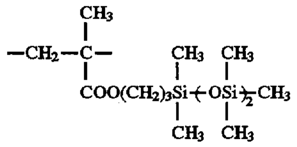 | 65/35 |

TABLE 105-continued

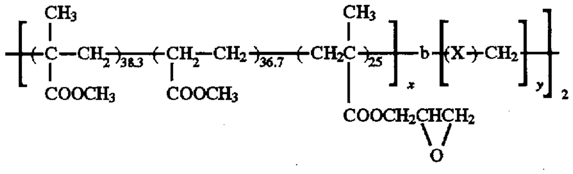

| Example | [P] | —X— | x/y ratio by weight |
|---|---|---|---|
| P-138 | P-138 | 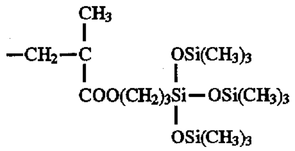 | 70/30 |

EXAMPLE P-201

A mixture of 57 g of methyl methacrylate, 28 g of methyl acrylate, 15 g of glycidyl methacrylate, 17.5 g of initiator (I-201) of the following formula, and 150 g of tetrahydrofuran was heated to 50° C. in a stream of nitrogen. The resultant reaction mixture was irradiated with light from 400 W-high pressure mercury vapor lamp through glass filter from the distance of 10 cm for 10 hours to conduct photopolymerization. The resultant reaction mixuture was reprecipitated in 1 l of methanol, and the precipitate was collected and dried. 72 g of polymer with Mw of $4.0\times10^4$.

40 g of the polymer, 60 g of the monomer (M-201), and 100 g of tetrahydrofuran was heated to 50° C. in a stream of nitrogen. The resultant reaction mixture was irradiated for 15 hours in the above mentioned manner. The resultant reaction mixuture was reprecipitated in 1.5 l of methanol, and the precipitate was collected and dried. 78 g of polymer (P-201) with Mw of $6\times10^4$.

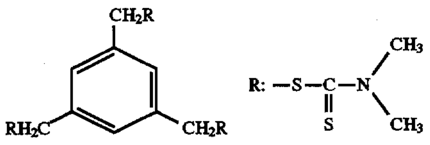
(I-201)

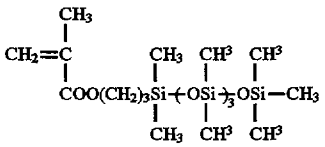
(M-201)

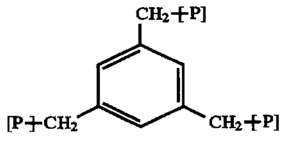
(P-201)

-continued
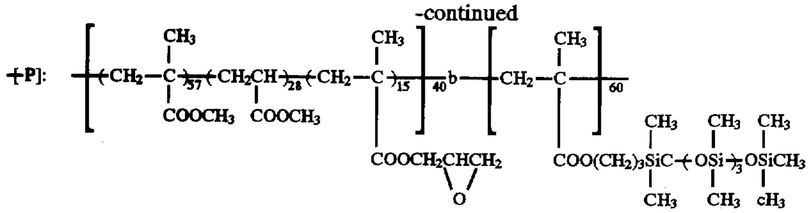
EXAMPLES P-202–P-214
The procedures of Example P-201 were repeated except that 0.031 mole of initiators listed in Table 202 were substituted for 17.5 g of the initiator (I-201). Mw of each of resultant polymers (Polymers (P-202)–(P-214)) was in the range of $4\times10^4$ to $6\times10^4$.

TABLE 202
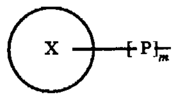
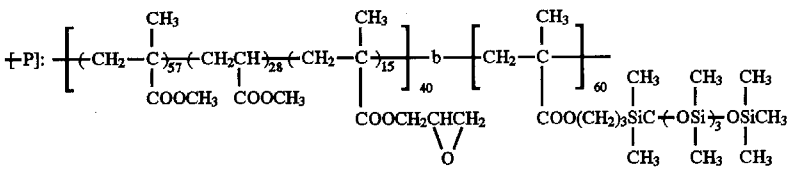
| Example | [P] | Initiator | | −R | 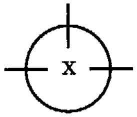 |
|---|---|---|---|---|---|
| P-202 | P-202 | 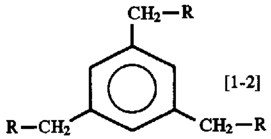 | [1-2] | 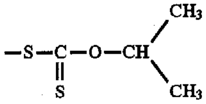 | 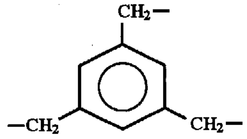 |
| P-203 | P-203 | 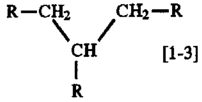 | [1-3] | 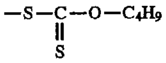 | 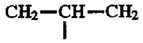 |
| P-204 | P-204 | 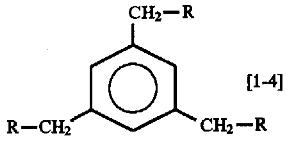 | [1-4] | 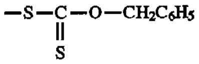 | 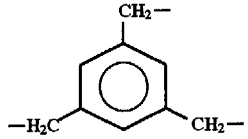 |
| P-205 | P-205 | 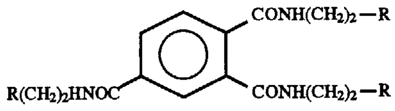 | [1-5] | 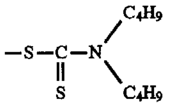 | 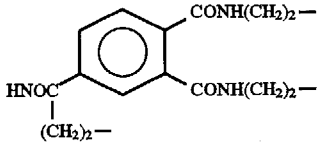 |

TABLE 202-continued
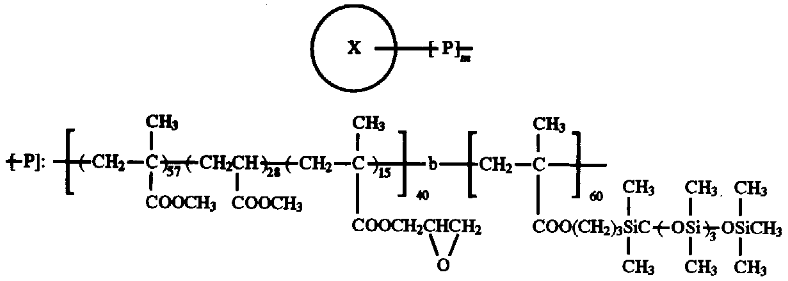
| Example | [P] | Initiator | | −R | |
|---|---|---|---|---|---|
| P-206 | P-206 | 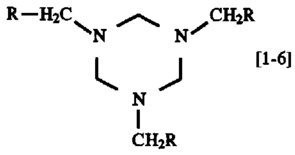 | [1-6] | 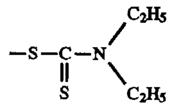 | 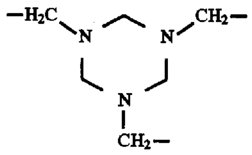 |
| P-207 | P-207 | 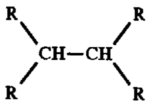 | [1-7] | 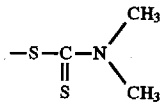 | 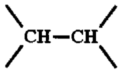 |
| P-208 | P-208 | 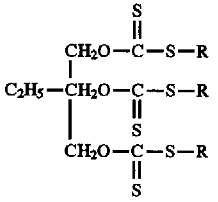 | [1-8] | $-CH_2C_6H_5$ | 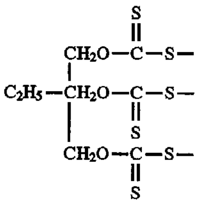 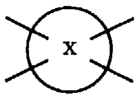 |
| P-209 | P-209 | 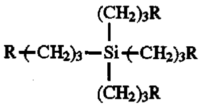 | [1-9] | 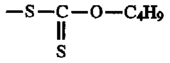 | 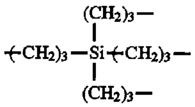 |

TABLE 202-continued
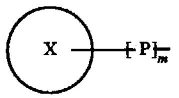
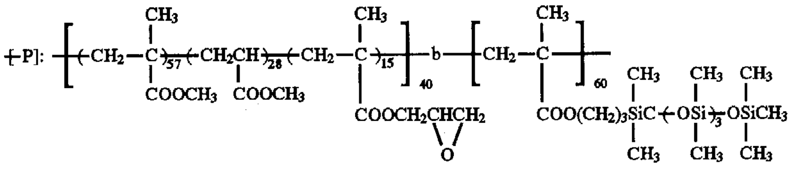
| Example | [P] | Initiator | —R | |
|---|---|---|---|---|
| P-210 | P-210 | 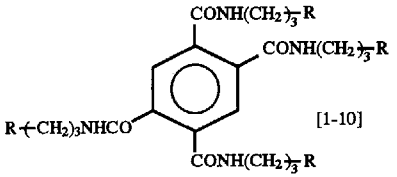 [1-10] | 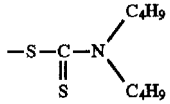 | 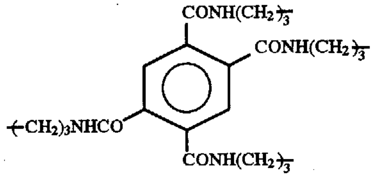 |
| P-211 | P-211 | 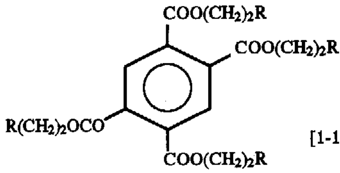 [1-11] | 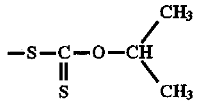 | 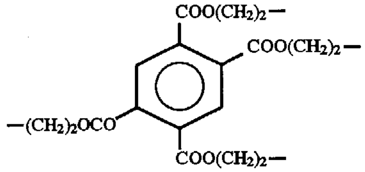 |
| P-212 | P-212 | 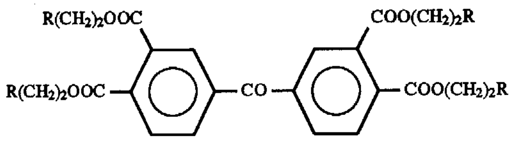 [1-12] | 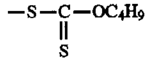 | 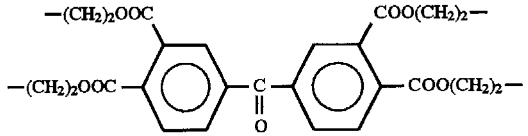 |
| P-213 | P-213 | 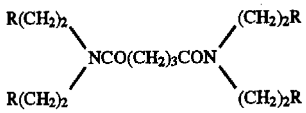 [1-13] | 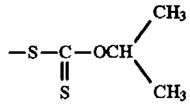 | 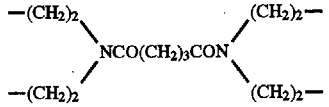 |

TABLE 202-continued
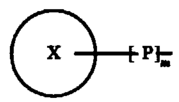
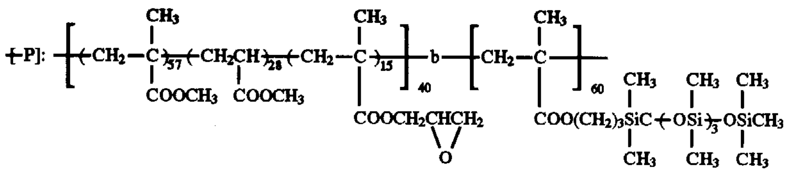
| Example | [P] | Initiator | −R | |
|---|---|---|---|---|
| P-214 | P-214 | 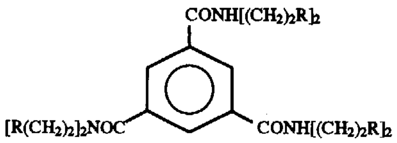 [1-14] | 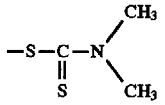 | 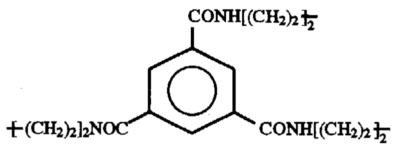 |

EXAMPLES (P-215)–(P-233)
The procedures of Example P-201 were repeated except that 60 g of monomeres corresponding to units listed in Table 203 for 60 g of the monomer (M-201). Mw of each of resultant polymers (Polymers (P-215)–(P-233)) was in the range of $6\times10^4$~$7\times10^4$.
TABLE 203
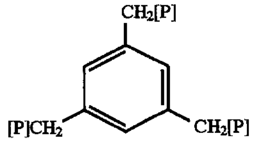
—[P]:
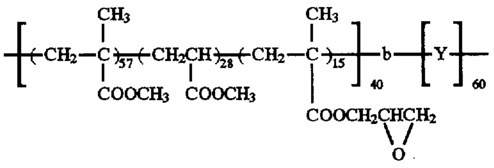
| Example | [P] | —Y— |
|---|---|---|
| P-215 | P-215 | 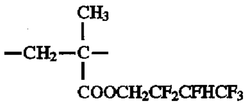 |
| P-216 | P-216 | 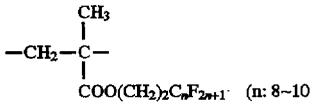 |
| P-217 | P-217 | 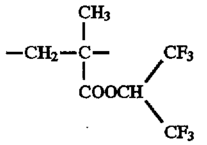 |
| P-218 | P-218 | 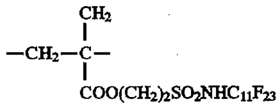 |
| P-219 | P-219 |  |
| P-220 | P-220 | 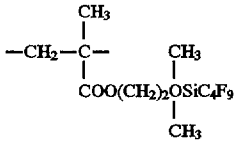 |
| P-221 | P-221 | 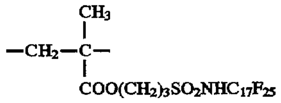 |
| P-222 | P-222 | 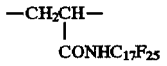 |
| P-223 | P-223 | 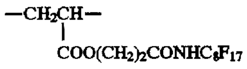 |
TABLE 203-continued
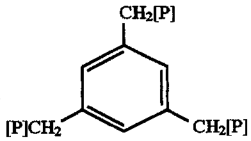
—[P]:
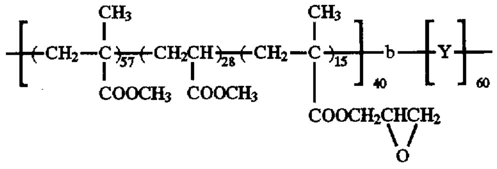
| Example | [P] | —Y— |
|---|---|---|
| P-224 | P-224 | 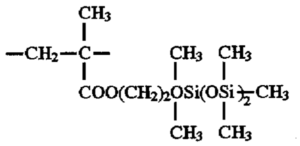 |
| P-225 | P-225 | 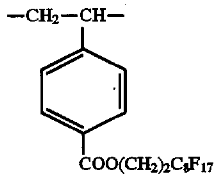 |
| P-226 | P-226 | 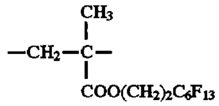 |
| P-227 | P-227 | 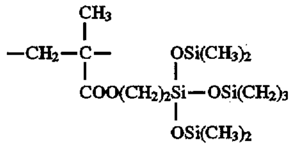 |
| P-228 | P-228 | 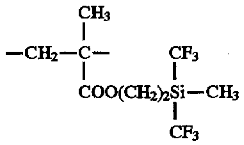 |
| P-229 | P-229 |  |
| P-230 | P-230 | 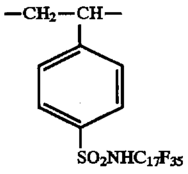 |
| P-231 | P-231 | 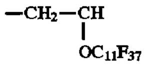 |

TABLE 203-continued

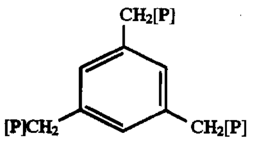

+P]:

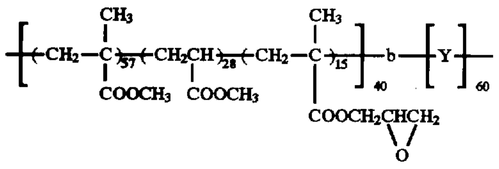

| Example | [P] | −Y− |
|---|---|---|
| P-232 | P-232 | 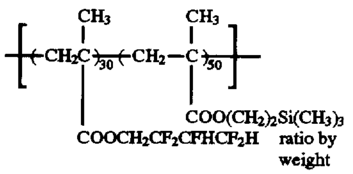 ratio by weight |
| P-233 | P-233 | 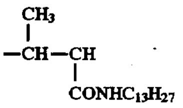 |

EXAMPLES P-234–P-240

The procedures of Example P-201 were repeated except for using a mixture of 30 g of monomers corresponding to units listed Table 204, 15 g of the initiator (I-207), and 100 g of tetrahydrofuran. 80 g of polymers with Mw of $6\times10^4$~$7\times10^4$ were obtained.

TABLE 204

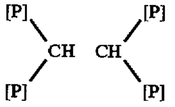

+P]:

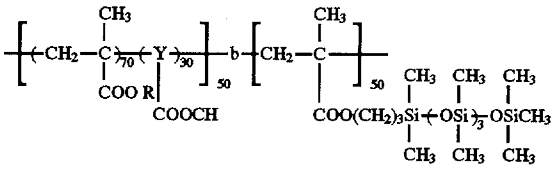

| Example | [P] | −R | −Y− |
|---|---|---|---|
| P-234 | P-234 | $-C_2H_5$ | 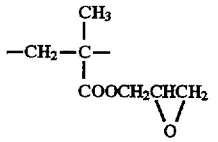 |
| P-235 | P-235 | $-CH_3$ | 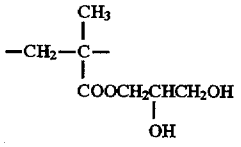 |
| P-236 | P-236 | $-CH_2C_6H_5$ | 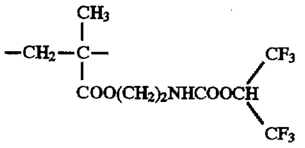 |
| P-237 | P-237 | 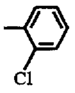 | 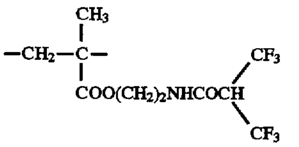 |
| P-238 | P-238 | $-C_4H_9$ | 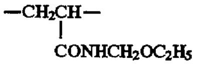 |
| P-239 | P-239 | $-CH_3$ | 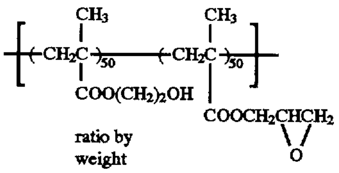 ratio by weight |
| P-240 | P-240 | $-C_2H_5$ | 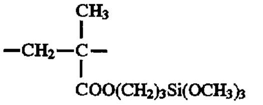 |

Further, polymerization was conducted using a mixture of 50 g of the resultant polymer, 50 g of the monomer (M-201), and 100 g of tetrahydrofuran in the same manner as a method of Example P-201 except for substituting diethylether for methanol. Mw of each of resultant polymers (Polymers (P-234)–(P-240)) was in the range of $8\times10^4$ to $10\times10^4$.

EXAMPLES P-241–P-254

The procedures of Example P-201 were repeated excepting using 10 g of the initiator (I-3) for 17.5 g of the initiator (I-1), and diethylether for methanol as a solvent for reprecipitation to prepare polymers listed in Table 5. Polymers (P-241)–(P-254) with Mw in the range of of $7\times10^4$~$9\times10^4$ were obtained.

TABLE 205
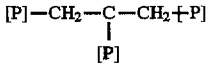
| Example | [P] | [P] |
|---|---|---|
| P-241 | P-241 | 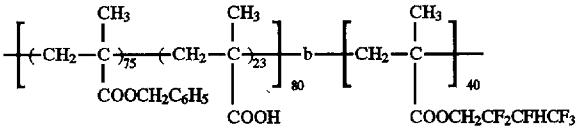 |
| P-242 | P-242 | 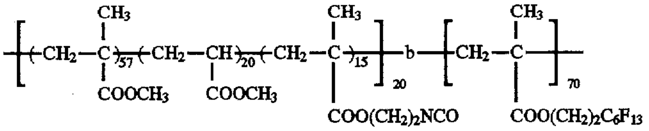 |
| P-243 | P-243 | 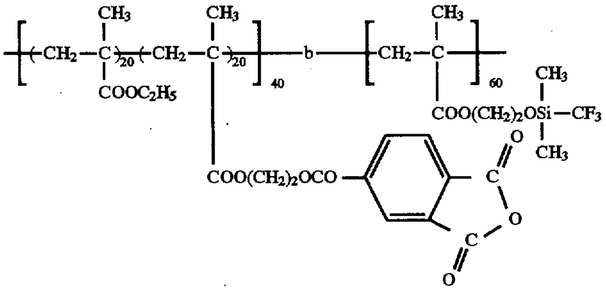 |
| P-244 | P-244 | 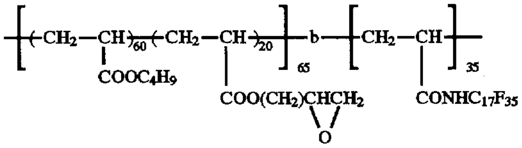 |
| P-245 | P-245 | 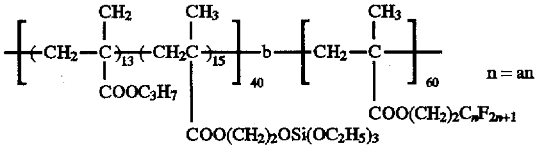 n = an integer of 8 to 10 |
| P-246 | P-246 | 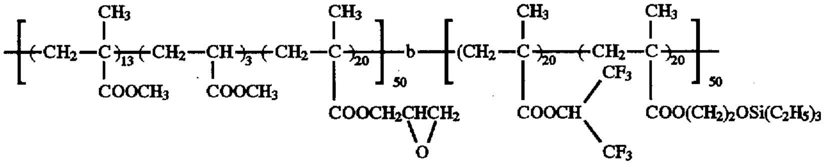 |
| P-247 | P-247 | 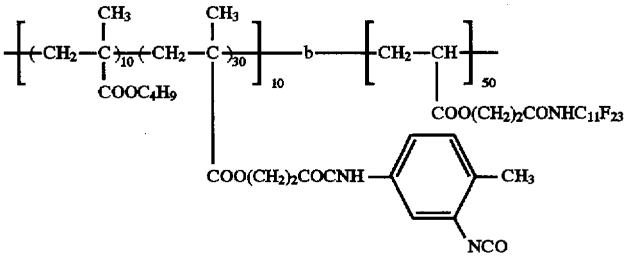 |
| P-248 | P-248 | 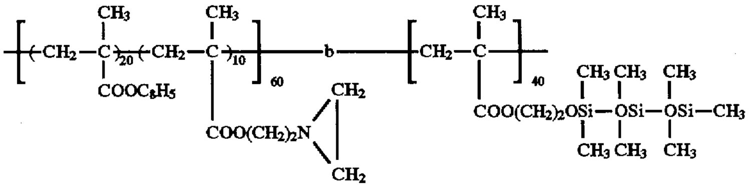 |

TABLE 205-continued

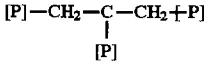

| Example | [P] | [P] |
| --- | --- | --- |
| P-249 | P-249 | 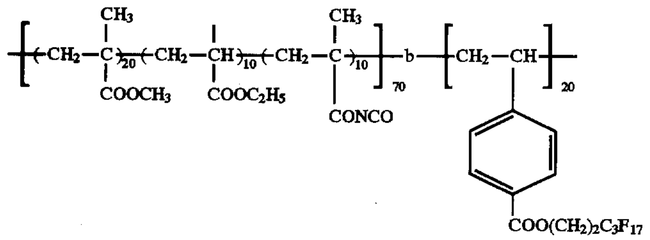 |
| P-250 | P-250 | 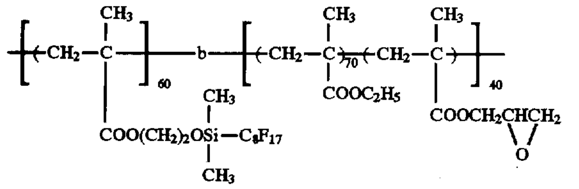 |
| P-251 | P-251 | 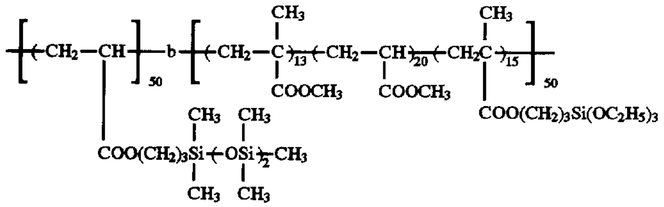 |
| P-252 | P-252 | 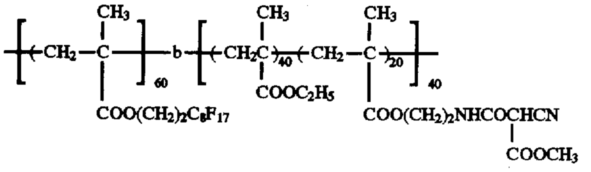 |
| P-253 | P-253 | 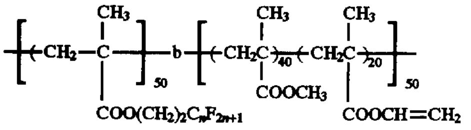 (n: an integer of 8 to 10 |
| P-254 | P-254 | 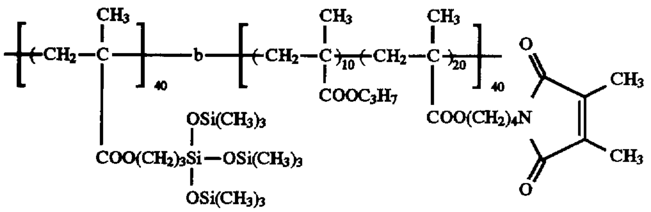 |

EXAMPLE P-301

A mixture of 60 g of methyl methacrylate, 30 g of a macromonomer of the following formula, 10 g of diglycidyl methacrylate, and 150 g of toluene was heated to 70° C. in a stream of nitrogen. 1.0 g of 2,2'-azobisisobutylonytrile (A.I.B.N) was added and reacted for 4 hours. Further, 0.5 g of A.I.B.N was added and reacted for 4 hours. Polymer with Mw of $6.5\times10^4$ (P-301) was obtained.

(P-301)

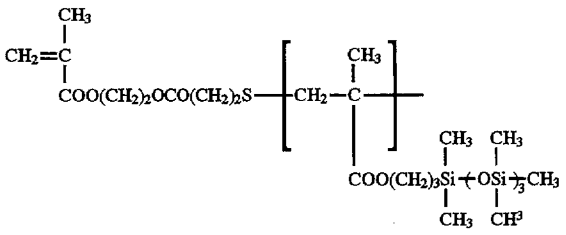

Macromonomer Mw $1 \times 10^4$

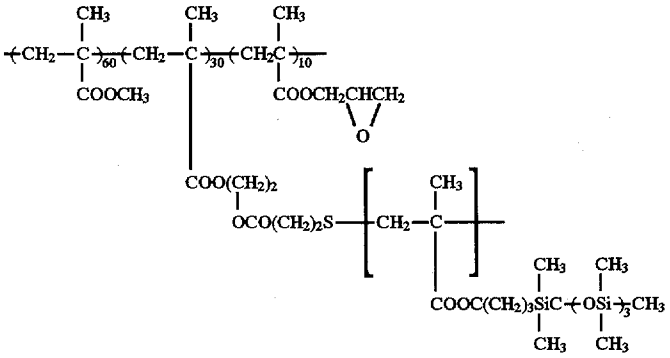

EXAMPLES P-302–P-314

The procedures of Example P-301 were repeated except that 30 g of macromonomers listed in Table 302 for 30 g of the macromonomer M-301. Polymers (P-302)–(P-314) with Mw in the range of $5\times10^4$~$8\times10^4$ were obtained. Mw of used macromonomers are listed in Table 302

TABLE 302

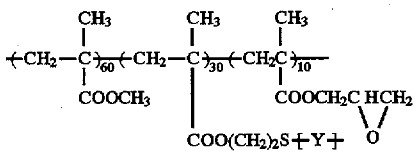

| Example | [P] | —Y— | Mw of Macromonomer |
|---|---|---|---|
| P-302 | P-302 | 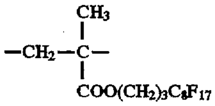 | $6.5 \times 10^3$ |
| P-303 | P-303 | 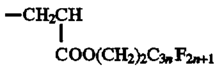 n = an integer of 8 to 10 | $8 \times 10^3$ |
| P-304 | P-304 | 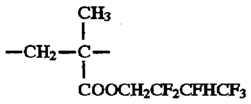 | $6 \times 10^3$ |
| P-305 | P-305 | 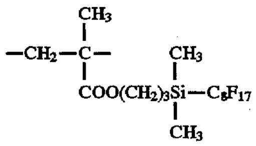 | $8 \times 10^3$ |

TABLE 302-continued

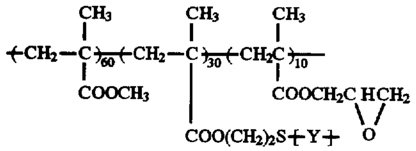

| Example | [P] | —Y— | Mw of Macromonomer |
|---|---|---|---|
| P-306 | P-306 | 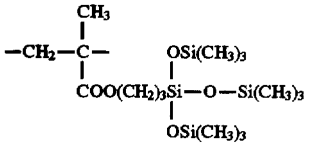 | $5 \times 10^3$ |
| P-307 | P-307 | 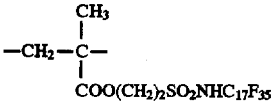 | $8 \times 10^3$ |
| P-308 | P-308 |  | $7 \times 10^3$ |
| P-309 | P-309 | 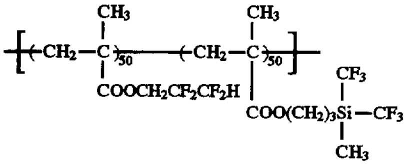 | $6 \times 10^3$ |
| P-310 | P-310 | 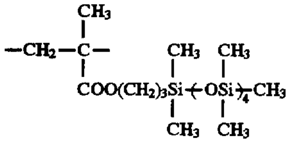 | $9 \times 10^3$ |
| P-311 | P-311 | 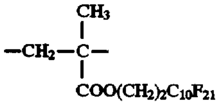 | $1.5 \times 10^4$ |
| P-312 | P-312 |  | $1.2 \times 10^4$ |
| P-313 | P-313 | 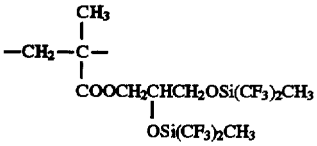 | $1.5 \times 10^4$ |
| P-314 | P-314 | 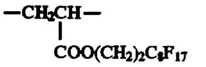 | $1.0 \times 10^4$ |

EXAMPLES P-315–P-325

A mixture of monomers corresponding to units listed in Table 303, 25 g of Macromonomer-FM-0721 (Mw $1\times10^4$, manufactured by CHISSO CORPORATION), and 200 g of toluene was heated to 80° C. in a stream of nitrogen.

TABLE 303
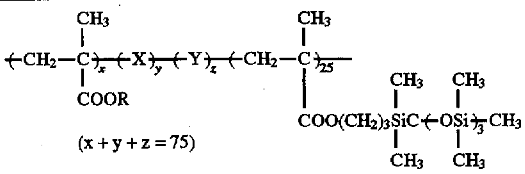
(x + y + z = 75)
| Example | [P] | −R | −X− | −Y− | x/y/z ratio by weight |
|---|---|---|---|---|---|
| p-315 | p-315 | $-CH_2C_6H_5$ | — | 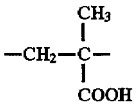 | 55/0/20 |
| p-316 | p-316 | $-CH_3$ | — | 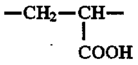 | 60/0/15 |
| p-317 | p-317 | $-CH_3$ | 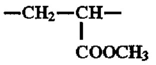 | 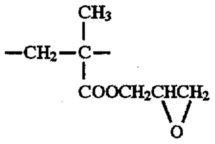 | 50/15/10 |
| p-318 | p-318 | $-CH_2C_6H_5$ | 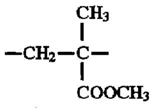 | 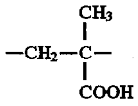 | 55/10/10 |
| p-319 | p-319 | $-CH_3$ | 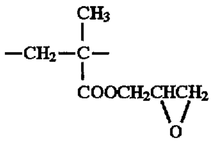 | 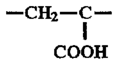 | 65/5/5 |
| p-320 | p-320 | $-C_2H_5$ | — | 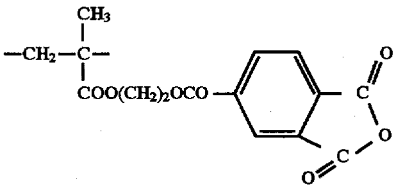 | 65/0/10 |
| p-321 | p-321 | $-C_4H_9$ | 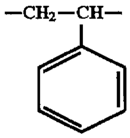 | 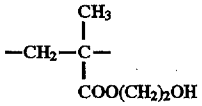 | 50/10/15 |
| p-322 | p-322 | $-C_2H_5$ | — | 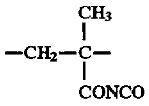 | 67/0/8 |
| p-323 | p-323 | $-C_6H_5$ | — | 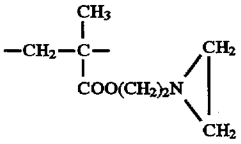 | 65/0/10 |
| p-324 | p-324 | $-CH_3$ | 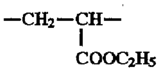 | 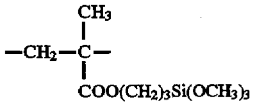 | 54/14/15 |

TABLE 303-continued

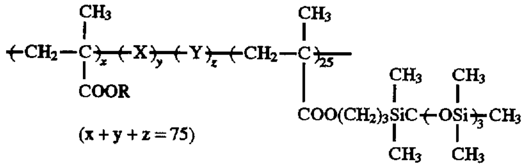

| Example | [P] | —R | —X— | —Y— | x/y/z ratio by weight |
|---|---|---|---|---|---|
| p-325 | p-325 | $-C_2H_5$ | — | 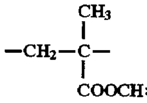 | 55/0/20 |

EXAMPLES P-326–P-337

The procedures of Example P-301 were repeated except for using a mixture of a monomer of the following formula (M-302), macromonomers listed in Table 304 and 200 g of toluene. Polymers (P-326)–(P-337) with in the range of Mw of $6\times10^4$~$8\times10^4$ were obtained.

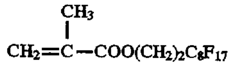 (M-302)

TABLE 304

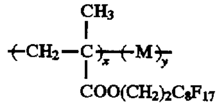

| Example | [P] | x/y ratio by weight | —M— | Mw of Macromonomer |
|---|---|---|---|---|
| p-326 | p-326 | 60/40 | 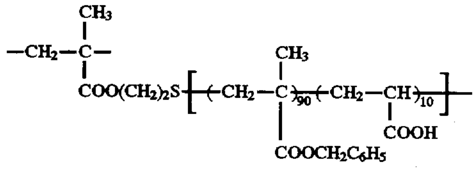 | $9\times10^3$ |
| p-327 | p-327 | 80/20 | 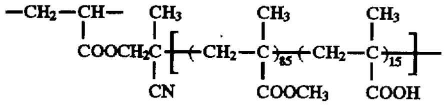 | $1.4\times10^4$ |
| p-328 | p-328 | 80/20 | 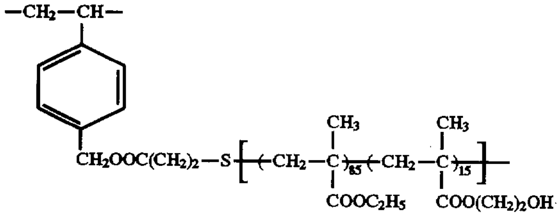 | $8\times10^3$ |
| p-329 | p-329 | 75/25 | 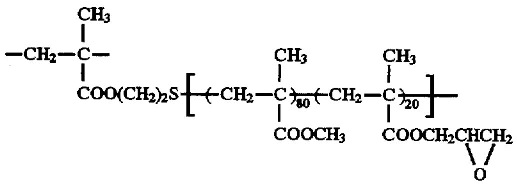 | $9\times10^4$ |

TABLE 304-continued

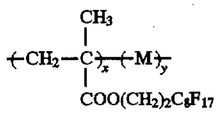

| Example | [P] | x/y ratio by weight | —M— | Mw of Macromonomer |
|---|---|---|---|---|
| p-330 | p-330 | 80/20 | 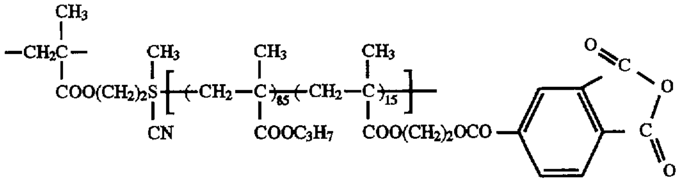 | 1.1 × 10⁴ |
| p-331 | p-331 | 90/10 | 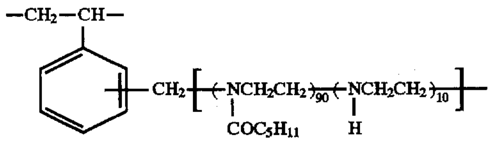 | 3 × 10³ |
| p-332 | p-332 | 60/40 | 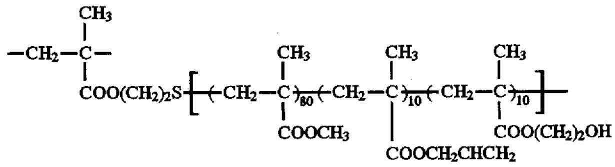 | 1 × 10⁴ |
| p-333 | p-333 | 50/50 | 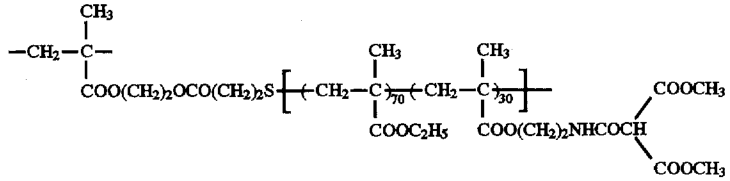 | 7 × 10³ |
| p-334 | p-334 | 80/20 | 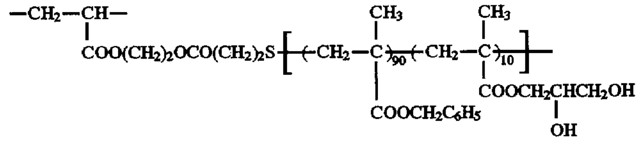 | 8 × 10³ |
| p-335 | p-335 | 75/25 | 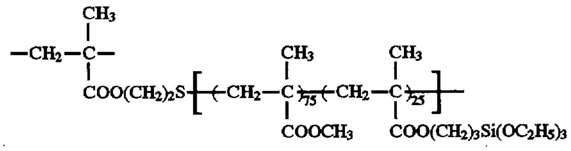 | 8 × 10³ |
| p-336 | p-336 | 80/20 | 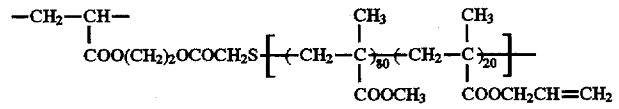 | 6 × 10³ |
| p-337 | p-337 | 75/25 | 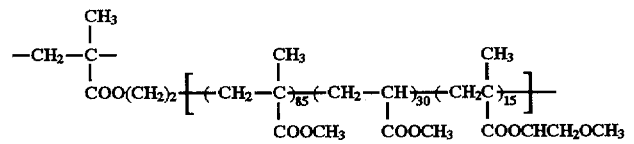 | 8 × 10³ |

EXAMPLE P-401

A mixture of 50 g of a monomer of the following formula and 50 g of tetrahydrofuran was fed to a vessel and sealed in a stream of nitrogen, and heated to 60° C., and then, irradiated with light from 400 W-high pressure mercury vapor lamp through a glass filter from the distance of 10 cm for 10 hours to conduct photopolymerization. A mixture of 25 g of methylmethacrylate, 15 g of glycidyl methacrylate and 10 g of macromonomer (MB-401), and 50 g of tetrahydrofuran was added thereto. Then, the vessel was purged with nitrogen, and the radiation was conducted for 16 hours. The resultant reaction mixture was reprecipitated in 1 l of methanol, and the precipitate was collected and dried. 68 g of Polymer (P-401) with with Mw of $6 \times 10^4$ was obtained.

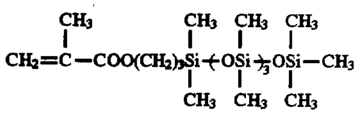
(A-401)

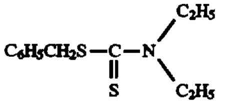
(I-401)

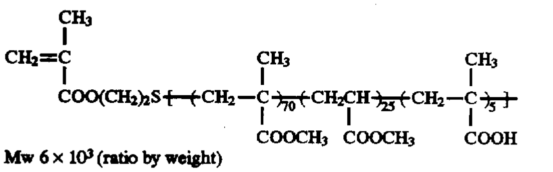
(MB-401)

Mw $6 \times 10^3$ (ratio by weight)

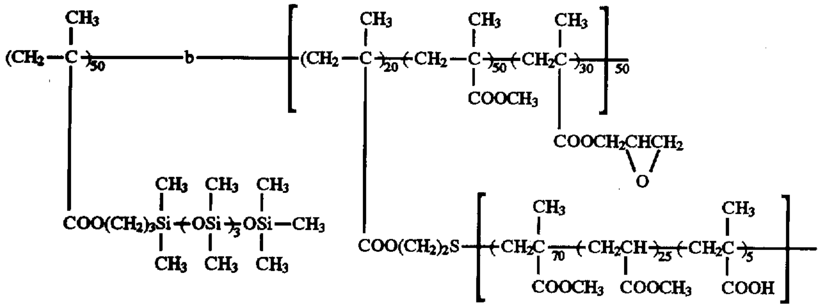
(P-401)

EXAMPLE P-402

A mixture of 36 g of the monomer (A-402), 4 g of a siloxane macromonomer praqcell FM-725 (manufactured by CHISSO CORPORATION, Mw $1 \times 10^4$), 1.0 g of an initiator of the following formula and 50 g of tetrahydrofuran are charged to a vessel and sealed in a flow of nitrogen, and heated 50° C. A mixture of 24 g of methyl methacrylate, 18 g of methyl acrylate, and 18 g of glycidyl methacrylate and 60 g of tetrahydrofuran was added to the vessel. And then, the vessel was purged with nitrogen, and was irradiated for 12 hours in the same manner as Example P-401.

The resultant reaction mixture was reprecipitated in 1 l of methanol. The precipitate was collected and dried. 70 g of polymer (Polymer (P-402)) with Mw of $8 \times 10^4$ was obtained.

(A-402)

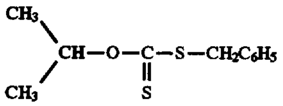
(I-402)

-continued

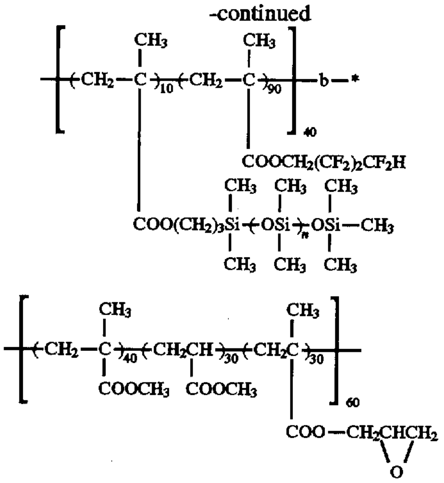
(P-402)

EXAMPLE P-403

A mixture of 25 g of methyl methacrylate, 15 g of glycidyl methacrylate, 10 g of a macromonomer (MB-402) of the following formula, 2.5 g of an initiator of the following formula, and 50 g of tetrahydrofuran was degassed in a stream of nitrogen, and irradiated for 12 hours in the same manner as Example P-401.

The resultant reaction mixture was reprecipitated in 1 l of methanol. The precipitate was collected and dried. 72 g of polymer (Polymer (P-403)) with Mw of $5.3\times10^4$ was obtained.

(MB-402)

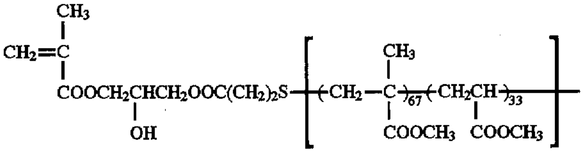

$\overline{Mw} \times 10^3$ (I-403)

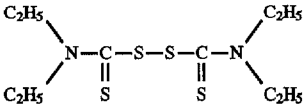

(A-403)

(P-403)

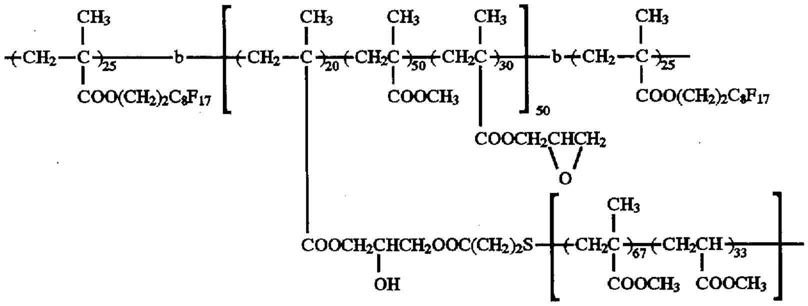

EXAMPLES P-404–P-416

The procedures of Example P-402 were repeated except for substituting macromonomers listed in Table 402 for the macromonomer (M-401). Polymers (P-404)–(P-416) with Mw in the range of $5\times10^4$~$8\times10^4$ were obtained. Mw of macromonomers which were used are also listed in Table 402.

TABLE 402

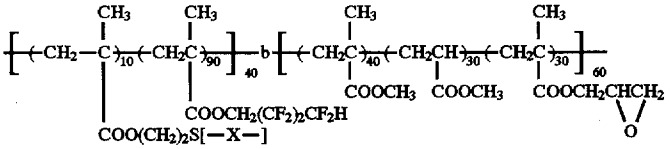

| Example | Polymer | Macromonomer ($M_A$) | Mw of Macromonomer |
|---|---|---|---|
| 4 | P-4 | $M_A$-4*) | $6.5 \times 10^3$ |
| 5 | P-5 | $M_A$-5*) | $8 \times 10^3$ |
| 6 | P-6 | $M_A$-6*) | $6 \times 10^3$ |
| 7 | P-7 | $M_A$-7*) | $8 \times 10^3$ |
| 8 | P-8 | $M_A$-8*) | $5 \times 10^3$ |
| 9 | P-9 | $M_A$-9*) | $8 \times 10^3$ |
| 10 | P-10 | $M_A$-10*) | $7 \times 10^3$ |
| 11 | P-11 | $M_A$-11*) | $6 \times 10^3$ |
| 12 | P-12 | $M_A$-12*) | $9 \times 10^3$ |
| 13 | P-13 | $M_A$-13*) | $1.5 \times 10^3$ |
| 14 | P-14 | $M_A$-14*) | $1.2 \times 10^3$ |
| 15 | P-15 | $M_A$-15*) | $1.5 \times 10^3$ |
| 16 | P-16 | $M_A$-16*) | $1.0 \times 10^3$ |

*)Units of —X— of Macromonomers ($M_A$) are as follows:

TABLE 402-continued
$(M_A\text{-}4)$
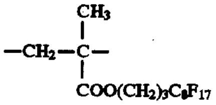
$(M_A\text{-}5)$
(n = an integer of 8 to 10)
$(M_A\text{-}6)$
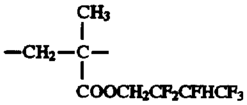
$(M_A\text{-}7)$
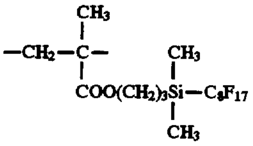
$(M_A\text{-}8)$
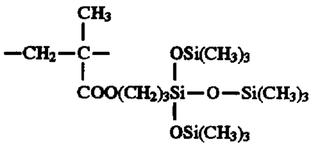
$(M_A\text{-}9)$
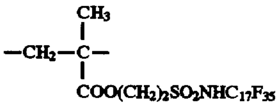
$(M_A\text{-}10)$
$(M_A\text{-}11)$
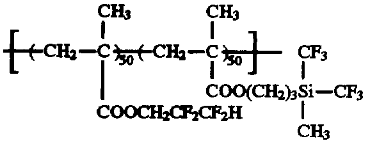
$(M_A\text{-}12)$
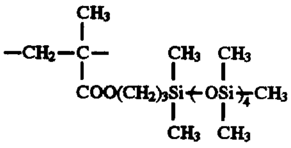

TABLE 402-continued ($M_A$-13)

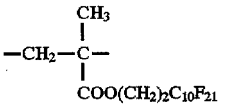

($M_A$-14)

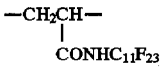

($M_A$-15)

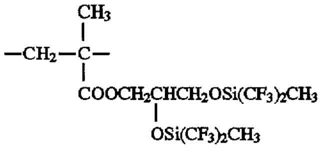

($M_A$-16)

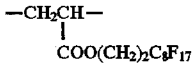

EXAMPLES P-417–P-429

Polymers listed in Table 403 were prepared by a similar method to one of Example P-401. Polymers (P-417)–(P-427) with Mw of $4\times10^4$~$8\times10^4$ were obtained. Mw of macromonomers which were used are also listed in Table 403. Mw of each of one-functional macromonomers MB which were used was in the range of $6\times10^3$~$9\times10^4$.

TABLE 403

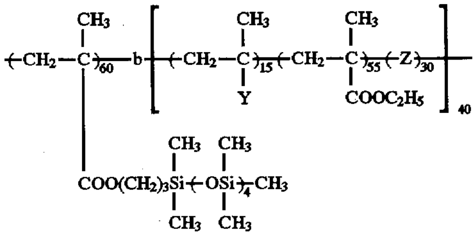

| Example | [P] | —Y ratio by weight | —Z— |
|---|---|---|---|
| p-417 | p-417 | Y-1 | 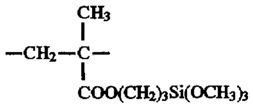 |
| p-418 | p-418 | Y-2 | 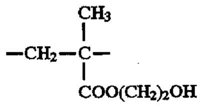 |
| p-419 | p-419 | Y-3 | 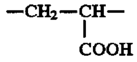 |
| p-420 | p-420 | Y-4 | 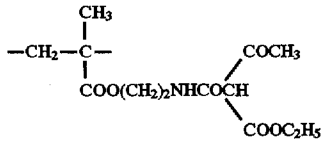 |

TABLE 403-continued
| | | |
|---|---|---|
| p-421 | p-421 Y-5 | 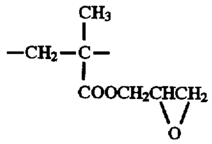 |
| p-422 | p-422 Y-5 | 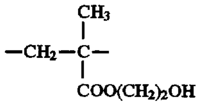 |
| p-423 | p-423 Y-6 | 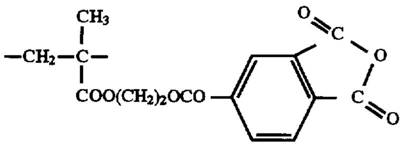 |
| p-424 | p-424 Y-7 | 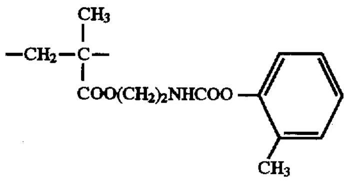 |
| p-425 | p-425 Y-8 | 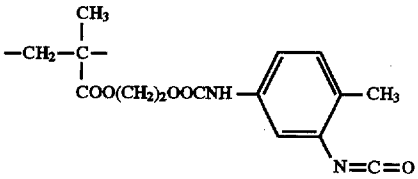 |
| p-426 | p-426 Y-9 | 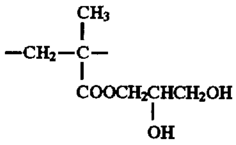 |
| p-427 | p-427 Y-10 | 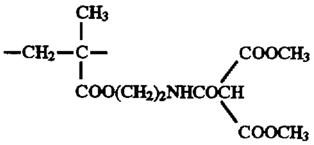 |
| p-428 | p-428 Y-11 |  |
| p-429 | p-429 Y-12 | 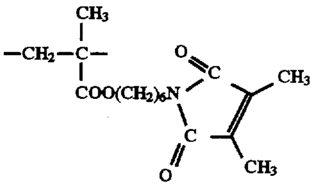 |
*)Y-1 to Y-13 are as follows:
(Y-1)
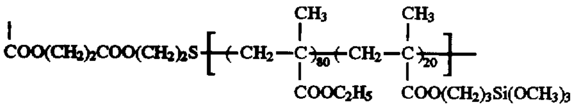

TABLE 403-continued
(Y-2)
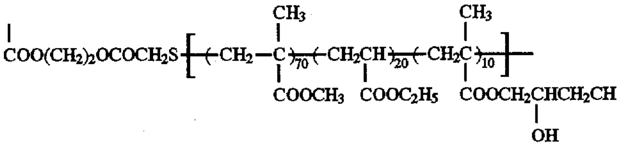
(Y-3)
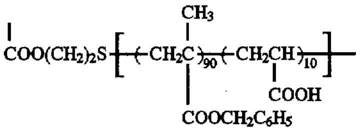
(Y-4)
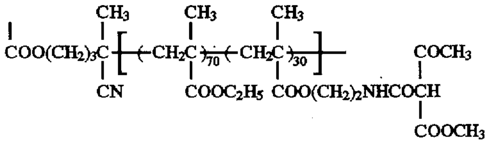
(Y-5)
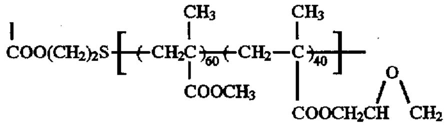
(Y-6)
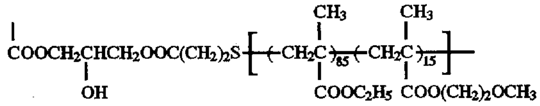
(Y-7)
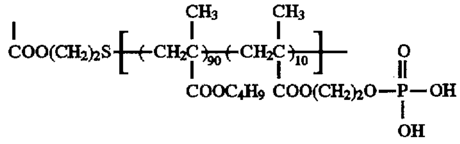
(Y-8)
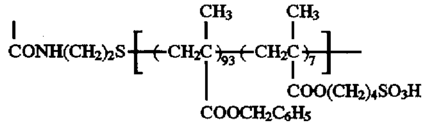
(Y-9)
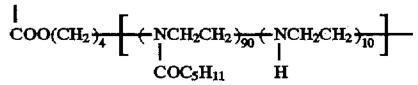
(Y-10)
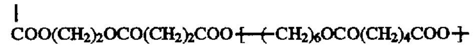

TABLE 403-continued (Y-11)

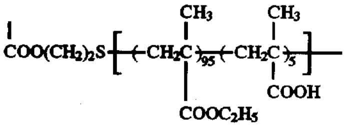

(Y-12)

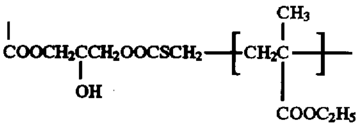

EXAMPLE 1

A mixture of 1 g of metal-free X-form phthalocyanine (available from DAINIPPON INK AND CHEMICALS, INC.), 10 g of binder resin B-1 represented by the following formula, 0.3 g of resin P-2, 0.15 g of compound A represented by the following formula and 80 g of tetrahydrofuran was charged together with glass beads in a 500-ml glass container. The mixture was dispersed by a paint shaker (available from TOYO SEIKI SEISAKUSHO) for 60 minutes and then the glass beads were separated by filtration to prepare a dispersion for a photosensitive layer (i.e., photoconductive layer).

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 110° C. for 5 minutes to obtain a photosensitive layer having 8 μm thickness.

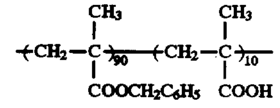

Binder Resin B-1

$\overline{Mw}$ 6.5 $\times 10^4$

The numbers of the repeating units in the formula represent a ratio by weight.

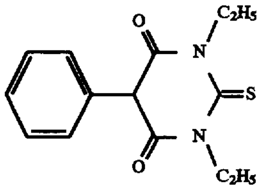

Compound A

A solution having the following contents was then prepared to form a transfer removable layer on the photosensitive layer.

| | |
|---|---|
| Poly(vinyl acetate/crotonic acid) (95/5, Mw $5 \times 10^4$) | 3 g |
| 28% Aqueous Ammonia | 1 g |
| Ethanol | 97 g |

After the above solution was coated with a wire bar on the photosensitive layer, the coating was dried in an oven at 120° C. for 20 seconds to prepare an electrophotographic material for color proofing, comprising a transfer removable layer having 1.3 μm thickness.

Comparative Example A

An electrophotographic material for color proofing was prepared in the same manner as that of Example 1 except that the mixture not containing Polymer P-2 was used.

Test Example

The image quality and the transfer properties of the electrophotographic material for color proofing obtained in Example 1 and those of the electrophotographic material for color proofing obtained in Comparative Example A were evaluated as follows:

The electrophotographic material of Example 1 was charged by corona discharge to +450 volts in dark. The charged el ectrophotographic material was imagewise exposed to light by a Ga—Al—As semiconductor laser (oscillation wavelength 780 nm) having 5 mW of output power with 30 erg/cm$^3$ of irradiation measured on the el ectrophotographic material in a pitch of 25 μm at a scanner speed of 300 cm/sec in a mode of negative mirror image, based on the information about yellow color among information about yellow, magenta, cyan and black, which were recorded in a hard disk of a system as digital image data which were obtained by reading an original using a color scanner and conducting color separation and correction regarding some color reproductions specific to the system. Subsequently, the exposed electrophotographic material was reversally developed using a yellow liquid developer for a signature system (available from Eastman Kodak) 75-fold (by weight) diluted with Isoper H (available from Esso Standard Oil Co.) by a developing apparatus having a pair of plane developing electrodes under the application of +400 volts of bias voltage to electrically deposit toners on the exposed areas of the electrophotographic material and then the developed electrophotographic material was rinsed in a bath of Isoper H to remove background contamination in the non-image areas.

The above procedure was repeated using each information of magenta, cyan and black instead of the information of yellow.

The image formed on the obtained electrophotographic material after image-form production was fixed using a heat roller.

Subsequently, coated paper (regular printing paper) was laid on the electrophotographic material having fixed image and then transferred at a speed of 10 mm/sec between a pair of rubber rollers which were in contact each other under a pressure of 15 $kgf/cm^2$ and whose surfaces were constantly maintained at 120° C.

After being cooled to room temperature, the coated paper was separated from the electrophotographic material. Image formed on the coated paper was visually evaluated regarding fog and image quality.

The above procedures were repeated using the electrophotographic material obtained in Comparative Example A.

In the case of using the electrophotographic material for color proofing obtained in Example 1, all of the toners deposited on the electrophotographic material were transferred by heat to the coated paper together with the removable layer and a suitable mat was produced on the surface of the removable layer so that clear image without background contamination was obtained. The obtained image had the same image quality as that of the original.

The toners transferred on the coated paper were covered with the thermoplastic resin of the removable layer so that these toners were not rubbed off and thereby the image had sufficient strength.

Therefore, it revealed that the electrophotographic material according to the present invention showed excellent properties as an electrophotographic material for color proofing.

EXAMPLE 2

A mixture of 200 g of photoconductive zinc oxide, 80 g of binder resin B-2 represented by the following formula, 8 g of resin P-25, 0.018 g of dye D-1 represented by the following formula, 0.20 g of phthalic anhydride and 300 g of toluene was charged in a ball mill and dispersed for 2 hours to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 110° C. for 10 minutes to obtain a photosensitive layer having 10 μm thickness.

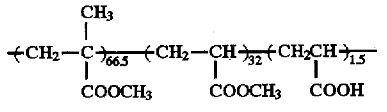

Binder Resin B-2

$\overline{Mw}$ 6.8 × $10^4$

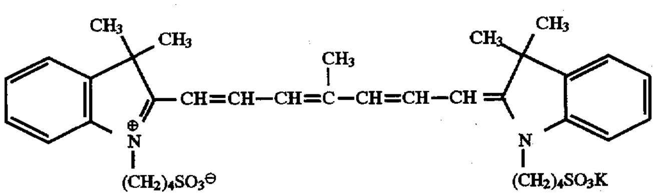

Dye D-1

In the case of using the electrophotographic material for color proofing obtained in Comparative Example A, the separation of the coated paper from the electrophotographic material failed so that the photosensitive layers on the coated paper and the electrophotographic material were destroyed. Thus, it revealed that this electrophotographic material for color proofing did not have performance required of electrophotographic material for color proofing.

Further, the releasability of the electrophotographic material obtained in Example 1 was evaluated as follows. Tack strength of a surface of the photoconductive layer of the electrophotographic material which is to be contacted with the transfer layer was measured in accordance with Tape and Sheet test of JIS Z0237-1980, before the transfer layer was applied thereon. The same procedures were repeated using the photoconductive layer formed in Comparative Example A. tack strength of the photoconductive layer formed in Example 1 was 0 g·f, whereas tack strength of the photoconductive layer formed in Comparative Example A was 370 g·f. The lower value means the better releasability.

It is believed that the above difference between the results of Example 1 and Comparative Example A depends on the formation of the interface having excellent release properties due to the concentration and the migration of the fluorine atom-containing copolymer near the surface of the photoconductive layer at the time of the formation of the photoconductive layer.

The above results demonstrate that sufficient image quality was not obtained by the plate Comparative Example A using the random copolymer of the prior art but obtained by the plate of Example 1 according to the present invention using the block copolymer.

The same solution of the thermoplastic resin as that of Example 1 was prepared, coated on the photosensitive layer and dried in the same procedure as that of Example 1 to form a transfer removable layer on the photosensitive layer.

Comparative Example B

An electrophotographic material for color proofing was prepared in the same manner as that of Example 1 except that the mixture without polymer P-25 was used.

Test Example

An adhesive-backed tape was attached to the surface of the transfer layer obtained in Example 2 and peeled off. As a result, only the removable layer was easily separated from the photosensitive layer.

The electrophotographic material obtained in Example 2 was charged by corona discharge to −600 volts in dark. The charged electrophotographic material was imagewise exposed to light by a semiconductor laser (oscillation wavelength 780 nm) with 25 $erg/cm^3$ of irradiation measured on the surface of the electrophotographic material in a mode of positive mirror image, based on the information about yellow color. The residual voltage on the exposed areas was −120 volts.

Subsequently, the exposed electrophotographic material was positively developed using a yellow toner for VERSATECK 3000 (color electrostatic plotter available from Xerox Co.) diluted with a 50-fold amount of Isoper H by a developing apparatus having a pair of plane developing electrodes under the application of −200 volts of bias voltage to electrically deposit toners on the unexposed areas of the electrophotographic material and then the developed electrophotographic material was rinsed in a bath of Isoper H to remove background contamination in the non-image areas.

The above procedure was repeated using each information of magenta, cyan and black instead of the information of yellow.

Subsequently, coated paper was laid on the electrophotographic material developed with the four color toners and then transferred at a speed of 6 mm/sec between a pair of rubber rollers which were in contact each other under a pressure of 10 kgf/$cm^2$ and whose surfaces were constantly maintained at 120° C.

After being cooled to room temperature, the coated paper was separated from the electrophotographic material.

In the case of using the electrophotographic material for color proofing obtained in Example 2, whole image formed on the coated paper was transferred by heat to the coated paper together with the removable layer and a suitable mat was produced on the surface of the removable layer. There was little difference between the image quality of the obtained image and that of an image obtained by printing.

The toners transferred on the coated paper were covered with the thermoplastic resin of the removable layer so that these toners were not rubbed off.

In the case of using the electrophotographic material for color proofing obtained in Comparative Example B, the separation of the coated paper from the electrophotographic material failed so that the photosensitive layers on the coated paper and the electrophotographic material were destroyed. Thus, it revealed that this el ectrophotographic material for color proofing did not have performance required of electrophotographic material for color proofing.

Further, the releasability of the electrophotographic material obtained in Example 2 was evaluated as follows. Tack strength of a surface of the photoconductive layer of the electrophotographic material which is to be contacted with the transfer layer was measured in accordance with Tape and Sheet test of JIS Z0237-1980, before the transfer layer was applied thereon. The same procedures were repeated using the photoconductive layer formed in Comparative Example B. tack strength of the photoconductive layer formed in Example 2 was 5 g·f, whereas tack strength of the photoconductive layer formed in Comparative Example B was 380 g·f. The lower value means the better releasability.

It is believed that the above difference between the results of Example S and Comparative Example B depends on the formation of the interface having excellent release properties due to the concentration and the migration of the fluorine atom-containing copolymer near the surface of the photoconductive layer at the time of the formation of the photoconductive layer.

The above results demonstrate that sufficient image quality was not obtained by the plate Comparative Example B using the random copolymer of the prior art but obtained by the plate of Example 2 according to the present invention using the block copolymer.

EXAMPLE 3

Five grams of 4,4'-bis(diethylamino)-2,2'-dimethyl triphenylmethane as a photoconductive material, 4 g of binder resin B-3 represented by the following formula, 0.8 g of resin P-15, 40 mg of dye D-2 represented by the following formula, and 0.20 g of anilide compound B represented by the following formula as a chemical sensitizer were dissolved in a mixture of 30 ml of methylene chloride and 30 ml of ethylene chloride to prepare a solution for a photosensitive layer.

The solution was coated with a wire-wound rod on an electrically-conductive transparent substrate which comprises a polyethylene terephthalate substrate (100 μm in thickness) having deposited thereon indium oxide film and has a surface resistance of $10^3\Omega$ to form a photosensitive layer having about 4 μm thickness.

Binder Resin B-3

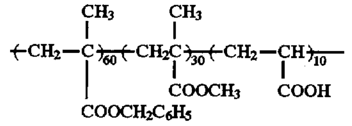

$\overline{Mw}$ $8 \times 10^4$

Dye D-2

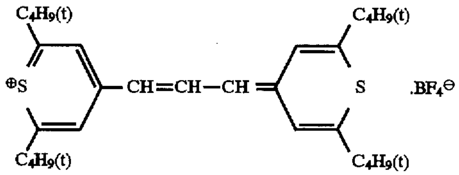

Anilide Compound B

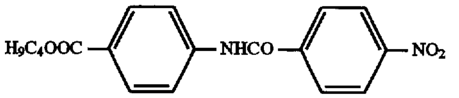

The results obtained in an adhesion test with an adhesive-backed tape revealed that the adhesion of the photosensitive layer comprising block copolymer P-15 to the base was one-fiftieths compared with a photosensitive layer without block copolymer P-15. The results demonstrate the maldistribution of the block copolymer to the surface of the photosensitive layer.

The same solution of the thermoplastic resin as that of Example 1 was prepared, coated on the photosensitive layer and dried in the same procedure as that of Example 1 to form a transfer removable layer on the photosensitive layer. An adhesive-backed tape was attached to the surface of the removable layer and peeled off. As a result, only the removable layer was easily separated from the photosensitive layer as shown in the removable layer of Example 2.

The image quality and the transfer properties of the electrophotographic material thus obtained were evaluated in the same manner as that of Example 1 except that a He—Ne laser having an oscillation wavelength of 630 nm was used instead of the semiconductor laser having an oscillation wavelength of 780 nm.

A clear color copy image without background contamination was obtained on coated paper after transfer. The image had sufficient strength.

EXAMPLE 4

A mixture of 5 g of bis-azo pigment represented by the following formula, 95 g of tetrahydrofuran, and 30 g of a solution of polyester resin Byron 200 (avalable from TOYOBO CO., LTD), 5 g in tetrahydrofuran was sufficiently ground in a ball mill. Then, the mixture was drawn and 520 g of tetrahydrofuran were added thereto while stirring. The obtained dispersion was coated with a wire-wound rod on the same electrically-conductive transparent substrate as that used in Example 3 to form a charge generation layer having about 0.7 μm thickness.

A clear color copy image without background contamination was obtained on coated paper after transfer. The image had sufficient strength.

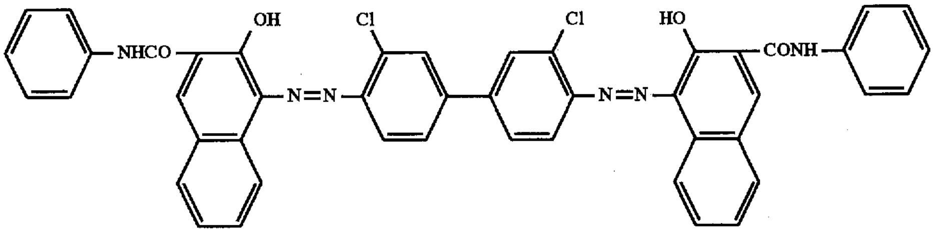

Bis-azo Pigment

Subsequently, a solution consisting of 20 g of a hydrazone compound represented by the following formula, 20 g of polycarbonate resin Lexan 121 (available from GE Co.), 3 g of resin P-49 represented by the following formula and 160 g of tetrahydrofuran was coated with a wire-wound rod on the charge generation layer to form a charge transport layer having thickness of about 18 μm. Thus, the obtained electrophotographic receptor comprised the two functional layers of the charge generation layer and the charge transport layer.

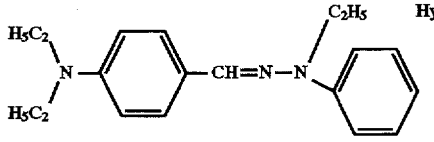

Hydrazone Compound

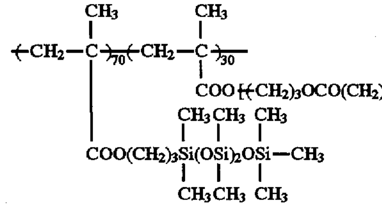

Resin P-49

Mw 4.3 × $10^4$ (Mw of the macromonomer portion: 3 × $10^3$)

The same solution of the thermoplastic resin as that of Example 1 was prepared, coated on the photosensitive layer and dried in the same procedure as that of Example 1 to form a transfer removable layer on the photosensitive layer.

The image quality and the transfer properties of the electrophotographic material thus obtained were evaluated in the same manner as that of Example 3.

EXAMPLES 5–34

Electrophotographic material for color proofing were prepared in the same manner as that of Example 2 except that 10 g of a resin P shown in the following Table VIII was used instead of 8 g of resin P-25.

TABLE VIII

| | | | | | | | | | | |
|---|---|---|---|---|---|---|---|---|---|---|
| Example | 5 | 6 | 7 | 8 | 9 | 10 | 11 | 12 | 13 | 14 | 15 |
| Resin [P] | P-1 | P-3 | P-4 | P-5 | P-8 | P-9 | P-10 | P-11 | P-13 | P-15 | P-16 |
| Example | 16 | 17 | 18 | 19 | 20 | 21 | 22 | 23 | 24 | 25 | |
| Resin [P] | P-19 | P-22 | P-23 | P-24 | P-26 | P-27 | P-29 | P-32 | P-35 | P-37 | |
| Example | 26 | 27 | 28 | 29 | 30 | 31 | 32 | 33 | 34 | | |
| Resin [P] | P-38 | P-39 | P-41 | P-42 | P-44 | P-45 | 2-46 | P-47 | P-48 | | |

The image quality and the transfer properties of each of the electrophotographic material thus obtained were evaluated in the same manner as that of Example 2.

Clear color copy images without background contamination were obtained on coated paper after transfer. The images had sufficient strength.

EXAMPLE 35

An electrophotographic material for color proofing was prepared in the same manner as that of Example 2 except that 10 g of resin particles L-1 and 0.020 g of dye D-3 represented by the following formula were used instead of 8 g of resin P-25 and 0.018 g of dye D-1.

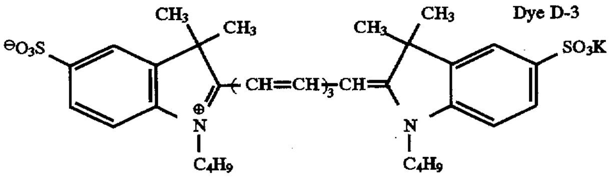

Dye D-3

A plate for color matching was prepared from this electrophotographic material in the same procedure as that of Example 2.

The obtained color copy image had no background contamination to produce a proof having clear image quality.

EXAMPLES 36–53

Electrophotographic material for color proofing were prepared in the same manner as that of Example 35 except that 11 g of resin particles L shown in the following Table IX was used instead of 10 g of resin particles L-1.

TABLE IX

| Example | 36 | 37 | 38 | 39 | 40 | 41 | 42 | 43 | 44 |
|---|---|---|---|---|---|---|---|---|---|
| Resin Particles L | L-2 | L-3 | L-4 | L-5 | L-6 | L-7 | L-8 | L-9 | L-10 |
| Example | 45 | 46 | 47 | 48 | 49 | 50 | 51 | 52 | 53 |
| Resin Particles L | L-11 | L-12 | L-13 | L-14 | L-15 | L-16 | 1-17 | L-18 | L-19 |

The image quality and the transfer properties of each of the electrophotographic material thus obtained were evaluated in the same manner as that of Example 2.

Clear color copy images without background contamination were obtained on coated paper after transfer. The images had sufficient strength.

EXAMPLES 54–58

Electrophotographic material for color proofing were prepared in the same manner as that of Example 2 except that a combination of a thermoplastic resin with a solvent for coating shown in the following Table X was used instead of the thermoplastic resin poly(vinyl acetate/crotonic acid) (molar ratio 95/5) of the transfer removable layer.

TABLE X

| Example | Thermoplastic | Solvent for Coating |
|---|---|---|
| 54 | Cellulose acetate butyrate: Cellidor Bsp (available from Bayer AG) | Ethyl acetate |
| 55 | Polyvinyl butyral resin: ESLECK (available from Sekisui Chemical Co.,Ltd) | Ethanol |
| 56 | Cellulose propionate: CELLIDORIA (available from DAICEL CHEMICAL INDUSTRIES, LTD) | Ethyl acetate |
| 57 | Poly(vinyl acetate) | Methyl ethyl ketone |
| 58 | Poly(vinyl acetate/crotonic acid) (molar ratio 95/5) and Cellidor Bsp (ratio by weight 8/2) | Ethanol solution containing 1% Aqueous Ammonia |

The image quality and the transfer properties of each of the electrophotographic material thus obtained were evaluated in the same manner as that of Example 2. As a result, the same excellent levels of the performances were achieved.

EXAMPLE 101

A mixture of 1 g of metal-free X-form phthalocyanine (available from DAINIPPON INK AND CHEMICALS, INC.), 10 g of binder resin B-1, 0.3 g of resin P-105, 0.15 g of compound A and 80 g of tetrahydrofuran was charged together with glass beads in a 500-ml glass container and dispersed by a paint shaker (available from TOYO SEIKI SEISAKUSHO) for 60 minutes. Then, 0.03 g of ethylene glycol diglycidyl ether were added the dispersion and dispersed for 2 minutes. The glass beads were separated by filtration to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 110° C. for 20 seconds and at 140° C. for 1 hour to obtain a photosensitive layer having 8 μm thickness.

A solution having the following contents was then prepared to form a transfer removable layer on the photosensitive layer.

| | |
|---|---|
| Poly(vinyl acetate/crotonic acid) (95/5, Mw 5 × $10^4$) | 3 g |
| 28% Aqueous Ammonia | 1 g |
| Ethanol | 97 g |

After the above solution was coated with a wire bar on the photosensitive layer, the coating was dried in an oven at 120° C. for 20 seconds to prepare an electrophotographic material for color proofing, comprising a transfer removable layer having 1.3 μm thickness.

The image quality and the transfer properties of the electrophotographic material for color proofing obtained in Example 101 were evaluated as follows:

The electrophotographic material of Example 101 was charged by corona discharge to +450 volts in dark. The charged el ectrophotographic material was imagewise exposed to light by a Ga—Al—As semiconductor laser (oscillation wavelength 780 nm) having 5 mW of output power with 30 erg/$cm^3$ of irradiation measured on the el ectrophotographic material in a pitch of 25 μm at a scanner speed of 300 cm/sec in a mode of negative mirror image, based on the information about yellow color among information about yellow, magenta, cyan and black, which were recorded in a harddisk of a system as digital image data which were obtained by reading an original using a color scanner and conducting color separation and correction regarding some color reproductions specific to the system. Subsequently, the exposed electrophotographic material was reversally developed using a yellow liquid developer for a signature system (available from Eastman Kodak) 75-fold (by weight) diluted with Isoper H (available from Esso Standard Oil Co.) by a developing apparatus having a pair of plane developing electrodes under the application of +400 volts of bias voltage to electrically deposit toners on the exposed areas of the electrophotographic material and then the developed electrophotographic material was rinsed in a bath of Isoper H to remove background contamination in the non-image areas.

The above procedure was repeated using each information of magenta, cyan and black instead of the information of yellow.

The image formed on the obtained electrophotographic material after image-form production was fixed using a heat roller.

Subsequently, coated paper (regular printing paper) was laid on the electrophotographic material having fixed image and then transferred at a speed of 10 mm/sec between a pair of rubber rollers which were in contact each other under a pressure of 15 kgf/cm$^2$ and whose surfaces were constantly maintained at 120° C.

After being cooled to room temperature, the coated paper was separated from the electrophotographic material. Image formed on the coated paper was visually evaluated regarding fog and image quality.

All of the toners deposited on the electrophotographic material were transferred by heat to the coated paper together with the removable layer and a suitable mat was produced on the surface of the removable layer so that clear image without background contamination was obtained. The obtained image had the same image quality as that of the original.

The toners transferred on the coated paper were covered with the thermoplastic resin of the removable layer so that these toners were not rubbed off and thereby the image had sufficient strength.

Therefore, it revealed that the electrophotographic material according to the present invention showed excellent properties as an electrophotographic material for color proofing.

EXAMPLE 102

A mixture of 200 g of photoconductive zinc oxide, 80 g of binder resin B-102 represented by the following formula, 8 g of resin P-103, 0.018 g of dye D-1, 0.20 g of N-hydroxy succinic acid imido and 300 g of toluene was charged in a homogenizer (NIHON SEIKI CO., LTD) and dispersed at $7\times10^3$ rpm for 10 minutes.

After 0.3 g of phthalic anhydride and 0.01 of o-chlorophenol were added to the dispersion, the mixture was dispersed at $1\times10^3$ rpm for 1 minute to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 140° C. for 2 hours to obtain a photosensitive layer having 10 μm thickness.

Binder Resin B-102

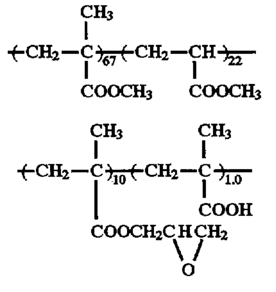

$\overline{M}w$ 7.6 × 10$^4$

The results obtained in an adhesion test with an adhesive-backed tape revealed that the adhesion of the photosensitive layer comprising block copolymer P-103 to the base was one-sixtieths compared with a photosensitive layer without block copolymer P-103. The results demonstrate the maldistribution of the block copolymer to the surface of the photosensitive layer.

The same solution of the thermoplastic resin as that of Example 101 was prepared, coated on the photosensitive layer and dried in the same procedure as that of Example 101 to form a transfer removable layer on the photosensitive layer. An adhesive-backed tape was attached to the surface of the removable layer and peeled off. As a result, only the removable layer was easily separated from the photosensitive layer.

The electrophotographic material thus obtained was charged by corona discharge to −600 volts in dark. The charged electrophotographic material was imagewise exposed to light by a semiconductor laser (oscillation wavelength 780 nm) with 25 erg/cm$^3$ of irradiation measured on the surface of the electrophotographic material in a mode of positive mirror image, based on the information about yellow color. The residual voltage on the exposed areas was −120 volts. Subsequently, the exposed electrophotographic material was positively developed using a yellow toner for VERSATECK 3000 (color electrostatic plotter available from Xerox Co.) diluted with a 50-fold amount of Isoper H by a developing apparatus having a pair of plane developing electrodes under the application of −200 volts of bias voltage to electrically deposit toners on the unexposed areas of the electrophotographic material and then the developed electrophotographic material was rinsed in a bath of Isoper H to remove background contamination in the non-image areas.

The above procedure was repeated using each information of magenta, cyan and black instead of the information of yellow.

Subsequently, coated paper was laid on the electrophotographic material developed with the four color toners and then transferred at a speed of 6 mm/sec between a pair of rubber rollers which were in contact each other under a pressure of 10 kgf/cm$^2$ and whose surfaces were constantly maintained at 120° C.

After being cooled to room temperature, the coated paper was separated from the electrophotographic material. Whole image formed on the coated paper was transferred by heat to the coated paper together with the removable layer and a suitable mat was produced on the surface of the removable layer. There was little difference between the image quality of the obtained image and that of an image obtained by printing.

The toners transferred on the coated paper were covered with the thermoplastic resin of the removable layer so that these toners were not rubbed off.

EXAMPLE 103

Five grams of 4,4'-bis(diethylamino)-2,2'-dimethyl triphenylmethane as a photoconductive material, 4 g of binder resin B-103 represented by the following formula, 0.8 g of resin P-119, 40 mg of dye D-2, and 0.20 g of anilide compound B as a chemical sensitizer were dissolved in a mixture of 30 ml of methylene chloride and 30 ml of ethylene chloride to prepare a solution for a photosensitive layer.

The solution was coated with a wire-wound rod on an electrically-conductive transparent substrate which comprises a polyethylene terephthalate substrate (100 μm in thickness) having deposited thereon indium oxide film and has a surface resistance of $10^3\Omega$ to form a photosensitive layer having about 4 μm thickness.

Binder Resin B-103

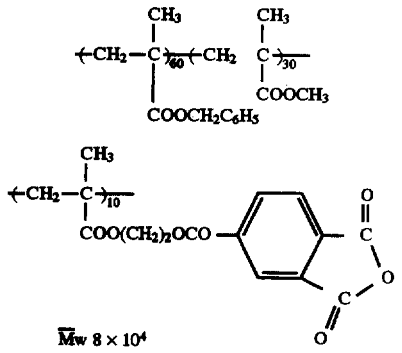

Mw 8 × $10^4$

The results obtained in an adhesion test with an adhesive-backed tape revealed that the adhesion of the photosensitive layer comprising block copolymer P-119 to the base was one-seventieths compared with a photosensitive layer without block copolymer P-119. The results demonstrate the maldistribution of the block copolymer to the surface of the photosensitive layer.

The same solution of the thermoplastic resin as that of Example 101 was prepared, coated on the photosensitive layer and dried in the same procedure as that of Example 101 to form a transfer removable layer on the photosensitive layer. An adhesive-backed tape was attached to the surface of the removable layer and peeled off. As a result, only the removable layer was easily separated from the photosensitive layer as shown in the removable layer of Example 102.

The image quality and the transfer properties of the electrophotographic material thus obtained were evaluated in the same manner as that of Example 101 except that a He—Ne laser having an oscillation wavelength of 630 nm was used instead of the semiconductor laser having an oscillation wavelength of 780 nm.

A clear color copy image without background contamination was obtained on coated paper after transfer. The image had sufficient strength.

EXAMPLE 104

A mixture of 5 g of the same bis-azo pigment as that used in Example 4, 95 g of tetrahydrofuran, and 30 g of a solution of polyester resin Byron 200 (avalable from TOYOBO CO., LTD), 5 g in tetrahydrofuran was sufficiently ground in a ball mill. Then, the mixture was drawn and 520 g of tetrahydrofuran were added thereto while stirring. The obtained dispersion was coated with a wire-wound rod on the same electrically-conductive transparent substrate as that used in Example 103 to form a charge generation layer having about 0.7 μm thickness.

Subsequently, a solution consisting of 20 g of the same hydrazone compound as that used in Example 4, 20 g of polycarbonate resin Lexan 121 (available from GE Co.), 2 g of resin P-102, 0.04 g of isophorone di-isocyanate, 0.001 g of tetrabutoxy titanate and 160 g of tetrahydrofuran was coated with a wire-wound rod on the charge generation layer to form a charge transport layer having thickness of about 18 μm. Thus, the obtained electrophotographic receptor comprised the two functional layers of the charge generation layer and the charge transport layer.

The same solution of the thermoplastic resin as that of Example 101 was prepared, coated on the photosensitive layer and dried in the same procedure as that of Example 101 to form a transfer removable layer on the photosensitive layer.

The image quality and the transfer properties of the electrophotographic materials thus obtained were evaluated in the same manner as that of Example 103.

A clear color copy image without background contamination was obtained on coated paper after transfer. The image had sufficient strength.

EXAMPLES 105–110

Electrophotographic materials for color proofing were prepared in the same manner as that of Example 101 except that 0.2 g of a resin shown in the following Table 106 were used instead of 0.3 g of resin P-105.

TABLE 106

| Example | 5 | 6 | 7 | 8 | 9 | 10 |
|---|---|---|---|---|---|---|
| Resin [P] | P-118 | P-103 | P-123 | P-116 | P-119 | P-135 |

The image quality and the transfer properties of each of the electrophotographic materials thus obtained were evaluated in the same manner as that of Example 1.

Clear color copy images without background contamination were obtained on coated paper after transfer. The images had sufficient strength.

EXAMPLES 111–116

An electrophotographic material for color proofing was prepared in the same manner as that of Example 102 except that 8 g of a resin P shown in the following Table 107, compounds for crosslinking shown in the following Table 107 to amount and 0.020 g of dye D-3 were used instead of 8 g of resin P-103, 0.018 g of dye D-1, 0.3 g of phthalic anhydride and 0.01 g of o-chlorophenol.

TABLE 107

| Example | Resin P | Compounds for Crosslinking | Amount |
|---|---|---|---|
| 111 | P-101 | 1,2,4,5-Benzentetracarboxylic dianhydride | 0.5 g |
| | | D-Cresol | 0.01 g |
| 112 | P-110 | Gluconic anhydride | 0.2 g |
| | | Zirconium stearate | 0.008 g |
| 113 | P-112 | Phthalic anhydride | 0.25 g |
| | | Phenol | 0.007 g |
| 114 | P-114 | Phthalic anhydride | 0.25 g |
| | | Phenol | 0.007 g |
| 115 | P-116 | Succinic anhydride | 0.23 g |
| | | Propionic acid | 0.002 g |
| 116 | P-136 | Phthalic anhydride | 0.3 g |
| | | p-Cyanophenol | 0.01 g |

An electrophotographic material for color proofing was prepared from each of the obtained electrophotographic materials in the same procedure as that of Example 102. The obtained color copy images had no background contamination to produce proofs having clear image quality.

EXAMPLES 117–127

A mixture of 200 g of photoconductive zinc oxide, 70 g of binder resin B-104 represented by the following formula, 0.019 g of dye D-104 represented by the following formula, 0.018 g of N-hydroxy maleic imido and 300 g of toluene was charged in a homogenizer and dispersed at 7×$10^3$ rpm for 10 minutes.

After 6 g of a resin P shown in the following Table 108 and compounds for crosslinking shown in the following Table 108 to amount were added to the dispersion, the mixture was dispersed at 1×$10^3$ rpm for 1 minute.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 140° C. for 2 hours to obtain a photosensitive layer having 10 μm thickness.

The same solution of the thermoplastic resin as that of Example 101 was prepared, coated on the photosensitive layer and dried in the same procedure as that of Example 101 to form a transfer removable layer on the photosensitive layer.

Binder Resin B-104

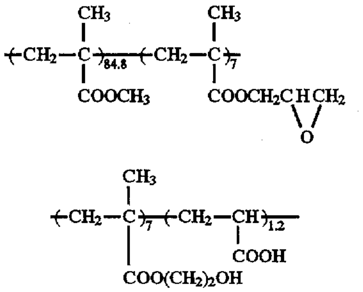

$\overline{M}w$ 8 × 10⁴

Dye D-104

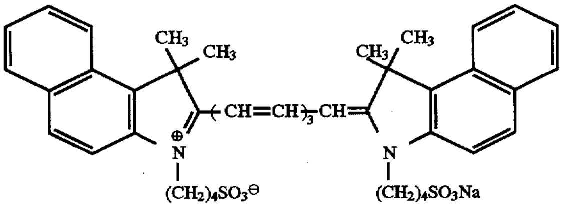

TABLE 108

| Example | Resin P | Compounds for Crosslinking | Amount |
|---|---|---|---|
| 117 | P-131 | Phthalic anhydride | 0.2 g |
| | | Acetylacetone zirconium salt | 0.01 g |
| 118 | P-105 | Gluconic acid | 0.008 g |
| 119 | P-107 | N-Methylamino propanol | 0.25 g |
| | | Tin dibutyl dilaurate | 0.001 g |
| 120 | P-112 | N,N'-Dimethylamino propane | 0.3 g |
| 121 | P-114 | Propylene glycol | 0.2 g |
| | | Tetrakis(2-ethylhexane diolate)titanium | 0.008 g |
| 122 | P-116 | — | |
| 123 | P-121 | N,N-Diethylpropane diamine | 0.25 g |
| 124 | P-129 | Divinyl adipate | 0.3 g |
| | | 2,2'-azobis(isobutyronitrile) | 0.001 g |
| 125 | P-132 | — | |
| 126 | P-134 | N,N-Diethyl butane diamine | 0.3 g |
| 127 | P-128 | — | |

The image quality and the transfer properties of each of the electrophotographic materials thus obtained were evaluated in the same manner as that of Example 102.

Clear color copy images without background contamination were obtained on coated paper after transfer. The images had sufficient strength.

EXAMPLES 128–134

Electrophotographic material for color proofing were prepared in the same manner as that of Example 117 except that a combination of 60 g of a binder resin B, 7 g of a resin P and compounds for crosslinking to amount, shown in the following Table 109 was used.

TABLE 109

| Example | Binder Resin B (ratio by weight) | Resin P | Compounds for Crosslinking |
|---|---|---|---|
| 128 | B-105 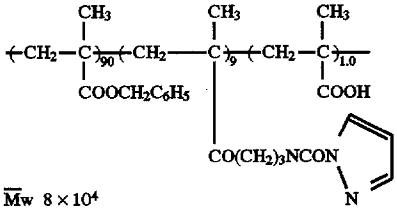 $\overline{M}w$ 8 × 10⁴ | P-121 | 1,6-Hexane-diamine 0.4 g |
| 129 | B-106 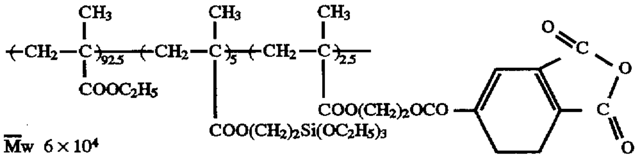 $\overline{M}w$ 6 × 10⁴ | P-118 | γ-glycide-propyl tri-methoxy-silane 0.1 g |

TABLE 109-continued

| Example | Binder Resin B (ratio by weight) | Resin P | Compounds for Crosslinking |
|---|---|---|---|
| 130 | B107 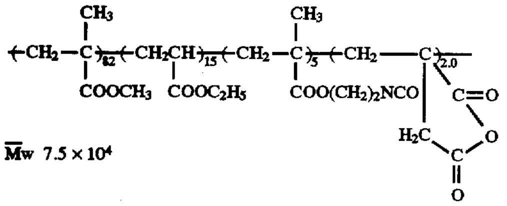 Mw $7.5 \times 10^4$ | P-125 | 1,4-Butanediol 0.3 g Tin dibutoxydilaurate 0.001 g |
| 131 | B-108 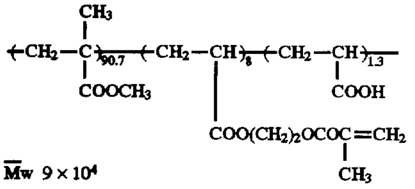 Mw $9 \times 10^4$ | P-129 | Ethylene glycol dimethacrylate 2.0 g 2,2'-azobis-(isovaleronitrile) 0.03 g |
| 132 | B-109 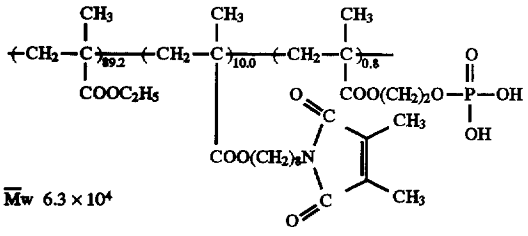 Mw $6.3 \times 10^4$ | P-123 | Benzoyl peroxide 0.008 g |
| 133 | B-110 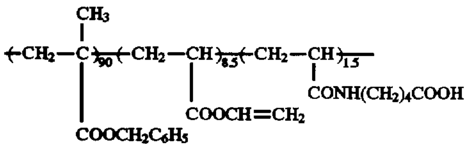 Mw $9.5 \times 10^4$ | P-129 | Divinyladipate 2.2 g 2,2'-azobis-(isobutyronitrile) 0.01 g |
| 134 | B-111 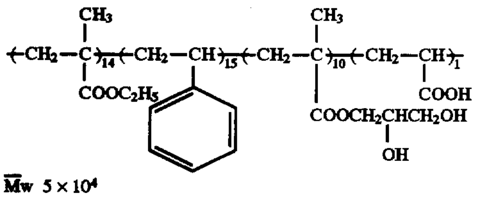 Mw $5 \times 10^4$ | P-122 | Block isocyanate: BarknockD-500 (DIK Co., Ltd.) 3 g Dimer of Butyltitanate 0.02 g |

The image quality and the transfer properties of each of the electrophotographic materials thus obtained were evaluated in the same manner as that of Example 102.

Clear color copy images without background contamination were obtained on coated paper after transfer. The images had sufficient strength.

EXAMPLES 135–139

Electrophotographic materials for color proofing were prepared in the same manner as that of Example 102 except that a combination of a thermoplastic resin with a solvent for coating shown in the following Table 110 was used instead of the thermoplastic resin poly(vinyl acetate/crotonic acid) (molar ratio 95/5) of the transfer removable layer.

TABLE 110

| Example | Thermoplastic Resin | Solvent for Coating |
|---|---|---|
| 135 | Cellulose acetate butyrate: Cellidor Bsp (available from Bayer AG) | Ethyl acetate |
| 136 | Polyvinyl butyral resin: ESLECK (available from Sekisui Chemical Co.,Ltd) | Ethanol |
| 137 | Cellulose propionate: CELLIDORIA (available from DAICEL CHEMICAL INDUSTRIES, LTD) | Ethyl acetate |
| 138 | Poly(vinyl acetate) | Methyl ethyl ketone |
| 139 | Poly(vinyl acetate/crotonic acid) (molar ratio 95/5) and | Ethanol solution containing |

TABLE 110-continued

| Example | Thermoplastic Resin | Solvent for Coating |
|---|---|---|
| | Cellidor Bsp (ratio by weight 8/2) | 1% Aqueous Ammonia |

The image quality and the transfer properties of each of the electrophotographic materials thus obtained were evaluated in the same manner as that of Example 102. As a result, the same excellent levels of the performances were achieved.

EXAMPLE 201

A mixture of 1 g of metal-free X-form phthalocyanine (available from DAINIPPON INK AND CHEMICALS, INC.), 10 g of binder resin Q-201 represented by the following formula, 0.3 g of resin P-241, 0.15 g of compound A and 80 g of tetrahydrofuran was charged together with glass beads in a 500-ml glass container. The mixture was dispersed by a paint shaker (available from TOYO SEIKI SEISAKUSHO) for 60 minutes. After 0.03 g of ethylene glycol diglycidyl ether were added to the dispersion, the mixture was dispersed for 2 minutes. Then, the glass beads were separated by filtration to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 110° C. for 20 seconds and at 140° C. for 1 hour to obtain a photosensitive layer having 8 μm thickness.

Binder Resin Q-201

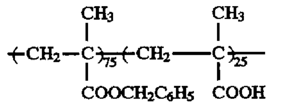

(molar ratio)

$\overline{Mw}$ 6.5 × $10^4$

A solution having the following contents was then prepared to form a transfer removable layer on the photosensitive layer.

| | |
|---|---|
| Poly(vinyl acetate/crotonic acid) (95/5, Mw 5 × $10^4$) | 3 g |
| 28% Aqueous Ammonia | 1 g |
| Ethanol | 97 g |

After the above solution was coated with a wire bar on the photosensitive layer, the coating was dried in an oven at 120° C. for 20 seconds to prepare an electrophotographic material for color proofing, comprising a transfer removable layer having 1.3 μm thickness.

The image quality and the transfer properties of the electrophotographic material for color proofing obtained in Example 201 was evaluated as follows:

The electrophotographic material of Example 201 was charged by corona discharge to +450 volts in dark. The charged el ectrophotographic material was imagewise exposed to light by a Ga—Al—As semiconductor laser (oscillation wavelength 780 nm) having 5 mW of output power with 30 erg/$cm^3$ of irradiation measured on the el ectrophotographic material in a pitch of 25 μm at a scanner speed of 300 cm/sec in a mode of negative mirror image, based on the information about yellow color among information about yellow, magenta, cyan and black, which were recorded in a harddisk of a system as dijital image data which were obtained by reading an original using a color scanner and conducting color separation and correction regarding some color reproductions specific to the system. Subsequently, the exposed electrophotographic material was reversally developed using a yellow liquid developer for a signature system (available from Eastman Kodak) 75-fold (by weight) diluted with Isoper H (available from Esso Standard Oil Co.) by a developing apparatus having a pair of plane developing electrodes under the application of +400 volts of bias voltage to electrically deposit toners on the exposed areas of the electrophotographic material and then the developed electrophotographic material was rinsed in a bath of Isoper H to remove background contamination in the non-image areas.

The above procedure was repeated using each information of magenta, cyan and black instead of the information of yellow.

The image formed on the obtained electrophotographic material after image-form production was fixed using a heat roller.

Subsequently, coated paper (regular printing paper) was laid on the electrophotographic material having fixed image and then transferred at a speed of 10 mm/sec between a pair of rubber rollers which were in contact each other under a pressure of 15 kgf/$cm^2$ and whose surfaces were constantly maintained at 120° C.

After being cooled to room temperature, the coated paper was separated from the electrophotographic material. Image formed on the coated paper was visually evaluated regarding fog and image quality.

All of the toners deposited on the electrophotographic material were transferred by heat to the coated paper together with the removable layer and a suitable mat was produced on the surface of the removable layer so that clear image without background contamination was obtained. The obtained image had the same image quality as that of the original.

The toners transferred on the coated paper were covered with the thermoplastic resin of the removable layer so that these toners were not rubbed off and thereby the image had sufficient strength.

Therefore, it revealed that the electrophotographic material according to the present invention showed excellent properties as an electrophotographic material for color proofing.

EXAMPLE 202

A mixture of 200 g of photoconductive zinc oxide, 80 g of binder resin Q-202 represented by the following formula, 8 g of resin P-201, 0.018 g of dye D-1, 0.20 g of N-hydroxy succinic acid imido and 300 g of toluene was charged in a homogenizer (available from NIHON SEIKI CO., LTD) and dispersed at 7×$10^3$ rpm for 10 minutes.

After 0.3 g of phthalic anhydride and 0.01 g of o-chlorophenol were added to the dispersion, the mixture was dispersed at 1×$10^3$ rpm for 1 minute to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 140° C. to obtain a photosensitive layer having 10 μm thickness.

Binder Resin Q-202

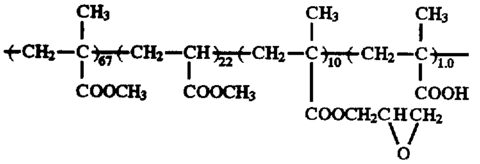

Mw 7.6 × $10^4$

The results obtained in an adhesion test with an adhesive-backed tape revealed that the adhesion of the photosensitive layer comprising star-type copolymer P-203 to the base was one-sixtieths compared with a photosensitive layer without star-type copolymer P-203. The results demonstrate-the maldistribution of the star-type copolymer to the surface of the photosensitive layer.

The same solution of the thermoplastic resin as that of Example 201 was prepared, coated on the photosensitive layer and dried in the same procedure as that of Example 201 to form a transfer removable layer on the photosensitive layer. An adhesive-backed tape was attached to the surface of the removable layer and peeled off. As a result, only the removable layer was easily separated from the photosensitive layer.

The electrophotographic material thus obtained was charged by corona discharge to −600 volts in dark. The charged electrophotographic material was imagewise exposed to light by a semiconductor laser (oscillation wavelength 780 nm) with 25 $erg/cm^3$ of irradiation measured on the surface of the electrophotographic material in a mode of positive mirror image, based on the information about yellow color. The residual voltage on the exposed areas was −120 volts. Subsequently, the exposed electrophotographic material was positively developed using a yellow toner for VERSATECK 3000 (color electrostatic plotter available from Xerox Co.) diluted with a 50-fold amount of Isoper H by a developing apparatus having a pair of plane developing electrodes under the application of −200 volts of bias voltage to electrically deposit toners on the unexposed areas of the electrophotographic material and then the developed electrophotographic material was rinsed in a bath of Isoper H to remove background contamination in the non-image areas.

The above procedure was repeated using each information of magenta, cyan and black instead of the information of yellow.

Subsequently, coated paper was laid on the electrophotographic material developed with the four color toners and then transferred at a speed of 6 mm/sec between a pair of rubber rollers which were in contact each other under a pressure of 10 $kgf/cm^2$ and whose surfaces were constantly maintained at 120° C.

After being cooled to room temperature, the coated paper was separated from the electrophotographic material. Whole image formed on the coated paper was transferred by heat to the coated paper together with the removable layer and a suitable mat was produced on the surface of the removable layer. There was little difference between the image quality of the obtained image and that of an image obtained by printing.

The toners transferred on the coated paper were covered with the thermoplastic resin of the removable layer so that these toners were not rubbed off.

EXAMPLE 203

Five grams of 4,4'-bis(diethylamino)-2,2'-dimethyl triphenylmethane as a photoconductive material, 4 g of binder resin Q-203 represented by the following formula, 0.8 g of resin P-219, 40 mg of dye D-2, and 0.20 g of anilide compound B as a chemical sensitizer were dissolved in a mixture of 30 ml of methylene chloride and 30 ml of ethylene chloride to prepare a solution for a photosensitive layer.

The solution was coated with a wire-wound rod on an electrically-conductive transparent substrate which comprises a polyethylene terephthalate substrate (100 μm in thickness) having deposited thereon indium oxide film and has a surface resistance of $10^3Ω$ to form a photosensitive layer having about 4 μm thickness.

Binder Resin Q-203

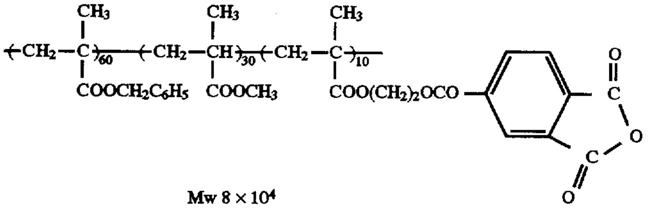

Mw 8 × $10^4$

The results obtained in an adhesion test with an adhesive-backed tape revealed that the adhesion of the photosensitive layer comprising star-type copolymer P-219 to the base was one-ninetieths compared with a photosensitive layer without star-type copolymer P-219. The results demonstrate the maldistribution of the star-type copolymer to the surface of the photosensitive layer.

The same solution of the thermoplastic resin as that of Example 201 was prepared, coated on the photosensitive layer and dried in the same procedure as that of Example 201 to form a transfer removable layer on the photosensitive layer. An adhesive-backed tape was attached to the surface of the removable layer and peeled off. As a result, only the removable layer was easily separated from the photosensitive layer as shown in the removable layer of Example 202.

The image quality and the transfer properties of the electrophotographic material thus obtained were evaluated in the same manner as that of Example 201 except that a He—Ne laser having an oscillation wavelength of 630 nm was used instead of the semiconductor laser having an oscillation wavelength of 780 nm.

A clear color copy image without background contamination was obtained on coated paper after transfer. The image had sufficient strength.

EXAMPLE 204

A mixture of 5 g of the same bis-azo pigment as that used in Example 4, 95 g of tetrahydrofuran, and 30 g of a solution of polyester resin Byron 200 (avalable from TOYOBO CO., LTD), 5 g in tetrahydrofuran was sufficiently ground in a ball mill. Then, the mixture was drawn and 520 g of tetrahydrofuran were added thereto while stirring. The obtained dispersion was coated with a wire-wound rod on the same electrically-conductive transparent substrate as that used in Example 203 to form a charge generation layer having about 0.7 μm thickness.

Subsequently, a solution consisting of 20 g of the same hydrazone compound as that used in Example 4, 20 g of polycarbonate resin Lexan 121 (available from GE Co.), 2 g of resin P-235, 0.04 g of isophorone diisocyanate, 0.001 g of tetrabutoxy titanate and 160 g of tetrahydrofuran was coated with a wire-wound rod on the charge generation layer. The coating was dried at 60° C. for 30 seconds and at 120° C. for 1 hour to form a charge transport layer having thickness of about 18 μm. Thus, the obtained electrophotographic receptor comprised the two functional layers of the charge generation layer and the charge transport layer.

The same solution of the thermoplastic resin as that of Example 201 was prepared, coated on the above photoreceptor and dried in the same procedure as that of Example 201 to form a transfer removable layer.

The image quality and the transfer properties of the electrophotographic material thus obtained were evaluated in the same manner as that of Example 203.

A clear color copy image without background contamination was obtained on coated paper after transfer. The image had sufficient strength.

EXAMPLES 205–210

Electrophotographic materials for color proofing were prepared in the same manner as that of Example 202 except that 8 g of a resin P shown in the following Table 206, compounds for crosslinking shown in the following Table 206 to amount and 0.020 g of dye D-3 were used instead of 8 g of resin P-201, 0.018 g of dye D-1, 0.3 g of phthalic anhydride and 0.01 g of o-chlorophenol.

TABLE 206

| Example | Resin P | Compounds for Crosslinking | Amount |
|---|---|---|---|
| 205 | P-203 | 1,2,4,5-Benzentetracarboxylic dianhydride | 0.5 g |
| | | D-Cresol | 0.01 g |
| 206 | P-250 | Gluconic anhydride | 0.2 g |
| | | Zirconium stearate | 0.008 g |
| 207 | P-216 | Phthalic enhydride | 0.25 g |
| | | Phenol | 0.007 g |
| 208 | P-239 | Phthalic anhydride | 0.30 g |
| | | Acetylacetonate zirconium | 0.001 g |
| 209 | P-232 | Phthalic anhydride | 0.30 g |
| | | Propionic acid | 0.002 g |
| 210 | P-244 | Phthalic anhydride | 0.30 g |
| | | p-Cyanophenol | 0.01 g |

The image quality and the transfer properties of each of the electrophotographic materials thus obtained were evaluated in the same manner as that of Example 202.

Clear color copy images without background contamination were obtained on coated paper after transfer. The images had sufficient strength.

EXAMPLES 211–227

A mixture of 200 g of photoconductive zinc oxide, 70 g of binder resin Q-204 represented by the following formula, 0.019 g of dye D-104, 0.018 g of N-hydroxy maleic imido and 300 g of toluene was charged in a homogenizer (NIHON SEIKI CO., LTD) and dispersed at $7\times10^3$ rpm for 10 minutes.

After 6 g of a resin P shown in Table 207 and compounds for crosslinking shown in Table 207 to amount were added to the dispersion, the mixture was dispersed at $1\times10^3$ rpm for 1 minute to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 140° C. to obtain a photosensitive layer having 10 μm thickness.

Binder Resin Q-204

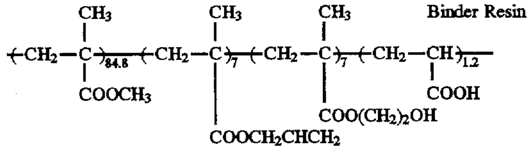

Mw $8\times10^4$

TABLE 207

| Example | Resin P | Compounds for Crosslinking | Amount |
|---|---|---|---|
| 211 | P-239 | Phthalic anhydride | 0.2 g |
| | | Acetylacetone zirconium salt | 0.01 g |
| 212 | P-250 | Gluconic acid | 0.008 g |
| 213 | P-242 | N-Methylamino propanol | 0.25 g |
| | | Tin dibutyl dilaurate | 0.001 g |
| 214 | P-244 | N,N'-Dimethylamino propane | 0.3 g |
| 215 | P-247 | Propylene glycol | 0.2 g |
| | | Tetrakis(2-ethylhexane diolate)titanium | 0.08 g |
| 216 | P-240 | — | |
| 217 | P-248 | N,N-Diethylpropane diamine | 0.25 g |
| 218 | P-253 | Divinyl adipate | 0.3 g |
| | | 2,2'-azobis(isobutyronitrile) | 0.001 g |
| 219 | P-251 | — | |
| 220 | P-252 | N,N-Diethyl butane diamine | 0.3 g |
| 221 | P-234 | 3-Aminopropyl dimethyl methoxy silane | 0.2 g |

The same solution of the thermoplastic resin as that of Example 201 was prepared, coated on the photosensitive layer and dried in the same procedure as that of Example 201 to form a transfer removable layer on the photosensitive layer.

The image quality and the transfer properties of each of the electrophotographic materials thus obtained were evaluated in the same manner as that of Example 202.

Clear color copy images without background contamination were obtained on coated paper after transfer. The images had sufficient strength.

EXAMPLES 222–228

Electrophotographic materials for color proofing were prepared in the same manner as that of Example 217 except that a combination of 60 g of a binder resin B, 7 g of a resin P and compounds for crosslinking to amount, shown in the following Table 208 was used.

TABLE 208

| Example | Binder Resin B | Resin P | Compounds for Crosslinking | |
|---|---|---|---|---|
| 222 | B-105 | P-237 | 1,6-Hexane diamine | 0.4 g |
| 223 | B-106 | P-243 | γ-glycide propyl trimethoxy silane | 0.1 g |
| 224 | B-107 | P-247 | 1,4-Butane diol | 0.3 g |
| | | | Tin dibutoxy dilaurate | 0.001 g |
| 225 | B-108 | P-253 | Ethylene glycol | 2.0 g |

TABLE 208-continued

| Example | Binder Resin B | Resin P | Compounds for Crosslinking | |
|---|---|---|---|---|
| | | | dimethacrylate | |
| | | | 2,2'-azobis(isovaleronitrile) | 0.03 g |
| 226 | B-109 | P-254 | Benzoyl peroxide | 0.008 g |
| 227 | B-110 | P-253 | Divinyl adipate | 2.2 g |
| | | | 2,2'-azobis(isobutyronitrile) | 0.01 g |
| 228 | B-111 | P-235 | Block isocyanate: BarknockD-500 (DIK Co., Ltd.) | 3 g |
| | | | Dimer of Butyl titanate | 0.02 g |

The image quality and the transfer properties of each of the imaging members thus obtained were evaluated in the same manner as that of Example 202.

Clear color copy images without background contamination were obtained on coated paper after transfer. The images had sufficient strength.

EXAMPLES 229–233

Electrophotographic materials for color proofing were prepared in the same manner as that of Example 201 except that a combination of a thermoset resin with a solvent for coating shown in the following Table 209 was used instead of the thermoset resin poly(vinyl acetate/crotonic acid) (molar ratio 95/5) of the transfer removable layer.

TABLE 209

| Example | Thermoplastic Resin | Solvent for Coating |
|---|---|---|
| 229 | Cellulose acetate butyrate: Cellidor Bsp (available from Bayer AG) | Ethyl acetate |
| 230 | Polyvinyl butyral resin: ESLECK (available from Sekisui Chemical Co., Ltd) | Ethanol |
| 231 | Cellulose propionate: CELLIDORIA (available from DAISEL CHEMICAL INDUSTRIES, LTD) | Ethyl acetate |
| 232 | Poly(vinyl acetate) | Methyl ethyl ketone |
| 233 | Poly(vinyl acetate/crotonic acid) (molar ratio 95/5) and Cellidor Bsp (ratio by weight 8/2) | Ethanol solution containing 1% Aqueous Ammonia |

The image quality and the transfer properties of each of the electrophotographic materials thus obtained were evaluated in the same manner as that of Example 201. As a result, the same excellent levels of the performances as those of the electrophotographic materials of Example 202 were achieved.

EXAMPLES 234–247

Electrophotographic materials for color proofing were prepared in the same manner as that of Example 201 except that 0.2 g of a resin shown in the following Table 210 was used instead of 0.3 g of resin P-241.

TABLE 210

| Example | 234 | 235 | 236 | 237 | 238 | 239 | 240 |
|---|---|---|---|---|---|---|---|
| Resin P | P-205 | P-206 | P-207 | P-208 | P-209 | P-210 | P-211 |
| Example | 241 | 242 | 243 | 244 | 245 | 246 | 247 |
| Resin P | P-212 | P-213 | P-214 | P-219 | P-225 | P-227 | P-231 |

The image quality and the transfer properties of each of the electrophotographic materials thus obtained were evaluated in the same manner as that of Example 201.

Clear color copy images without background contamination were obtained on coated paper after transfer. The images had sufficient strength.

EXAMPLE 301

A mixture of 1 g of metal-free X-form phthalocyanine (available from DAINIPPON INK AND CHEMICALS, INC.), 10 g of binder resin B-301 represented by the following formula, 0.3 g of resin P-315, 0.15 g of compound A and 80 g of tetrahydrofuran was charged together with glass beads in a 500-ml glass container. The mixture was dispersed by a paint shaker (available from TOYO SEIKI SEISAKUSHO) for 60 minutes. After 0.03 g of ethylene glycol diglycidyl ether were added to the dispersion, the mixture was dispersed for 2 minutes. Then, the glass beads were separated by filtration to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 110° C. for 20 seconds and at 140° C. for 1 hour to obtain a photosensitive layer having 8 μm thickness.

Binder Resin B-301

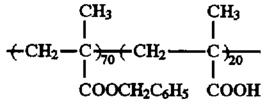

(molar ratio)

Mw $6.5 \times 70^4$

A solution having the following contents was then prepared to form a transfer removable layer on the photosensitive layer.

| | |
|---|---|
| Poly(vinyl acetate/crotonic acid) (95/5, Mw $5 \times 10^4$) | 3 g |
| 28% Aqueous Ammonia | 1 g |
| Ethanol | 97 g |

After the above solution was coated with a wire bar on the photosensitive layer, the coating was dried in an oven at 120° C. for 20 seconds to prepare an electrophotographic material for color proofing, comprising a transfer removable layer having 1.3 μm thickness.

The image quality and the transfer properties of the electrophotographic material for color proofing obtained in Example 301 was evaluated as follows:

The electrophotographic material of Example 301 was charged by corona discharge to +450 volts in dark. The charged el ectrophotographic material was imagewise exposed to light by a Ga—Al—As semiconductor laser (oscillation wavelength 780 nm) having 5 mW of output power with 30 erg/cm$^3$ of irradiation measured on the el ectrophotographic material in a pitch of 25 μm at a scanner speed of 300 cm/sec in a mode of negative mirror image, based on the information about yellow color among information about yellow, magenta, cyan and black, which were recorded in a harddisk of a system as dijital image data which were obtained by reading an original using a color scanner and conducting color separation and correction regarding some color reproductions specific to the system.

Subsequently, the exposed electrophotographic material was reversally developed using a yellow liquid developer for a signature system (available from Eastman Kodak) 75-fold (by weight) diluted with Isoper H (available from Esso Standard Oil Co.) by a developing apparatus having a pair of plane developing electrodes under the application of +400 volts of bias voltage to electrically deposit toners on the exposed areas of the electrophotographic material and then the developed electrophotographic material was rinsed in a bath of Isoper H to remove background contamination in the non-image areas.

The above procedure was repeated using each information of magenta, cyan and black instead of the information of yellow.

The image formed on the obtained electrophotographic material after image-form production was fixed using a heat roller.

Subsequently, coated paper (regular printing size) was laid on the electrophotographic material having ixed image and then transferred at a speed of 10 mm/sec between a pair of rubber rollers which were in contact each other under a pressure of 15 kgf/cm$^2$ and whose surfaces were constantly maintained at 120° C.

After being cooled to room temperature, the coated paper was separated from the electrophotographic material. Image formed on the coated paper was visually evaluated regarding fog and image quality.

All of the toners deposited on the electrophotographic material were transferred by heat to the coated paper together with the removable layer and a suitable mat was produced on the surface of the removable layer so that clear image without background contamination was obtained. The obtained image had the same image quality as that of the original.

The toners transferred on the coated paper were covered with the thermoplastic resin of the removable layer so that these toners were not rubbed off and thereby the image had sufficient strength.

Therefore, it revealed that the electrophotographic material according to the present invention showed excellent properties as an material for color proofing.

EXAMPLE 302

A mixture of 200 g of photoconductive zinc oxide, 80 g of binder resin B-302 represented by the following formula, 8 g of resin P-301, 0.018 g of dye D-1, 0.20 g of N-hydroxy succinic acid imido and 300 g of toluene was charged in a homogenizer (available from NIHON SEIKI CO., LTD) and dispersed at 7×10$^3$ rpm for 10 minutes.

After 0.3 g of phthalic anhydride and 0.01 g of o-chlorophenol were added to the dispersion, the mixture was dispersed at 1×10$^3$ rpm for 1 minute to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 140° C. for 1 hour to obtain a photosensitive layer having 10 μm thickness.

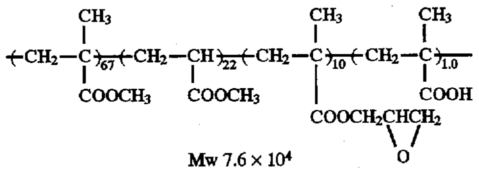

Mw 7.6 × 10$^4$

The results obtained in an adhesion test with an adhesive-backed tape revealed that the adhesion of the photosensitive layer comprising graft-type copolymer P-301 to the base was one-sixtieths compared with a photosensitive layer without graft-type copolymer P-301. The results demonstrate the maldistribution of the graft-type copolymer to the surface of the photosensitive layer.

The same solution of the thermoplastic resin as that of Example 301 was prepared, coated on the photosensitive layer and dried in the same procedure as that of Example 301 to form a transfer removable layer on the photosensitive layer. An adhesive-backed tape was attached to the surface of the removable layer and peeled off. As a result, only the removable layer was easily separated from the photosensitive layer.

The electrophotographic material thus obtained was charged by corona discharge to −600 volts in dark. The charged electrophotographic material was imagewise exposed to light by a semiconductor laser (oscillation wavelength 780 nm) with 25 erg/cm$^3$ of irradiation measured on the surface of the electrophotographic material in a mode of positive mirror image, based on the information about yellow color. The residual voltage on the exposed areas was −120 volts. Subsequently, the exposed electrophotographic material was positively developed using a yellow toner for VERSATECK 3000 (color electrostatic plotter available from Xerox Co.) diluted with a 50-fold amount of Isoper H by a developing apparatus having a pair of plane developing electrodes under the application of −200 volts of bias voltage to electrically deposit toners on the unexposed areas of the electrophotographic material and then the developed electrophotographic material was rinsed in a bath of Isoper H to remove background contamination in the non-image areas.

The above procedure was repeated using each information of magenta, cyan and black instead of the information of yellow.

Subsequently, coated paper was laid on the electrophotographic material developed with the four color toners and then transferred at a speed of 6 mm/sec between a pair of rubber rollers which were in contact each other under a pressure of 10 kgf/cm$^2$ and whose surfaces were constantly maintained at 120° C.

After being cooled to room temperature, the coated paper was separated from the electrophotographic material. Whole image formed on the coated paper was transferred by heat to the coated paper together with the removable layer and a suitable mat was produced on the surface of the removable layer. There was little difference between the image quality of the obtained image and that of an image obtained by printing.

The toners transferred on the coated paper were covered with the thermoplastic resin of the removable layer so that these toners were not rubbed off.

EXAMPLE 303

Five grams of 4,4'-bis(diethylamino)-2,2'-dimethyl triphenylmethane as a photoconductive material, 4 g of binder resin B-303 represented by the following formula, 0.8 g of resin P-324, 40 mg of dye D-2, and 0.20 g of anilide compound B as a chemical sensitizer were dissolved in a mixture of 30 ml of methylene chloride and 30 ml of ethylene chloride to prepare a solution for a photosensitive layer.

The solution was coated with a wire-wound rod on an electrically-conductive transparent substrate which comprises a polyethylene terephthalate substrate (100 μm in thickness) having deposited thereon indium oxide film and has a surface resistance of $10^3\Omega$. After being dried to be tack-free, the coating was dried at 120° C. for 1 hour to form a photosensitive layer having about 4 μm thickness.

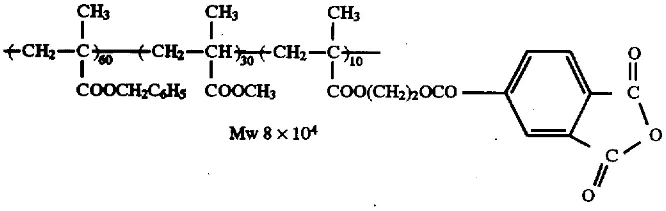

Mw $8 \times 10^4$

The results obtained in an adhesion test with an adhesive-backed tape revealed that the adhesion of the photosensitive layer comprising graft-type copolymer P-324 to the base was one-ninetieths compared with a photosensitive layer without graft-type copolymer P-324. The results demonstrate the maldistribution of the graft-type copolymer to the surface of the photosensitive layer.

The same solution of the thermoplastic resin as that of Example 301 was prepared, coated on the photosensitive layer and dried in the same procedure as that of Example 301 to form a transfer removable layer on the photosensitive layer. An adhesive-backed tape was attached to the surface of the removable layer and peeled off. As a result, only the removable layer was easily separated from the photosensitive layer as shown in the removable layer of Example 302.

The image quality and the transfer properties of the electrophotographic material thus obtained were evaluated in the same manner as that of Example 301 except that a He—Ne laser having an oscillation wavelength of 630 nm was used instead of the semiconductor laser having an oscillation wavelength of 780 nm.

A clear color copy image without background contamination was obtained on coated paper after transfer. The image had sufficient strength.

EXAMPLE 304

A mixture of 5 g of the same bis-azo pigment as that used in Example 4, 95 g of tetrahydrofuran, and 30 g of a solution of polyester resin Byron 200 (avalable from TOYOBO CO., LTD), 5 g in tetrahydrofuran was sufficiently ground in a ball mill. Then, the mixture was drawn and 520 g of tetrahydrofuran were added thereto while stirring. The obtained dispersion was coated with a wire-wound rod on the same electrically-conductive transparent substrate as that used in Example 303 to form a charge generation layer having about 0.7 μm thickness.

Subsequently, a solution consisting of 20 g of the same hydrazone compound as that used in Example 4, 20 g of polycarbonate resin Lexan 121 (available from GE Co.), 2 g of resin P-331, 0.04 g of isophorone diisocyanate, 0.001 g of tetrabutoxy titanate and 160 g of tetrahydrofuran was coated with a wire-wound rod on the charge generation layer. The coating was dried at 60° C. for 30 seconds and at 120° C. for 1 hour to form a charge transport layer having thickness of about 18 μm. Thus, the obtained electrophotographic receptor comprised the two functional layers of the charge generation layer and the charge transport layer.

The same solution of the thermoset resin as that of Example 301 was prepared, coated on the above photoreceptor and dried in the same procedure as that of Example 301 to form a transfer removable layer.

The image quality and the transfer properties of the electrophotographic material thus obtained were evaluated in the same manner as that of Example 303.

A clear color copy image without background contamination was obtained on coated paper after transfer. The image had sufficient strength.

EXAMPLES 305–310

Electrophotographic materials for color proofing were prepared in the same manner as that of Example 302 except that 8 g of a resin P shown in the following Table 305, compounds for crosslinking shown in the following Table 305 to amount and 0.020 g of dye D-3 were used instead of 8 g of resin P-301, 0.018 g of dye D-1, 0.3 g of phthalic anhydride and 0.01 g of o-chlorophenol.

TABLE 305

| Example | Resin P | Compounds for Crosslinking | Amount |
|---|---|---|---|
| 305 | P-317 | 1,2,4,5-Benzentetracarboxylic dianhydride | 0.5 g |
| | | D-Cresol | 0.01 g |
| 306 | P-319 | Gluconic anhydride | 0.2 g |
| | | Zirconium stearate | 0.008 g |
| 307 | P-323 | Phthalic anhydride | 0.25 g |
| | | Phenol | 0.007 g |
| 308 | P-332 | Phthalic anhydride | 0.30 g |
| | | Acetylacetonate zirconium | 0.001 g |
| 309 | P-303 | Succinic anhydride | 0.23 g |
| | | Propionic acid | 0.002 g |
| 310 | P-309 | Phthalic anhydride | 0.30 g |
| | | p-Cyanophenol | 0.01 g |

The image quality and the transfer properties of each of the electrophotographic materials thus obtained were evaluated in the same manner as that of Example 302.

Clear color copy images without background contamination were obtained on coated paper after transfer. The images had sufficient strength.

EXAMPLES 311–327

A mixture of 200 g of photoconductive zinc oxide, 70 g of binder resin B-304 represented by the following formula, 0.019 g of dye D-104, 0.018 g of N-hydroxy maleic imido and 300 g of toluene was charged in a homogenizer (NIHON SEIKI CO., LTD) and dispersed at $7\times10^3$ rpm for 10 minutes.

After 6 g of a resin P shown in Table 306 and compounds for crosslinking shown in Table 306 to amount were added to the dispersion, the mixture was dispersed at $1\times10^3$ rpm for 1 minute to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 140° C. for 2 hours to obtain a photosensitive layer having 10 μm thickness.

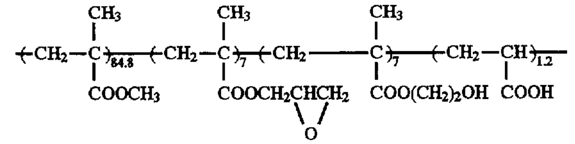

Mw $8\times10^4$

TABLE 306

| Example | Resin P | Compounds for Crosslinking | Amount |
|---|---|---|---|
| 311 | P-329 | Phthalic anhydride | 0.2 g |
| | | Acetylacetone zirconium salt | 0.01 g |
| 312 | P-335 | Gluconic acid | 0.008 g |
| 313 | P-333 | N-Methylamino propanol | 0.25 g |
| | | Tin dibutyl dilaurate | 0.001 g |
| 314 | P-322 | N,N'-Dimethylamino propane | 0.3 g |
| 315 | P-333 | Propylene glycol | 0.2 g |
| | | Tetrakis(2-ethylhexane diolate)titanium | 0.08 g |
| 316 | P-337 | — | |
| 317 | P-337 | N,N-Dimethylpropane diamine | 0.25 g |
| 318 | P-325 | Divinyl adipate | 0.3 g |
| | | 2,2'-azobis(isobutyronitrile) | 0.001 g |
| 319 | P-313 | Succinic anhydride | 0.4 g |
| | | p-Cyanophenol | 0.001 g |
| 320 | P-334 | $ROOCNH(CH_2)_6NHCOOR$ ($R+CH—CF_3—CF_3$) | 0.3 g |
| | | Tetrabutoxy titanate | 0.001 g |
| 321 | P-324 | 3-Aminopropyl dimethyl methoxy silane | 0.2 g |

The same solution of the thermoplastic resin as that of Example 301 was prepared, coated on the photosensitive layer and dried in the same procedure as that of Example 301 to form a transfer removable layer on the photosensitive layer.

The image quality and the transfer properties of each of the electrophotographic materials thus obtained were evaluated in the same manner as that of Example 302.

Clear color copy images without background contamination were obtained on coated paper after transfer. The images had sufficient strength.

EXAMPLES 322–328

Electrophotographic materials for color proofing were prepared in the same manner as that of Example 317 except that a combination of 60 g of a binder resin B, 7 g of a resin P and compounds for crosslinking to amount, shown in the following Table 307 was used.

TABLE 307

| Example | Binder Resin B | Resin P | Compounds for Crosslinking | |
|---|---|---|---|---|
| 322 | B-105 | P-337 | 1,6-Hexane diamine | 0.4 g |
| 323 | B-106 | P-343 | γ-glycide propyl trimethoxy silane | 0.1 g |
| 324 | B-107 | P-347 | 1,4-Butane diol | 0.3 g |
| | | | Tin dibutoxy dilaurate | 0.01 g |
| 325 | B-108 | P-353 | Ethylene glycol dimethacrylate | 2.0 g |
| | | | 2,2'-azobis(isovaleronitrile) | 0.03 g |
| 326 | B-109 | P-354 | Benzoyl peroxide | 0.008 g |
| 327 | B-110 | P-353 | Divinyl adipate | 2.2 g |
| | | | 2,2'-azobis(isobutyronitrile) | 0.01 g |
| 328 | B-111 | P-335 | Block isocyanate: BarknockD-500 (DIK Co., Ltd.) | 3 g |
| | | | Dimer of Butyl titanate | 0.02 g |

The image quality and the transfer properties of each of the electrophotographic materials thus obtained were evaluated in the same manner as that of Example 302.

Clear color copy images without background contamination were obtained on coated paper after transfer. The images had sufficient strength.

EXAMPLES 329–333

Electrophotographic materials for color proofing were prepared in the same manner as that of Example 301 except that a combination of a thermoplastic resin with a solvent for coating shown in the following Table 308 was used instead of the thermoset resin poly(vinyl acetate/crotonic acid) (molar ratio 95/5) of the transfer removable layer.

TABLE 308

| Example | Thermoplastic Resin | Solvent for Coating |
|---|---|---|
| 329 | Cellulose acetate butyrate: Cellidor Bsp (available from Bayer AG) | Ethyl acetate |
| 330 | Polyvinyl butyral resin: ESLECK (available from Sekisui Chemical Co., Ltd) | Ethanol |
| 331 | Cellulose propionate: CELLIDORIA (available from DAISEL CHEMICAL INDUSTRIES, LTD) | Ethyl acetate |
| 332 | Poly(vinyl acetate) | Methyl ethyl ketone |
| 333 | Poly(vinyl acetate/crotonic acid) (molar ratio 95/5) and Cellidor Bsp (ratio by weight 8/2) | Ethanol solution containing 1% Aqueous Ammonia |

The image quality and the transfer properties of each of the electrophotographic materials thus obtained were evaluated in the same manner as that of Example 301. As a result, the same excellent levels of the performances as those of the electrophotographic materials of Example 302 were achieved.

EXAMPLES 334–347

Electrophotographic material for color proofing were prepared in the same manner as that of Example 302 except that 0.2 g of a resin shown in the following Table 309 was used instead of 0.3 g of resin P-301.

TABLE 309

| Example | 334 | 335 | 336 | 337 | 338 | 339 | 340 |
|---|---|---|---|---|---|---|---|
| Resin P | P-302 | P-303 | P-304 | P-305 | P-306 | P-307 | P-308 |
| Example | 341 | 342 | 343 | 344 | 345 | 346 | 347 |
| Resin P | P-309 | P-310 | P-311 | P-312 | P-313 | P-314 | P-329 |

The image quality and the transfer properties of each of the electrophotographic materials thus obtained were evaluated in the same manner as that of Example 301.

Clear color copy images without background contamination were obtained on coated paper after transfer. The images had sufficient strength.

EXAMPLE 401

A mixture of 1.5 g of metal-free X-form phthalocyanine (available from DAINIPPON INK AND CHEMICALS, INC.), 10 g of binder resin B-401 represented by the following formula, 0.3 g of resin P-402, 0.15 g of compound A and 80 g of tetrahydrofuran was charged together with glass beads in a 500-ml glass container. The mixture was dispersed by a paint shaker (available from TOYO SEIKI SEISAKUSHO) for 60 minutes. After 0.1 g of phthalic anhydride and 0.002 g of o-chlorophenol were added to the dispersion, the mixture was dispersed for 2 minutes. Then, the glass beads were separated by filtration to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 110° C. for 20 seconds and at 140° C. for 1 hour to obtain a photosensitive layer having 8 µm thickness.

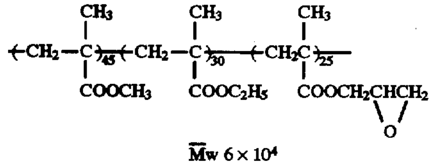

$\overline{Mw}$ $6 \times 10^4$

A solution having the following contents was then prepared to form a transfer removable layer on the photosensitive layer.

| | |
|---|---|
| Poly(vinyl acetate/crotonic acid) (95/5, Mw $5 \times 10^4$) | 3 g |
| 28% Aqueous Ammonia | 1 g |
| Ethanol | 97 g |

After the above solution was coated with a wire bar on the photosensitive layer, the coating was dried in an oven at 120° C. for 20 seconds to prepare an electrophotographic material for color proofing, comprising a transfer removable layer having 1.3 µm thickness.

The image quality and the transfer properties of the electrophotographic material for color proofing obtained in Example 401 was evaluated as follows:

The electrophotographic material of Example 401 was charged by corona discharge to +450 volts in dark. The charged electrophotographic material was imagewise exposed to light by a Ga—Al—As semiconductor laser (oscillation wavelength 780 nm) having 5 mW of output power with 30 erg/cm$^3$ of irradiation measured on the electrophotographic material in a pitch of 25 µm at a scanner speed of 300 cm/sec in a mode of negative mirror image, based on the information about yellow color among information about yellow, magenta, cyan and black, which were recorded in a harddisk of a system as dijital image data which were obtained by reading an original using a color scanner and conducting color separation and correction regarding some color reproductions specific to the system. Subsequently, the exposed electrophotographic material was reversally developed using a yellow liquid developer for a signature system (available from Eastman Kodak) 75-fold (by weight) diluted with Isoper H (available from Esso Standard Oil Co.) by a developing apparatus having a pair of plane developing electrodes under the application of +400 volts of bias voltage to electrically deposit toners on the exposed areas of the electrophotographic material and then the developed electrophotographic material was rinsed in a bath of Isoper H to remove background contamination in the non-image areas.

The above procedure was repeated using each information of magenta, cyan and black instead of the information of yellow.

The image formed on the obtained electrophotographic material after image-form production was fixed using a heat roller.

Subsequently, coated paper (regular printing paper) was laid on the electrophotographic material having fixed image and then transferred at a speed of 10 mm/sec between a pair of rubber rollers which were in contact each other under a pressure of 15 kgf/cm$^2$ and whose surfaces were constantly maintained at 120° C.

After being cooled to room temperature, the coated paper was separated from the electrophotographic material. Image formed on the coated paper was visually evaluated regarding fog and image quality.

All of the toners deposited on the imaging member were transferred by heat to the coated paper together with the removable layer and a suitable mat was produced on the surface of the removable layer so that clear image without background contamination was obtained. The obtained image had the same image quality aS that of the original.

The toners transferred on the coated paper were covered with the thermoplastic resin of the removable layer so that these toners were not rubbed off and thereby the image had sufficient strength.

Therefore, it revealed that the imaging member according to the present invention showed excellent properties as an electrophotographic material for color proofing.

EXAMPLE 402

A mixture of 200 g of photoconductive zinc oxide, 80 g of binder resin B-402 represented by the following formula, 8 g of resin P-401, 0.018 g of dye D-1, 0.20 g of N-hydroxy succinic acid imido and 300 g of toluene was charged in a homogenizer (available from NIHON SEIKI CO., LTD) and dispersed at 7×10$^3$ rpm for 10 minutes.

After 0.3 g of phthalic anhydride and 0.01 g of o-chlorophenol were added to the dispersion, the mixture was dispersed at 1×10$^3$ rpm for 1 minute to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 140° C. for 1 hour to obtain a photosensitive layer having 10 μm thickness.

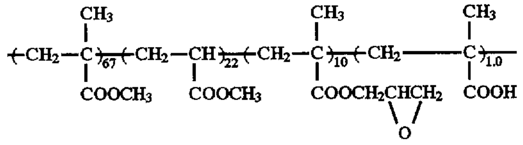

Mw $7.6 \times 10^4$

The results obtained in an adhesion test with an adhesive-backed tape revealed that the adhesion of the photosensitive layer comprising block-type copolymer P-401 to the base was one-sixtieths compared with a photosensitive layer without block-type copolymer P-401. The results demonstrate the maldistribution of the block-type copolymer to the surface of the photosensitive layer.

The same solution of the thermoplastic resin as that of Example 401 was prepared, coated on the photosensitive layer and dried in the same procedure as that of Example 401 to form a transfer removable layer on the photosensitive layer. An adhesive-backed tape was attached to the surface of the removable layer and peeled off. As a result, only the removable layer was easily separated from the photosensitive layer.

The electrophotographic material thus obtained was charged by corona discharge to −600 volts in dark. The charged electrophotographic material was imagewise exposed to light by a semiconductor laser (oscillation wavelength 780 nm) with 25 erg/cm$^3$ of irradiation measured on the surface of the electrophotographic material in a mode of positive mirror image, based on the information about yellow color. The residual voltage on the exposed areas was −120 volts. Subsequently, the exposed electrophotographic material was positively developed using a yellow toner for VERSATECK 3000 (color electrostatic plotter available from Xerox Co.) diluted with a 50-fold amount of Isoper H by a developing apparatus having a pair of plane developing electrodes under the application of −200 volts of bias voltage to electrically deposit toners on the unexposed areas of the electrophotographic material and then the developed electrophotographic material was rinsed in a bath of Isoper H to remove background contamination in the non-image areas.

The above procedure was repeated using each information of magenta, cyan and black instead of the information of yellow.

Subsequently, coated paper was laid on the electrophotographic material developed with the four color toners and then transferred at a speed of 6 mm/sec between a pair of rubber rollers which were in contact each other under a pressure of 10 kgf/cm$^2$ and whose surfaces were constantly maintained at 120° C.

After being cooled to room temperature, the coated paper was separated from the electrophotographic material. Whole image formed on the coated paper was transferred by heat to the coated paper together with the removable layer and a suitable mat was produced on the surface of the removable layer. There was little difference between the image quality of the obtained image and that of an image obtained by printing.

The toners transferred on the coated paper were covered with the thermoplastic resin of the removable layer so that these toners were not rubbed off.

EXAMPLE 403

Five grams of 4,4'-bis(diethylamino)-2,2'-dimethyl triphenylmethane as a photoconductive material, 4 g of binder resin B-403 represented by the following formula, 0.8 g of resin P-417, 40 mg of dye D-2, and 0.20 g of anilide compound B as a chemical sensitizer were dissolved in a mixture of 30 ml of methylene chloride and 30 ml of ethylene chloride to prepare a solution for a photosensitive layer.

The solution was coated with a wire-wound rod on an electrically-conductive transparent substrate which comprises a polyethylene terephthalate substrate (100 μm in thickness) having deposited thereon indium oxide film and has a surface resistance of $10^3 \Omega$. After being dried to be tack-free, the coating was dried at 120° C. for 1 hour to form a photosensitive layer having about 4 μm thickness.

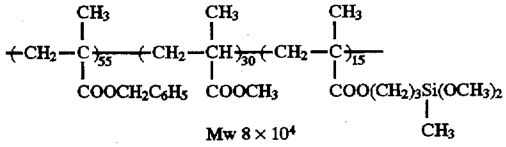

Mw $8 \times 10^4$

The results obtained in an adhesion test with an adhesive-backed tape revealed that the adhesion of the photosensitive layer comprising block-type copolymer P-417 to the base was one-ninetieths compared with a photosensitive layer without block-type copolymer P-417.

The results demonstrate the maldistribution of the block-type copolymer to the surface of the photosensitive layer.

The same solution of the thermoplastic resin as that of Example 401 was prepared, coated on the photosensitive layer and dried in the same procedure as that of Example 401 to form a transfer removable layer on the photosensitive layer. An adhesive-backed tape was attached to the surface of the removable layer and peeled off. As a result, only the removable layer was easily separated from the photosensitive layer as shown in the removable layer of Example 402.

The image quality and the transfer properties of the electrophotographic material thus obtained were evaluated in the same manner as that of Example 401 except that a He—Ne laser having an oscillation wavelength of 630 nm was used instead of the semiconductor laser having an oscillation wavelength of 780 nm.

A clear color copy image without background contamination was obtained on coated paper after transfer. The image had sufficient strength.

EXAMPLE 404

A mixture of 5 g of the same bis-azo pigment as that used in Example 4, 95 g of tetrahydrofuran, and 30 g of a solution of polyester resin Byron 200 (available from TOYOBO CO., LTD), 5 g in tetrahydrofuran was sufficiently ground in a ball mill. Then, the mixture was drawn and 520 g of tetrahydrofuran were added. thereto while stirring. The obtained dispersion was coated with a wire-wound rod on the same electrically-conductive transparent substrate as that used in Example 403 to form a charge generation layer having about 0.7 μm thickness.

Subsequently, a solution consisting of 20 g of the same hydrazone compound as that used in Example 4, 20 g of polycarbonate resin Lexan 121 (available from GE Co.), 2 g of resin P-427, 0.04 g of 1,4-xylene diamine, 0.001 g of tetrabutoxy titanate and 160 g of tetrahydrofuran was coated with a wire-wound rod on the charge generation layer. The coating was dried at 60° C. for 30 seconds and at 120° C. for 1 hour to form a charge transport layer having thickness of about 18 μm. Thus, the obtained electrophotographic receptor comprised the two functional layers of the charge generation layer and the charge transport layer.

The same solution of the thermoplastic resin as that of Example 401 was prepared, coated on the above photoreceptor and dried in the same procedure as that of Example 401 to form a transfer removable layer.

The image quality and the transfer properties of the electrophotographic material thus obtained were evaluated in the same manner as that of Example 403.

A clear color copy image without background contamination was obtained on coated paper after transfer. The image had sufficient strength.

EXAMPLES 405–410

Electrophotographic materials for color proofing were prepared in the same manner as that of Example 402 except that 8 g of a resin P shown in the following Table 405, compounds for crosslinking shown in the following Table 405 to amount and 0.020 g of dye D-3 were used instead of 8 g of resin P-401, 0.018 g of dye D-1, 0.3 g of phthalic anhydride and 0.01 g of o-chlorophenol.

TABLE 405

| Example | Resin P | Compounds for Crosslinking | Amount |
|---|---|---|---|
| 405 | P-405 | 1,2,4,5-Benzenetetracarboxylic dianhydride | 0.5 g |
| | | D-Cresol | 0.01 g |
| 406 | P-421 | Gluconic anhydride | 0.2 g |
| | | Zirconium stearate salt | 0.008 g |
| 407 | P-411 | Phthalic anhydride | 0.25 g |
| | | Phenol | 0.007 g |
| 408 | P-410 | Phthalic anhydride | 0.30 g |
| | | Acetylacetonate zirconium | 0.001 g |
| 409 | P-403 | Succinic anhydride | 0.23 g |
| | | Propionic acid | 0.002 g |
| 410 | P-415 | Phthalic anhydride | 0.30 g |
| | | p-Cyanophenol | 0.01 g |

The image quality and the transfer properties of each of the electrophotographic materials thus obtained were evaluated in the same manner as that of Example 402.

Clear color copy images without background contamination were obtained on coated paper after transfer.

EXAMPLES 411–427

A mixture of 200 g of photoconductive zinc oxide, 70 g of binder resin B-404 represented by the following formula, 0.019 g of dye D-104, 0.20 g of salicylic acid and 300 g of toluene was charged in a homogenizer and dispersed at $7\times10^3$ rpm for 10 minutes.

After 6 g of a resin P shown in Table 406 and compounds for crosslinking shown in Table 406 to amount were added to the dispersion, the mixture was dispersed at $1\times10^3$ rpm for 1 minute to prepare a dispersion for a photosensitive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 110° C. for 1 hour to obtain a photosensitive layer having 10 μm thickness.

Binder Resin B-404

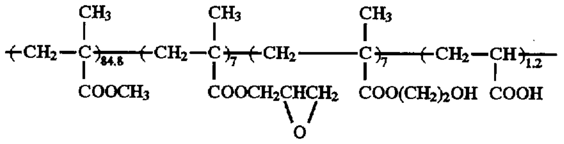

Mw $8\times10^4$

| Example | Resin P | Compounds for Crosslinking | Amount |
|---|---|---|---|
| 411 | P-407 | Phthalic anhydride | 0.2 g |
| | | Acetylacetone zirconium salt | 0.01 g |
| 412 | P-409 | Gluconic acid | 0.008 g |
| 413 | P-420 | N-Methylamino propanol | 0.25 g |
| | | Tin dibutyl dilaurate | 0.001 g |
| 414 | P-416 | N,N'-Dimethylamino propane | 0.3 g |
| 415 | P-424 | Propylene glycol | 0.2 g |
| | | Tetrakis(2-ethylhexane diolate)titanium | 0.08 g |
| 416 | P-417 | — | |
| 417 | P-425 | N,N-Dimethylpropane diamine | 0.25 g |
| 418 | P-421 | Succinic anhydride | 0.4 g |
| | | p-Cyanophenol | 0.001 g |
| 419 | P-418 | $ROOCNH(CH_2)_4NHCOOR(R—CH(CF_3)_2)$ | 0.3 g |
| | | Tetrabutoxy titanate | 0.001 g |
| 420 | P-423 | 3-Aminopropyl dimethyl methoxy silane | 0.2 g |

The same solution of the thermoplastic resin as that of Example 401 was prepared, coated on the photosensitive layer and dried in the same procedure as that of Example 401 to form a transfer removable layer on the photosensitive layer.

The image quality and the transfer properties of each of the electrophotographic materials thus obtained were evaluated in the same manner as that of Example 402.

Clear color copy images without background contamination were obtained on coated paper after transfer. The images had sufficient strength.

EXAMPLES 421–427

Electrophotographic materials for color proofing were prepared in the same manner as that of Example 417 except that a combination of 60 g of a binder resin B, 7 g of a resin P and compounds for crosslinking to amount, shown in the following Table 407 was used.

TABLE 407

| Example | Binder Resin B | Resin P | Compounds for Crosslinking | |
|---|---|---|---|---|
| 421 | B-105 | P-420 | 1,6-Hexane diamine | 0.4 g |
| 422 | B-106 | P-417 | γ-glycide propyl trimethoxy silane | 0.1 g |
| 423 | B-107 | P-425 | 1,4-Butane diol | 0.3 g |
| | | | Tin dibutoxy dilaurate | 0.01 g |
| 424 | B-108 | P-428 | Ethylene glycol dimethacrylate | 2.0 g |
| | | | 2,2'-azobis(isobutyronitrile) | 0.03 g |
| 425 | B-109 | P-429 | Benzoyl peroxide | 0.008 g |
| 426 | B-110 | P-428 | Divinyl adipate | 2.2 g |
| | | | 2,2'-azobis(isobutyronitrile) | 0.01 g |
| 427 | B-111 | P-426 | Block isocyanate: BarknockD-500 (DIK Co., Ltd.) | 3 g |
| | | | Dimer of Butyl titanate | 0.02 g |

The image quality and the transfer properties of each of the electrophotographic materials thus obtained were evaluated in the same manner as that of Example 402.

Clear color copy images without background contamination were obtained on coated paper after transfer. The images had sufficient strength.

EXAMPLES 428–432

Electrophotographic materials for color proofing were prepared in the same manner as that of Example 401 except that a combination of a thermoplastic resin with a solvent for coating shown in the following Table 408 was used instead of the thermoplastic resin poly(vinyl acetate/crotonic acid) (molar ratio 95/5) of the transfer removable layer.

TABLE 408

| Example | Thermoplastic Resin | Solvent for Coating |
|---|---|---|
| 428 | Cellulose acetate butyrate: Cellidor Bsp (available from Bayer AG) | Ethyl acetate |
| 429 | Polyvinyl butyral resin: ESLECK (available from Sekisui Chemical Co., Ltd) | Ethanol |
| 430 | Cellulose propionate: CELLIDORIA (available from DAISEL CHEMICAL INDUSTRIES, LTD) | Ethyl acetate |
| 431 | Poly(vinyl acetate) | Methyl ethyl ketone |
| 432 | Poly(vinyl acetate/crotonic acid) (molar ratio 95/5) and Cellidor Bsp (ratio by weight 8/2) | Ethanol solution containing 1% Aqueous Ammonia |

The image quality and the transfer properties of each of the electrophotographic materials thus obtained were evaluated in the same manner as that of Example 401. As a result, the same excellent levels of the performances as those of the electrophotographic materials of Example 402 were achieved.

EXAMPLES 433–447

Electrophotographic materials for color proofing were prepared in the same manner as that of Example 401 except that 0.2 g of a resin shown in the following Table 409 was used instead of 0.2 g of resin P-402.

TABLE 409

| Example | 433 | 434 | 435 | 436 | 437 | 438 | 439 |
|---|---|---|---|---|---|---|---|
| Resin P | P-402 | P-403 | P-404 | P-405 | P-409 | P-407 | P-408 |
| Example | 440 | 441 | 442 | 443 | 444 | 445 | 446 |
| Resin P | P-411 | P-415 | P-421 | P-422 | P-413 | P-414 | P-406 |

The image quality and the transfer properties of each of the electrophotographic materials thus obtained were evaluated in the same manner as that of Example 401.

Clear color copy images without background contamination were obtained on coated paper after transfer. The images had sufficient strength.

EXAMPLE 501

A mixture of 100 g of photoconductive zinc oxide, 40 g of a random copolymer (Polymer P-501) represented by the following formula, 60 mg of Bromophenol Blue, 0.2 g of phthalic anhydride and 150 g of toluene was charged in a homogenizer (NIHON SEIKI CO., LTD) and dispersed at $1\times10^4$ r.p.m for 5 minutes.

After 0.1 g of phthalic anhydride and 0.02 g of o-chlorophenol were added to the dispersion, the mixture was dispersed at $1\times10^3$ r.p.m for 1 minute.

The dispersion was coated in an amount of 25 g/m$^2$ with a wire bar on a base for a paper master having 0.2 mm thickness subjected to both of a treatment for electrical conductivity and a treatment for solvent resistance. After being dried at 110° C. for 30 seconds, the coating was heated for 1 hour at 120° C.

Polymer P-501

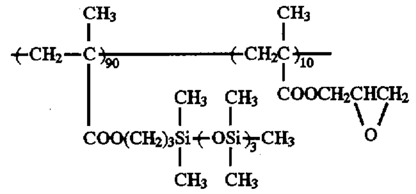

Mw $6\times10^4$

The same solution of the thermoplastic resin as that of Example 1 was prepared, coated on the photosensitive layer and dried in the same procedure as that of Example 1 to form a transfer removable layer on the photosensitive layer.

An adhesive-backed tape was attached to the surface of the transfer layer and peeled off. As a result, only the removable layer was easily separated from the photosensitive layer.

The imaging member was charged by corona discharge to −600 volts in dark. The charged imaging member was imagewise exposed to light by a He—Ne laser (oscillation wavelength 633 nm) with 30 erg/cm$^3$ of irradiation measured on the surface of the imaging member in a mode of positive mirror image, based on the information about yellow color. The residual voltage on the exposed areas was −120 volts. Subsequently, the exposed imaging member was positively developed using a yellow toner for VERSATECK 3000 (color electrostatic plotter available from Xerox Co.) diluted with a 50-fold amount of Isoper H by a developing apparatus having a pair of plane developing electrodes under the application of −200 volts of bias voltage to electrically deposit toners on the unexposed areas of the imaging member and then the developed imaging member was rinsed in a bath of Isoper H to remove background contamination in the non-image areas.

The above procedure was repeated using each information of magenta, cyan and black instead of the information of yellow.

Subsequently, coated paper was laid on the imaging member developed with the four color toners and then transferred at a speed of 6 mm/sec between a pair of rubber rollers which were in contact each other under a pressure of 10 kgf/cm$^2$ and whose surfaces were constantly maintained at 120° C.

After being cooled to room temperature, the coated paper was separated from the imaging member. Whole image formed on the coated paper was transferred by heat to the coated paper together with the removable layer and a suitable mat was produced on the surface of the removable layer. There was little difference between the image quality of the obtained image and that of an image obtained by printing.

The toners transferred on the coated paper were covered with the thermoplastic resin of the removable layer so that these toners were not rubbed off.

EXAMPLES 502–504

Electrophotographic materials for color proofing were prepared in the same manner as that of Example 501 except that Polymers (P-502) to (P-504) were substituted for Polymer (P-501).

Polymer (P-502):

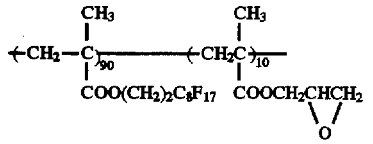

Polymer (P-503): Silicone resin KR-214 (manufactured by Shin-Etsu Chemical Co., Ltd)

Polymer (P-504):

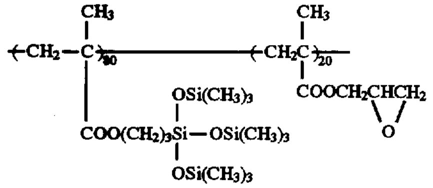

The image quality and the transfer properties of the electrophotographic materials for color proofing were evaluated in the same manner as one of Example 501. They were as excellent as one obtained in Example 501.

What is claimed is:

1. An electrophotographic material for color proofing which comprises a substrate, a photoconductive layer comprising a binder resin, and a transfer layer in this order, said material being useful for preparing a color proof in a process wherein at least one color toner image is electrophotographically formed on the transfer layer and then transferred together with said transfer layer to a sheet material to prepare the color proof, (a) wherein said binder resin comprises a polymer (P) and/or a polymer particle (L) which contain units having fluorine atom(s) and/or silicon atom(s) at least in the region near the surface facing said transfer layer, (b) wherein said polymer (P) is a block-copolymer comprising a polymer segment (X) which contains not less than 50% by weight of said units having fluorine atom(s) and/or silicon atom(s) and a polymer segment (Y) which contains not more than 20% by weight of said units, (c) wherein said polymer particle (L) comprises a polymer segment (X) which contains not less than 50% by weight of said units having fluorine atom(s) and/or silicon atom(s) and a polymer segment (Y) which contains not more than 20% by weight of said units, (d) wherein said polymer segment (X) in said polymer particle (L) contains units having at least one photo and/or thermosetting group, and said polymer segment (Y) in said polymer (P) contains units having at least one photo and/or thermosetting group, (e) wherein said polymer segment (X) in said polymer particle (L) is insoluble in a nonaqueous solvent and the polymer segment (Y) in said polymer particle (L) is soluble in a nonaqueous solvent, and (f) wherein the polymer (P) and/or the polymer particle (L) are contained in an amount of 0.01 to 40 parts by weight based on 100 parts by weight of all binders which are present in the photoconductive layer.

2. The electrophotographic material for color proofing of claim 1 wherein the polymer (P) and/or the polymer particle (L) are contained in an amount of 0.1 to 30 parts by weight based on 100 parts by weight of all binders which are present in the photoconductive layer.

3. A process for forming a color proof wherein at least one color toner image is electrophotographically formed on an electrophotographic material for color proofing which comprises a substrate, a photoconductive layer comprising a binder resin, and a transfer layer in this order, and then transferred together with said transfer layer to a sheet material to prepare the color proof, (a) wherein said binder resin comprises a polymer (P) and/or a polymer particle (L) which contain units having fluorine atom(s) and/or silicon atom(s) at least in the region near the surface facing said transfer layer, (b) wherein said polymer (P) is a block-copolymer comprising a polymer segment (X) which contains not less than 50% by weight of said units having fluorine atom(s) and/or silicon atom(s) and a polymer segment (Y) which contains not more than 20% by weight of said units, (c) wherein said polymer particle (L) comprises a polymer segment (X) which contains not less than 50% by weight of said units having fluorine atom(s) and/or silicon atom(s) and a polymer segment (Y) which contains not more than 20% by weight of said units, (d) wherein said polymer segment (X) in said polymer particle (L) contains units having at least one photo and/or thermosetting group, and said polymer segment (Y) in said polymer (P) contains units having at least one photo and/or thermosetting group, (e) wherein said polymer segment (X) in said polymer particle (L) is insoluble in a nonaqueous solvent and the polymer segment (Y) in said polymer particle (L) is soluble in a nonaqueous solvent, and (f) wherein the polymer (P) and/or the polymer particle (L) are contained in an amount of 0.01 to 40 parts by weight based on 100 parts by weight of all binders which are present in the photoconductive layer.

4. The process for forming a color proof of claim 3, wherein said at least one color toner image is electrophotographically formed by charging said electrophotographic material for color proofing, imagewise exposing the charged material to light through the side of said transfer layer, and developing the imagewise exposed material, wherein said exposing is conducted based on digital information using a laser beam.

5. The process for forming a color proof of claim 3 wherein the polymer (P) and/or the polymer particle (L) are contained in an amount of 0.1 to 30 parts by weight based on 100 parts by weight of all binders which are present in the photoconductive layer.

* * * * *